United States Patent
Wang et al.

(10) Patent No.: US 12,190,822 B2
(45) Date of Patent: Jan. 7, 2025

(54) ARRAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Mengqi Wang, Beijing (CN); Tiaomei Zhang, Beijing (CN); Zhengkun Li, Beijing (CN); Quanyong Gu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/255,100

(22) PCT Filed: Sep. 30, 2022

(86) PCT No.: PCT/CN2022/123115
§ 371 (c)(1),
(2) Date: May 31, 2023

(87) PCT Pub. No.: WO2024/065624
PCT Pub. Date: Apr. 4, 2024

(65) Prior Publication Data
US 2024/0363072 A1  Oct. 31, 2024

(51) Int. Cl.
G09G 3/3258 (2016.01)

(52) U.S. Cl.
CPC ... G09G 3/3258 (2013.01); *G09G 2300/0426* (2013.01); *G09G 2300/0819* (2013.01);
(Continued)

(58) Field of Classification Search
CPC ......... G09G 3/3258; G09G 2300/0426; G09G 2300/0819; G09G 2300/0852;
(Continued)

(56) References Cited

U.S. PATENT DOCUMENTS

2006/0261732 A1  11/2006  Miller et al.
2012/0050344 A1*  3/2012  Kim ..................... G09G 3/3233
345/76

(Continued)

FOREIGN PATENT DOCUMENTS

CN  103915571 A  7/2014
CN  109065568 A  12/2018
(Continued)

OTHER PUBLICATIONS

International Search Report & Written Opinion mailed May 17, 2023, regarding PCT/CN2022/123115.

*Primary Examiner* — Amit Chatly
(74) *Attorney, Agent, or Firm* — Intellectual Valley Law, P.C.

(57) ABSTRACT

An array substrate is provided. The array substrate includes K number of columns of first pads. A respective first pad is connected to an anode of a light emitting element, a second electrode of a fifth transistor, and a second electrode of a sixth transistor. The K number of columns of first pads include a plurality of first-first pads in (2k-1)-th columns of the K columns and a plurality of second-first pads in (2k)-th columns of the K columns. A respective first-first pad and a respective second-first pad have different average line widths.

19 Claims, 51 Drawing Sheets

(52) U.S. Cl.
CPC .............. *G09G 2300/0852* (2013.01); *G09G 2300/0861* (2013.01); *G09G 2320/0209* (2013.01); *G09G 2320/0242* (2013.01)

(58) Field of Classification Search
CPC ... G09G 2300/0861; G09G 2320/0209; G09G 2320/0242
See application file for complete search history.

(56) References Cited

U.S. PATENT DOCUMENTS

| | | |
|---|---|---|
| 2015/0214505 A1 | 7/2015 | Xiong et al. |
| 2020/0286432 A1* | 9/2020 | Zhang .................. G09G 3/3258 |
| 2022/0157921 A1 | 5/2022 | Wang et al. |
| 2022/0320247 A1* | 10/2022 | Liu ...................... H10K 59/126 |
| 2022/0359577 A1* | 11/2022 | Jeong ................... G09G 3/2085 |
| 2022/0376024 A1* | 11/2022 | Zheng ................ H10K 59/1216 |
| 2023/0133179 A1* | 5/2023 | Lu ........................ G09G 3/3233 |
| | | 345/206 |
| 2023/0180550 A1 | 6/2023 | Han et al. |
| 2023/0238487 A1* | 7/2023 | Hwang ................ G09G 3/2081 |
| | | 257/79 |

FOREIGN PATENT DOCUMENTS

| | | |
|---|---|---|
| CN | 112086467 A | 12/2020 |
| CN | 113658995 A | 11/2021 |
| CN | 115668343 A | 1/2023 |
| WO | 2022160255 A1 | 8/2022 |
| WO | 2022165717 A | 8/2022 |

\* cited by examiner

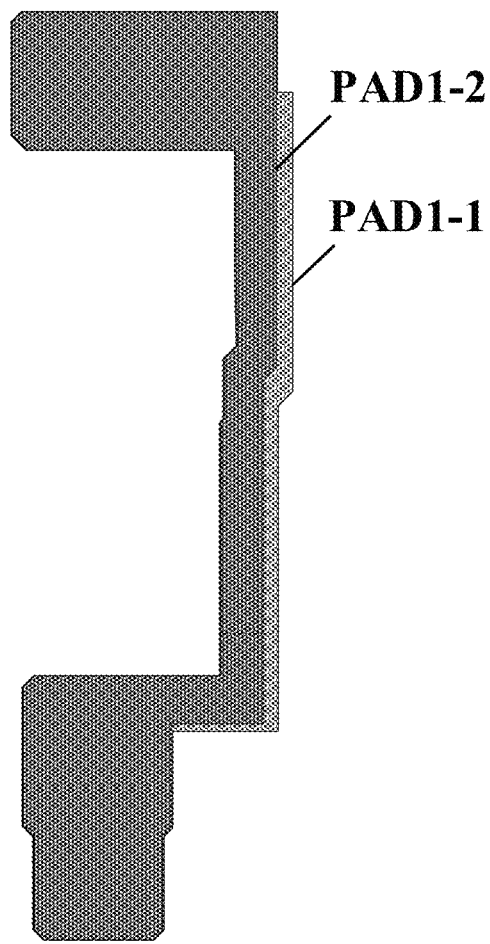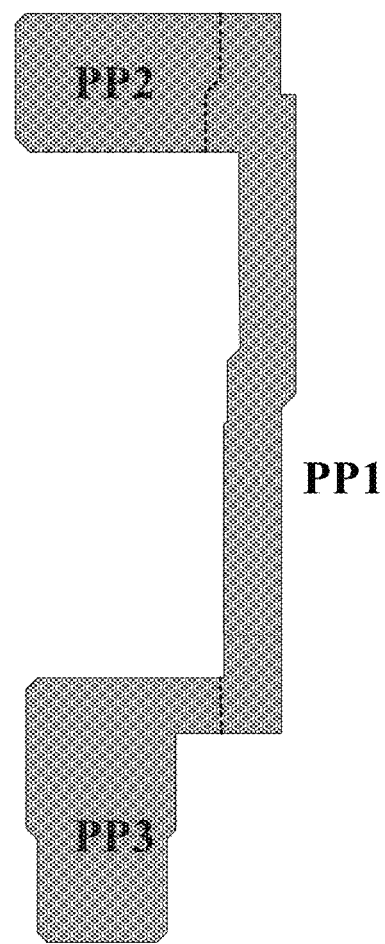
FIG. 5E                                FIG. 5F

ARRAY SUBSTRATE AND DISPLAY APPARATUS

CROSS-REFERENCE TO RELATED APPLICATION

This application is a national stage application under 35 U.S.C. § 371 of International Application No. PCT/CN2022/123115, filed Sep. 30, 2022, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising K number of columns of first pads; wherein a respective first pad is connected to an anode of a light emitting element, a second electrode of a fifth transistor, and a second electrode of a sixth transistor; the K number of columns of first pads comprise a plurality of first-first pads in (2k-1)-th columns of the K columns and a plurality of second-first pads in (2k)-th columns of the K columns; and a respective first-first pad and a respective second-first pad have different average line widths.

Optionally, the array substrate further comprises multiple first-first reset signal lines in the (2k-1)-th columns and multiple second-first reset signal lines in the (2k)-th columns of the K columns; wherein a first parasitic capacitance between a respective first-first pad and a respective first-first reset signal line in the (2k-1)-th columns of the K columns is different from a second parasitic capacitance between a respective second-first pad and a respective second-first reset signal line in the (2k)-th columns of the K columns.

Optionally, the first parasitic capacitance is greater than the second parasitic capacitance by at least 5%.

Optionally, orthographic projections of the respective first-first pad and the respective first-first reset signal line in the (2k-1)-th columns of the K columns overlap with each other in a first overlapping region having a first area; orthographic projections of the respective second-first pad and the respective second-first reset signal line in the (2k)-th columns of the K columns overlap with each other in a second overlapping region having a second area; and the first area and the second area are different from each other.

Optionally, the first area is greater than the second area by at least 5%.

Optionally, a first portion of the respective first-first pad in the first overlapping region has a first width along a first direction; a second portion of the respective second-first pad in the second overlapping region has a second width along the first direction; and the first width is greater than the second width.

Optionally, the first width is greater than the second width by at least 5%.

Optionally, a virtual line along the first direction crosses over the first portion and the second portion; along the virtual line, the respective first-first reset signal line has a third width, and the respective second-first reset signal line has a fourth width; the third width is substantially the same as the fourth width; and the first width is greater than the third width and greater than the fourth width.

Optionally, a ratio of a total number of the multiple first-first reset signal lines to a total number of the plurality of first-first pads is the same as a ratio of a total number of the multiple second-first reset signal lines to a total number of the plurality of second-first pads.

Optionally, the array substrate further comprises a plurality of gate lines; wherein the respective first pad crosses over a respective gate line of the plurality of gate lines.

Optionally, the array substrate further comprises a plurality of reset control signal lines and a plurality of light emitting control signal lines; wherein an orthographic projection of respective first pad on a base substrate at least partially overlaps with an orthographic projection of a respective reset control signal line of the plurality of reset control signal lines on the base substrate; or the orthographic projection of the first pad on the base substrate at least partially overlaps with an orthographic projection of a respective light emitting control signal line of the plurality of light emitting control signal lines on the base substrate.

Optionally, the array substrate further comprises a plurality of voltage supply lines; wherein a respective pixel driving circuit comprises a second pad; a node connecting line; and a storage capacitor comprising a first capacitor electrode; wherein the second pad is connected to a respective voltage supply line of the plurality of voltage supply lines; the node connecting line connects the first capacitor electrode to a first electrode of a third transistor in the respective pixel driving circuit; and an orthographic projection of the second pad on a base substrate covers at least 50% of an orthographic projection of the node connecting line on the base substrate.

Optionally, the orthographic projection of the second pad on the base substrate at least partially overlaps with an orthographic projection of an active layer of the third transistor on the base substrate.

Optionally, the array substrate further comprises a plurality of gate lines; wherein a respective gate line of the plurality of gate lines comprises a main portion extending along an extension direction of the respective gate line, and a gate protrusion protruding away from the main portion; and the orthographic projection of the second pad on the base substrate covers at least 50% of an orthographic projection of the gate protrusion on the base substrate.

Optionally, the array substrate further comprises a plurality of data lines; wherein the second pad comprises a fourth pad part, a fifth pad part, and a sixth pad part, the fifth pad part connecting the fourth pad part to the sixth pad part; and the fifth pad part crosses over a respective data line of the plurality of data lines in an adjacent pixel driving circuit, the adjacent pixel driving circuit and the respective pixel driving circuit being in a same row along a first direction.

Optionally, an orthographic projection of the fourth pad part on the base substrate at least partially overlaps with the orthographic projection of the node connecting line in the respective pixel driving circuit on the base substrate; and an orthographic projection of the sixth pad part on the base substrate at least partially overlaps with an orthographic projection of a respective adjacent voltage supply line of the plurality of voltage supply lines in the adjacent pixel driving circuit on the base substrate.

Optionally, the array substrate further comprises an anode connecting pad and an anode; wherein the respective first pad is connected to a first relay electrode through a ninth via extending through a first planarization layer, and is connected to a second relay electrode through a tenth via extending through the first planarization layer; the first relay electrode is connected to the second electrode of the fifth transistor through an eleventh via extending through at least an inter-layer dielectric layer; the second relay electrode is connected to the second electrode of the sixth transistor through a twelfth via extending through at least the inter-layer dielectric layer; the anode connecting pad is connected to the respective first pad through a thirteenth via extending through a second planarization layer; and the anode is connected to the anode connecting pad through a fourteenth via extending through a third planarization layer.

Optionally, the array substrate further comprises a plurality of second reset signal lines in a layer different from the multiple first-first reset signal lines and the multiple second-first reset signal lines; the plurality of second reset signal lines extend along a first direction; the multiple first-first reset signal lines and the multiple second-first reset signal lines extend along a second direction; a respective second reset signal line is configured to provide an initialization signal to a first electrode of a sixth transistor in a respective pixel driving circuit; a respective first-first reset signal line is configured to provide an initialization signal to a first electrode of a first transistor in a first-first respective pixel driving circuit in the (2k-1)-th columns; and a respective second-first reset signal line is configured to provide an initialization signal to a first electrode of a first transistor in a second-first respective pixel driving circuit in the (2k)-th columns.

Optionally, pixel driving circuits in the (2k-1)-th columns of the K columns are pixel driving circuits for driving light emission of subpixels of a first color and subpixels of a second color; pixel driving circuits in the (2k)-th columns of the K columns are pixel driving circuits for driving light emission of subpixels of a third color; and the first color, the second color, and the third color are different from each other.

Optionally, the array substrate comprises a display area, an additional display area, and a peripheral area; wherein the additional display area extends away from the display area into a side region of the peripheral area; the array substrate comprises a plurality of light emitting elements and a plurality of pixel driving circuits; the plurality of pixel driving circuits are in the display area; multiple light emitting elements of the plurality of light emitting elements are present in the additional display area; and transistors and capacitors of the plurality of pixel driving circuits are absent in the additional display area.

Optionally, light emitting layers corresponding to a number of pixel driving circuits along a border between the display area and the additional display area are in the additional display area; the array substrate further comprises a plurality of anode connecting pads connecting the pixel driving circuits along the border between the display area and the additional display area and the light emitting layers in the additional display area; and a respective anode connecting pad of the plurality of anode connecting pads electrically connects the second electrode of the sixth transistor to an anode of a respective light emitting element in the additional display area.

Optionally, in the additional display area, an orthographic projection of the plurality of anode connecting pads on a base substrate partially overlaps with an orthographic projection of a respective first subpixel on the base substrate, resulting in a first overlapping area; an orthographic projection of the plurality of anode connecting pads on the base substrate partially overlaps with an orthographic projection of a respective second subpixel on the base substrate, resulting in a second overlapping area; an orthographic projection of the plurality of anode connecting pads on the base substrate partially overlaps with an orthographic projection of a respective third subpixel on the base substrate, resulting in a third overlapping area; the first overlapping area is greater than the second overlapping area; the third overlapping area is greater than the second overlapping area; and the respective first subpixel, the respective second subpixel, and the respective third subpixel are subpixels of different colors.

In another aspect, the present disclosure provides a display apparatus, comprising the array substrate described herein, and an integrated circuit connected to the array substrate.

BRIEF DESCRIPTION OF THE FIGURES

The following drawings are merely examples for illustrative purposes according to various disclosed embodiments and are not intended to limit the scope of the present invention.

FIG. 5E is a superimposition of a respective first-first pad and a respective second-first pad.

FIG. 5F illustrates the structure of a first pad in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Accordingly, the present disclosure provides, inter alia, an array substrate and a display apparatus that substantially obviate one or more of the problems due to limitations and disadvantages of the related art. In one aspect, the present disclosure provides an array substrate. In some embodiments, the array substrate includes K number of columns of first pads. Optionally, a respective first pad is connected to an anode of a light emitting element, a second electrode of a fifth transistor, and a second electrode of a sixth transistor. Optionally, the K number of columns of first pads comprise a plurality of first-first pads in (2k-1)-th columns of the K columns and a plurality of second-first pads in (2k)-th columns of the K columns. Optionally, a respective first-first pad and a respective second-first pad have different average line widths.

As used herein, the term "average line width", in reference to various patterns or patterned materials described herein, refers to a dimension that is determined from two or more separate measurements of the lines in different locations of the same or different lines using appropriate measurement techniques and equipment. As used herein, the term "width", in reference to various patterns or patterned materials described herein, refers to a smaller dimension of an elongated shape, for example, a dimension along the first direction DR1 in reference to the respective first-first pad and the respective second-first pad.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 1:
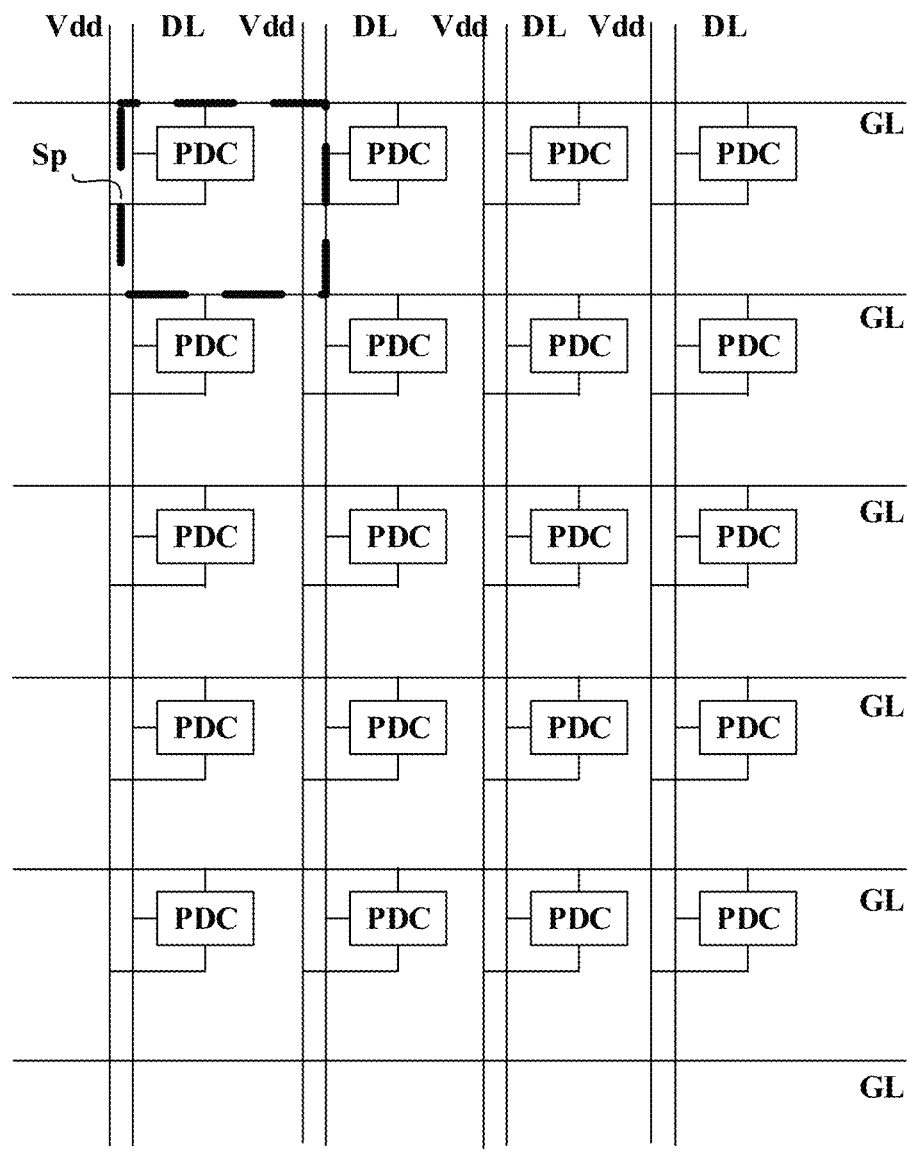
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of gate lines GL, a plurality of data lines DL, and a plurality of voltage supply lines Vdd. Light emission in a respective subpixel is driven by a respective pixel driving circuit PDC. In one example, a high voltage signal is input, through a respective one of the plurality of voltage supply lines Vdd, to the respective pixel driving circuit PDC connected to an anode of the light emitting element; a low voltage signal is input to a cathode of the light emitting element. A voltage difference between the high voltage signal (e.g., the VDD signal) and the low voltage signal (e.g., the VSS signal) is a driving voltage ΔV that drives light emission in the light emitting element.

The array substrate in some embodiments includes a plurality of subpixels. In some embodiments, the plurality of subpixels includes a respective first subpixel, a respective second subpixel, a respective third subpixel, and a respective fourth subpixel. Optionally, a respective pixel of the array substrate includes the respective first subpixel, the respective second subpixel, the respective third subpixel, and the respective fourth subpixel. The plurality of subpixels in the array substrate are arranged in an array. In one example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel.

In some embodiments, a minimum repeating unit of the plurality of subpixels of the array substrate includes the respective first subpixel, the respective second subpixel, the respective third subpixel, and the respective fourth subpixel. Optionally, each of the respective first subpixel, the respective second subpixel, the respective third subpixel, and the respective fourth subpixel, includes the first transistor T1, the second transistor T2, the third transistor T3, the fourth transistor T4, the fifth transistor T5, the sixth transistor T6, and the driving transistor Td.

Figure 2A:
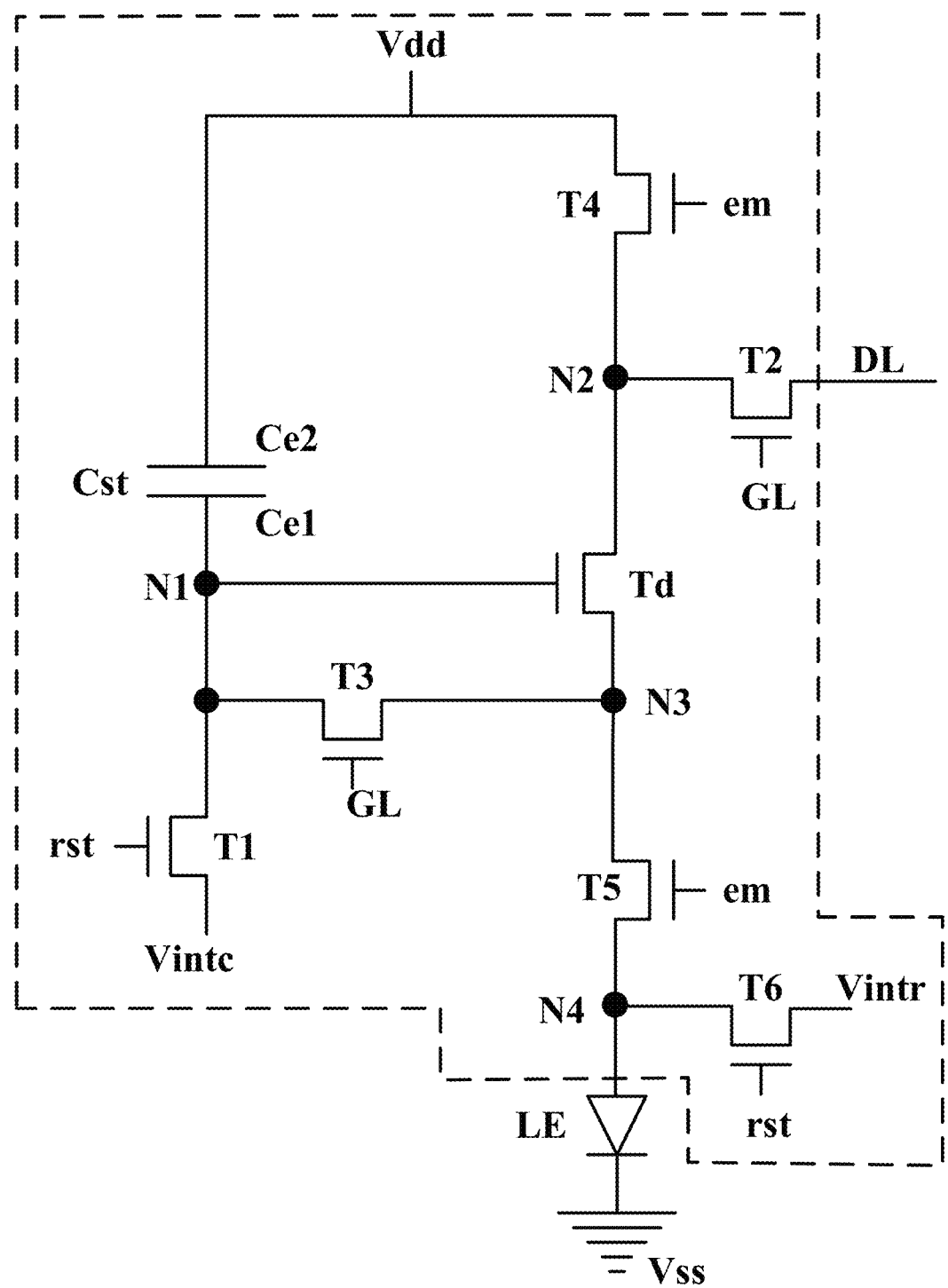
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2A, in some embodiments, the respective pixel driving circuit includes a driving transistor Td; a storage capacitor Cst having a first capacitor electrode Ce1 and a second capacitor electrode Ce2; a first transistor T1 having a gate electrode connected to a respective reset control signal line of a plurality of reset control signal lines rst, a first electrode connected to a respective first reset signal line of a plurality of first reset signal lines Vintc, and a second electrode connected to a first capacitor electrode Ce1 of the storage capacitor Cst and a gate electrode of the driving transistor Td; a second transistor T2 having a gate electrode connected to a respective gate line of a plurality of gate lines GL, a first electrode connected to a respective data line of a plurality of data lines DL, and a second electrode connected to a first electrode of the driving transistor Td; a third transistor T3 having a gate electrode connected to the respective gate line, a first electrode connected to the first capacitor electrode Ce1 of the storage capacitor Cst and the gate electrode of the driving transistor Td, and a second electrode connected to a second electrode of the driving transistor Td; a fourth transistor T4 having a gate electrode connected to a respective light emitting control signal line of a plurality of light emitting control signal lines em, a first electrode connected to a respective voltage supply line of a plurality of voltage supply lines Vdd, and a second electrode connected to the first electrode of the driving transistor Td and the second electrode of the second transistor T2; a fifth transistor T5 having a gate electrode connected to the respective light emitting control signal line, a first electrode connected to second electrodes of the driving transistor Td and the third transistor T3, and a second electrode connected to an anode of a light emitting element LE; and a sixth transistor T6 having a gate electrode connected to the respective reset control signal line of a plurality of reset control signal lines rst, a first electrode connected to a respective second reset signal line of the plurality of second reset signal lines Vintr, and a second electrode connected to the second electrode of the fifth transistor and the anode of the light emitting element LE. The second capacitor electrode Ce2 is connected to the respective voltage supply line and the first electrode of the fourth transistor T4.

Figure 2B:
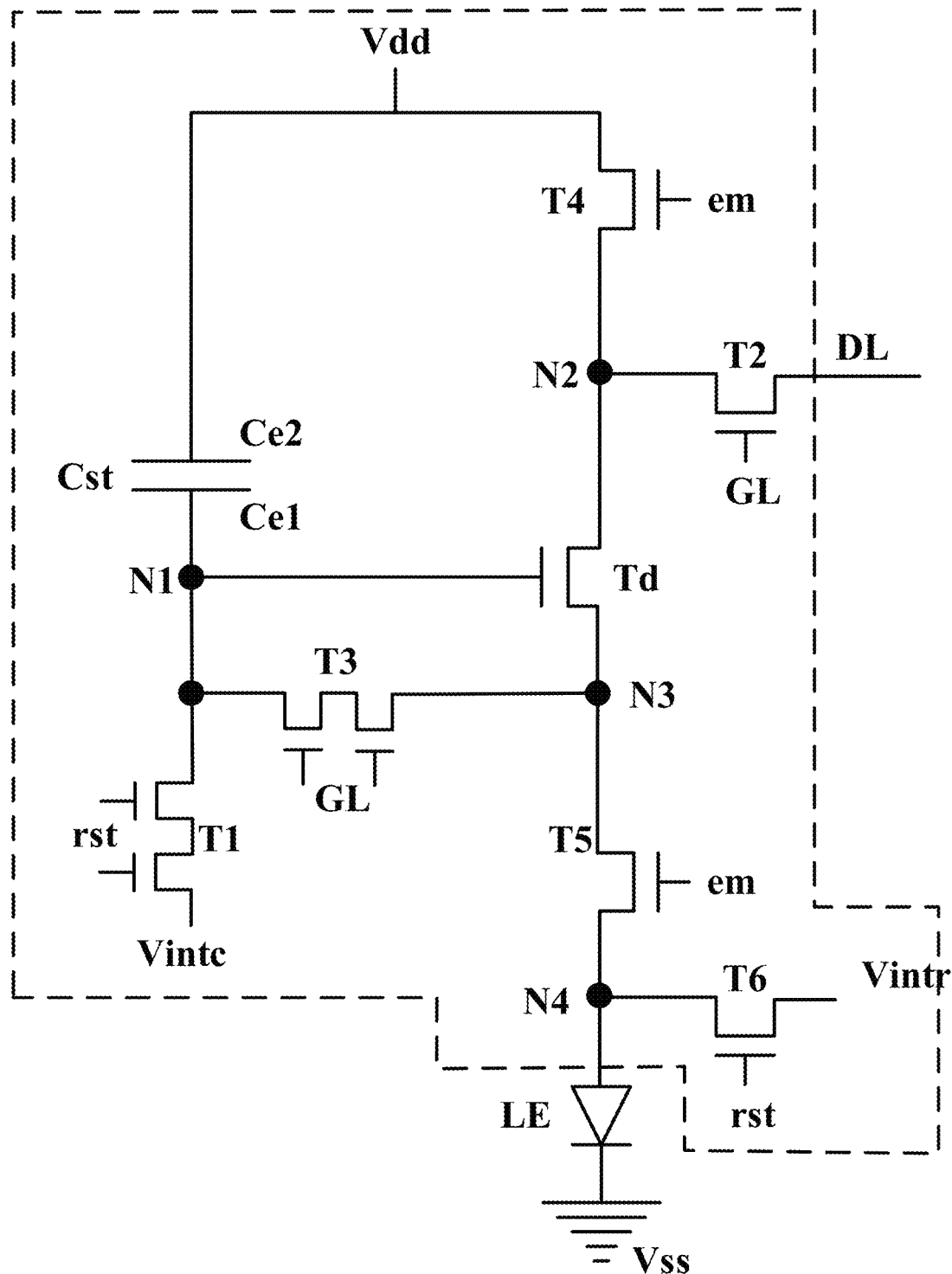
FIG. 2B is a circuit diagram illustrating the structure of a pixel driving circuit in some embodiments according to the present disclosure.

FIG. 2B is a circuit diagram illustrating the structure of a pixel driving circuit in some embodiments according to the present disclosure. Referring to FIG. 2B, in some embodiments, the third transistor T3 is a "double gate" transistor, and the first transistor T1 is a "double gate" transistor. Optionally, in a "double gate" first transistor, the active layer of the first transistor crosses over a respective reset control signal lines twice (alternatively, the respective reset control signal line crosses over the active layer of the first transistor T1 twice). Similarly, in a "double gate" third transistor, the active layer of the third transistor T3 crosses over a respective gate line of the plurality of gate lines GL twice (alternatively, the respective gate line crosses over the active layer of the third transistor T3 twice).

The pixel driving circuit further include a first node N1, a second node N2, a third node N3, and a fourth node N4. The first node N1 is connected to the gate electrode of the driving transistor Td, the first capacitor electrode Ce1, and the first electrode of the third transistor T3. The second node N2 is connected to the second electrode of the fourth transistor T4, the second electrode of the second transistor T2, and the first electrode of the driving transistor Td. The third node N3 is connected to the second electrode of the driving transistor Td, the second electrode of the third transistor T3, and the first electrode of the fifth transistor T5. The fourth node N4 is connected to the second electrode of the fifth transistor T5, the second electrode of the sixth transistor T6, and the anode of the light emitting element LE.

Figure 2C:
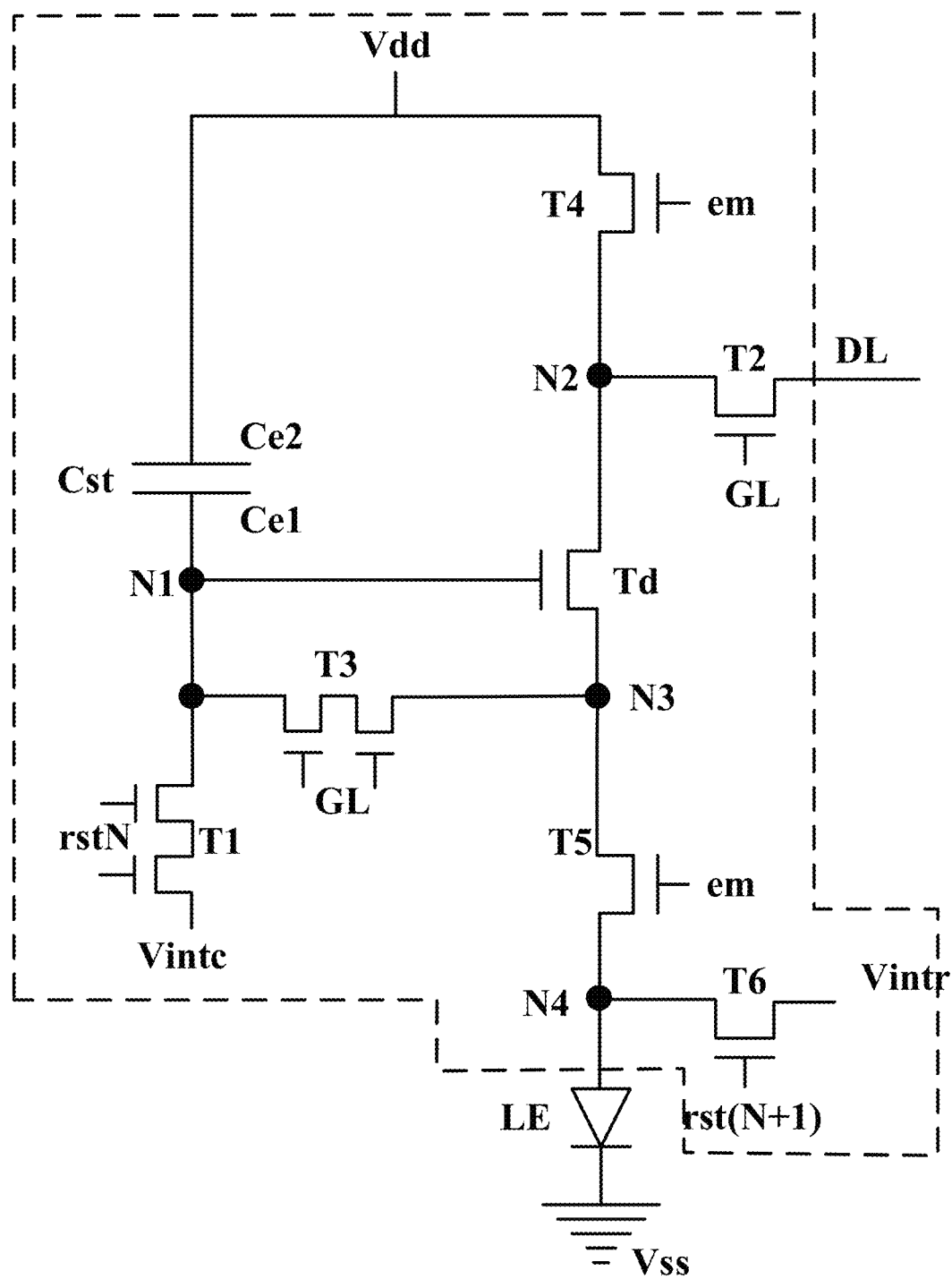
FIG. 2C is a circuit diagram illustrating the structure of a pixel driving circuit in some embodiments according to the present disclosure.

FIG. 2C is a circuit diagram illustrating the structure of a pixel driving circuit in some embodiments according to the present disclosure. Referring to FIG. 2C, in some embodiments, the first transistor T1 has a gate electrode connected to a respective reset control signal line rstN of a present stage (or a present row) of a plurality of reset control signal lines. The sixth transistor T6 has a gate electrode connected to a respective reset control signal line rst (N+1) of a next adjacent stage (or a next adjacent row) of a plurality of reset control signal lines.

Figure 3A:
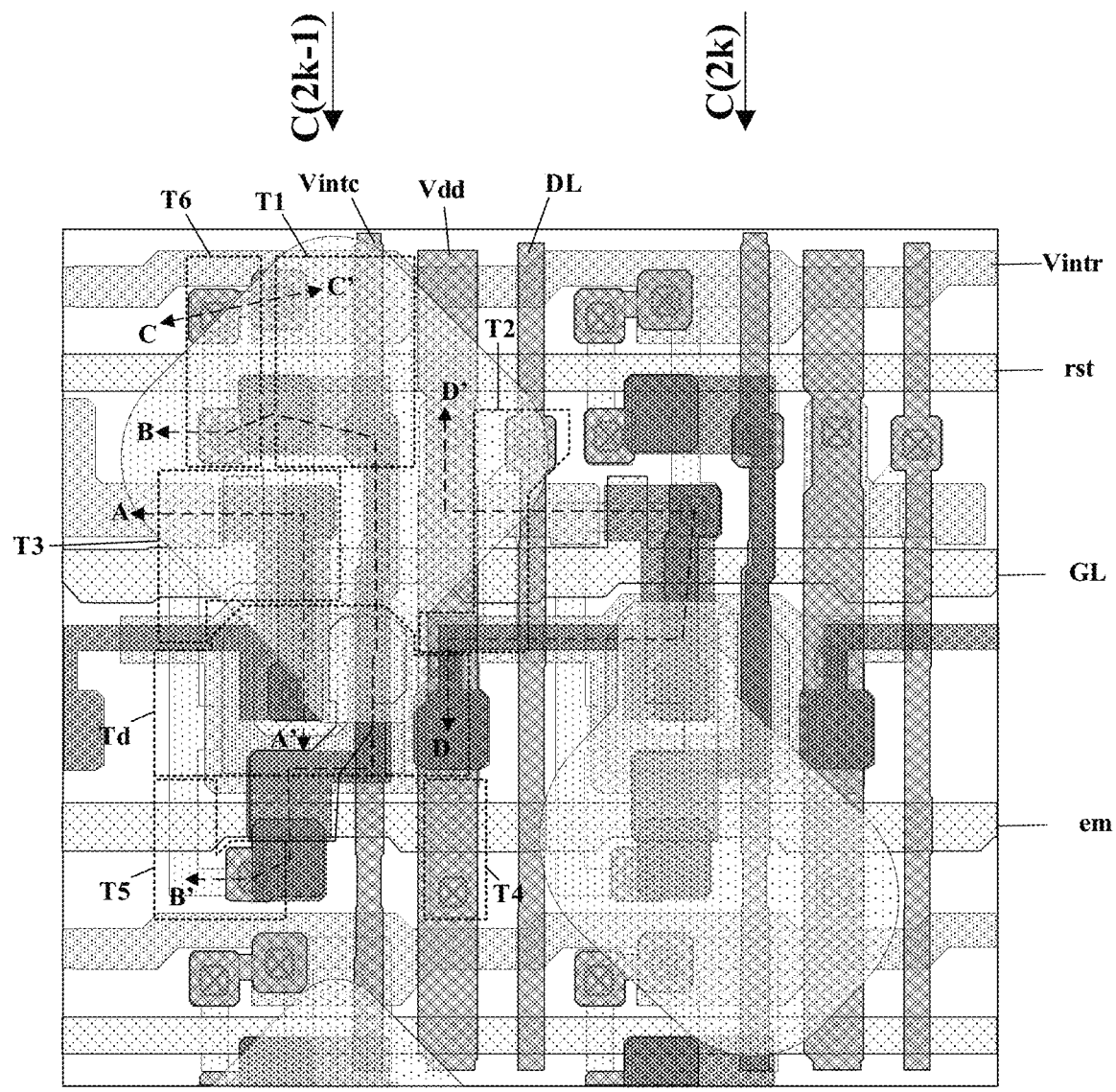
FIG. 3A is a diagram illustrating the structure of an array substrate in some embodiments according to the present disclosure.
Figure 3B:
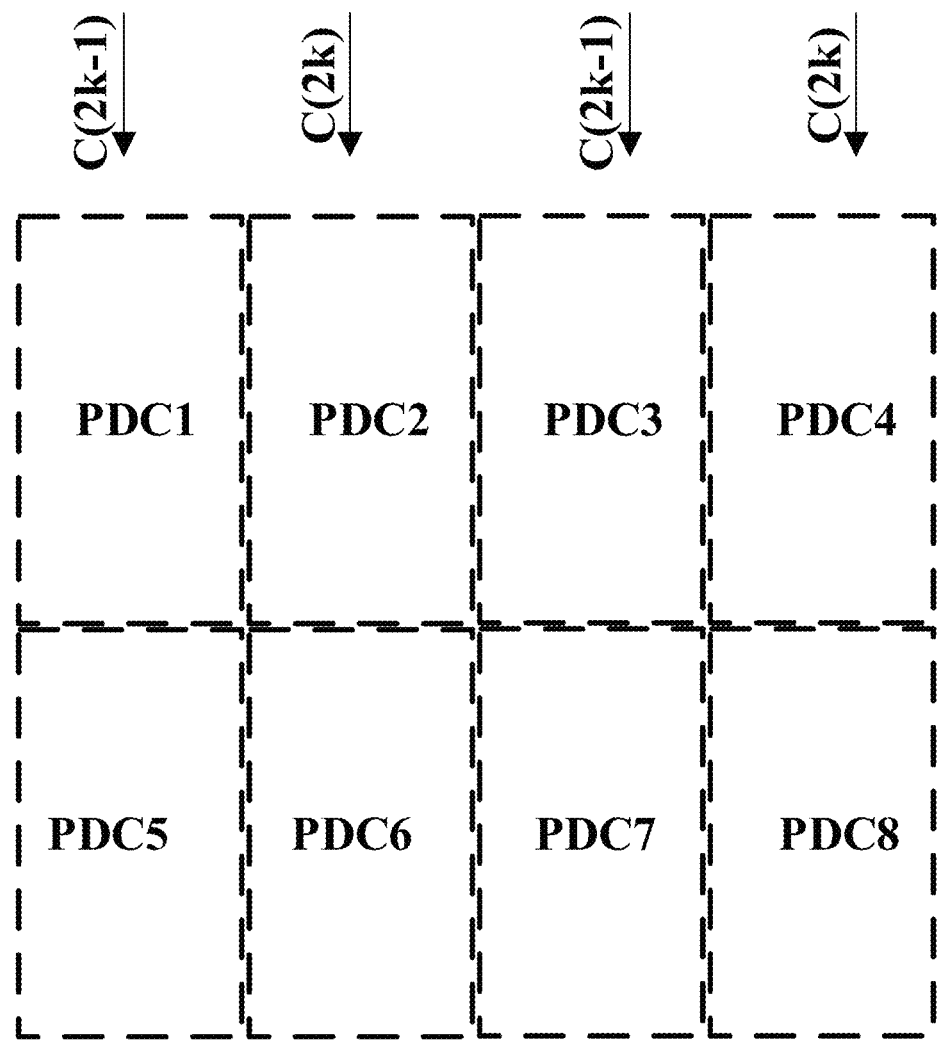
FIG. 3B is a schematic diagram illustrating an arrangement of a plurality of pixel driving circuits in an array substrate depicted in FIG. 3A.

FIG. 3A is a diagram illustrating the structure of an array substrate in some embodiments according to the present disclosure. FIG. 3B is a schematic diagram illustrating an arrangement of a plurality of pixel driving circuits in an array substrate depicted in FIG. 3A. FIG. 3B depicts a portion of the array substrate having eight pixel driving circuits, including PDC1, PDC2, PDC3, PDC4, PDC5, PDC6, PDC7, and PDC8. The pixel driving circuits are arranged in columns, including (2k-1)-th columns C (2k-1) and (2k)-th columns C (2k). FIG. 3A depicts a portion of the array substrate having two pixel driving circuits respectively in a (2k-1)-th column and a (2k)-th column. In one example, the two pixel driving circuits in FIG. 3A correspond to PDC1 and PDC2 in FIG. 3B.

As used herein, the term "(2k-1)-th column" and the term "(2k)-th column" are used in the context of the K columns. The array substrate may or may not include additional column(s) before the first column of the K columns and/or additional columns after the last column of the K columns. In the context of the array substrate, the term "(2k-1)-th column" does not necessarily denote an odd-numbered column in the array substrate, and the term "(2k)-th column" does not necessarily denote an even-numbered column in the array substrate. In one example, the (2k-1)-th column is an odd-numbered column in the context of the K columns, but may be an even-numbered column in the context of the array substrate. In another example, the (2k-1)-th column is an odd-numbered column in the context of the K columns, and also an odd-numbered column in the context of the array substrate. In one example, the (2k)-th column is an even-numbered column in the context of the K columns, but may be an odd-numbered column in the context of the array substrate. In another example, the (2k)-th column is an even-numbered column in the context of the K columns, and also an even-numbered column in the context of the array substrate.

Figure 3C:
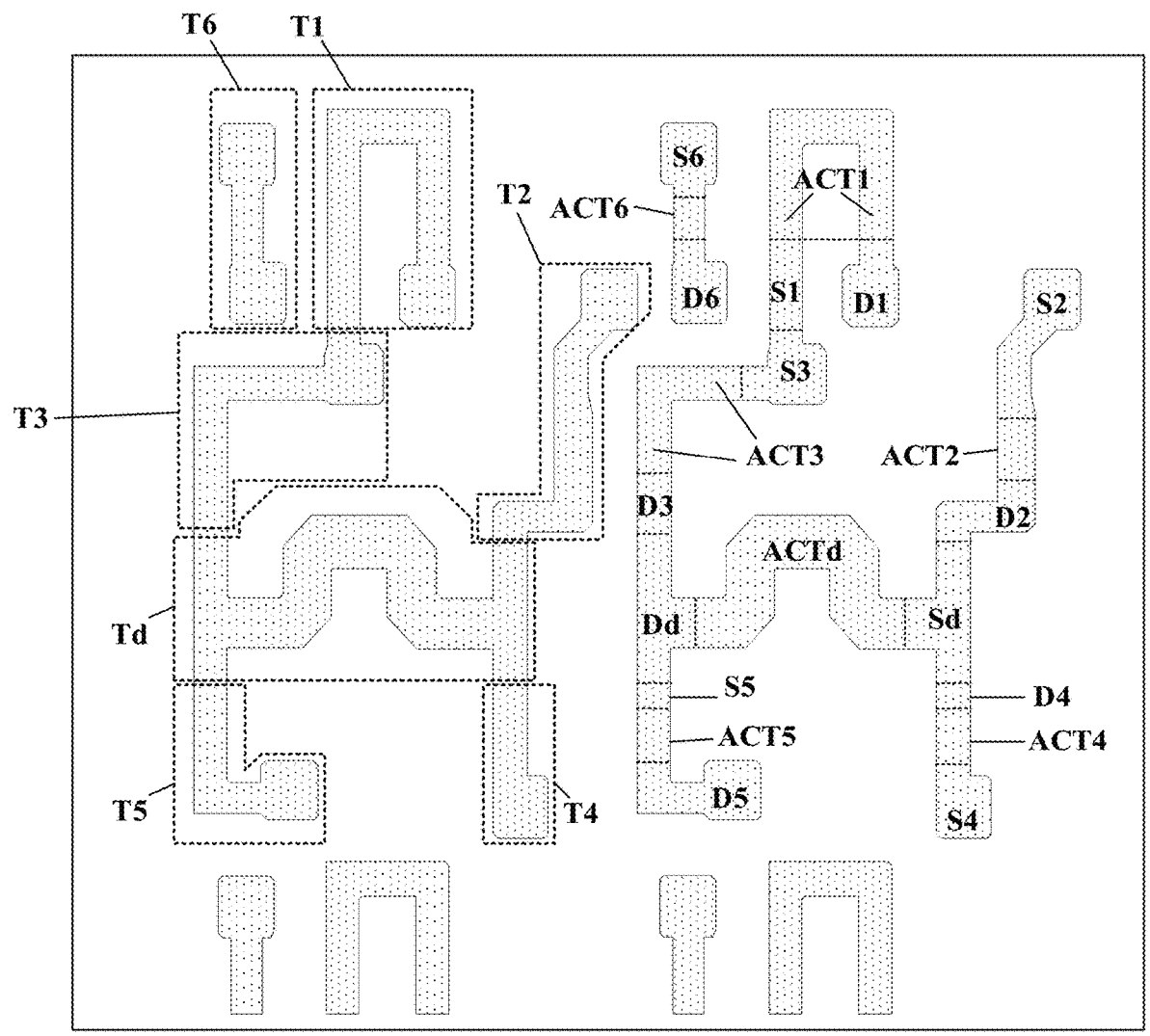
FIG. 3C is a diagram illustrating the structure of a semiconductor material layer in an array substrate depicted in FIG. 3A.
Figure 3D:
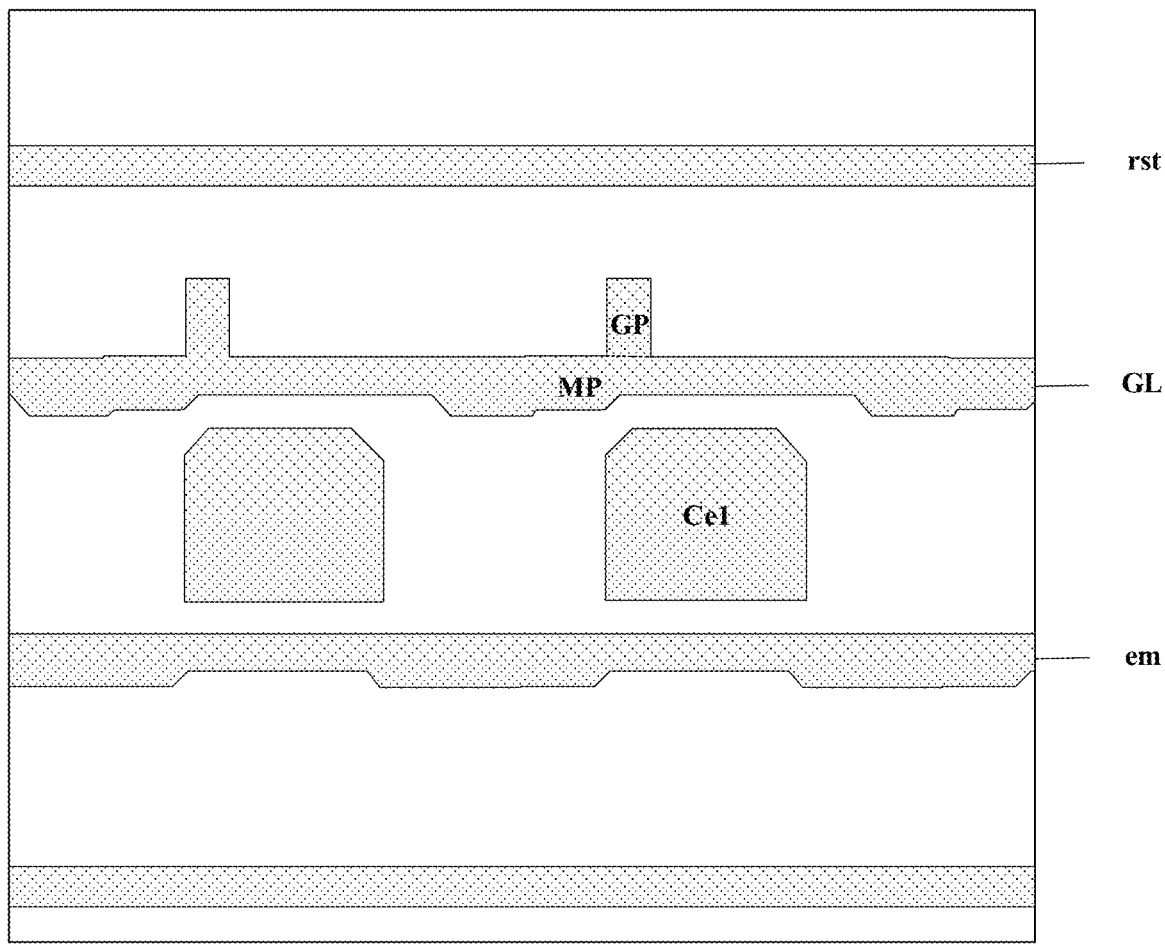
FIG. 3D is a diagram illustrating the structure of a first conductive layer in an array substrate depicted in FIG. 3A.
Figure 3E:
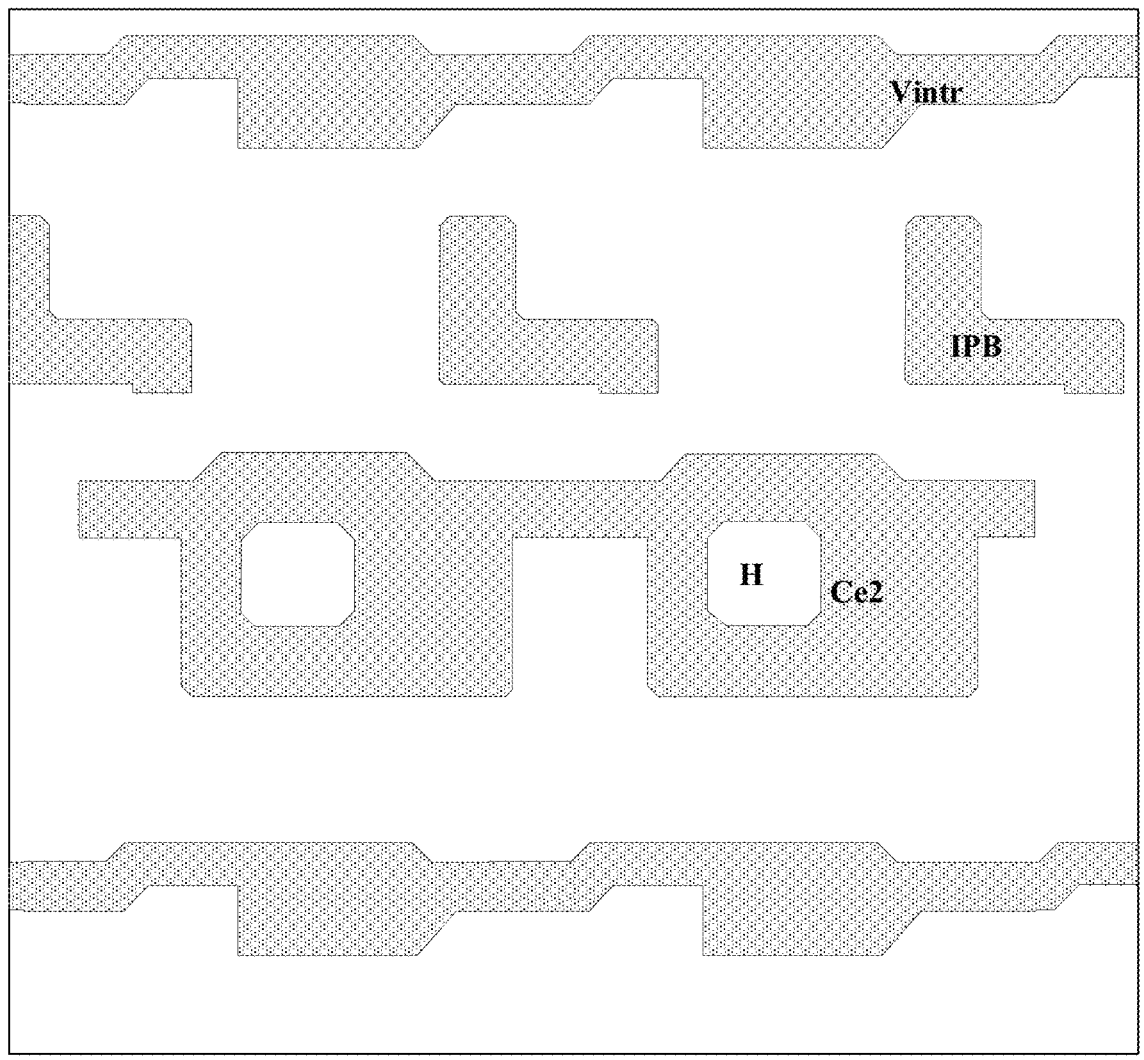
FIG. 3E is a diagram illustrating the structure of a second conductive layer in an array substrate depicted in FIG. 3A.
Figure 3F:
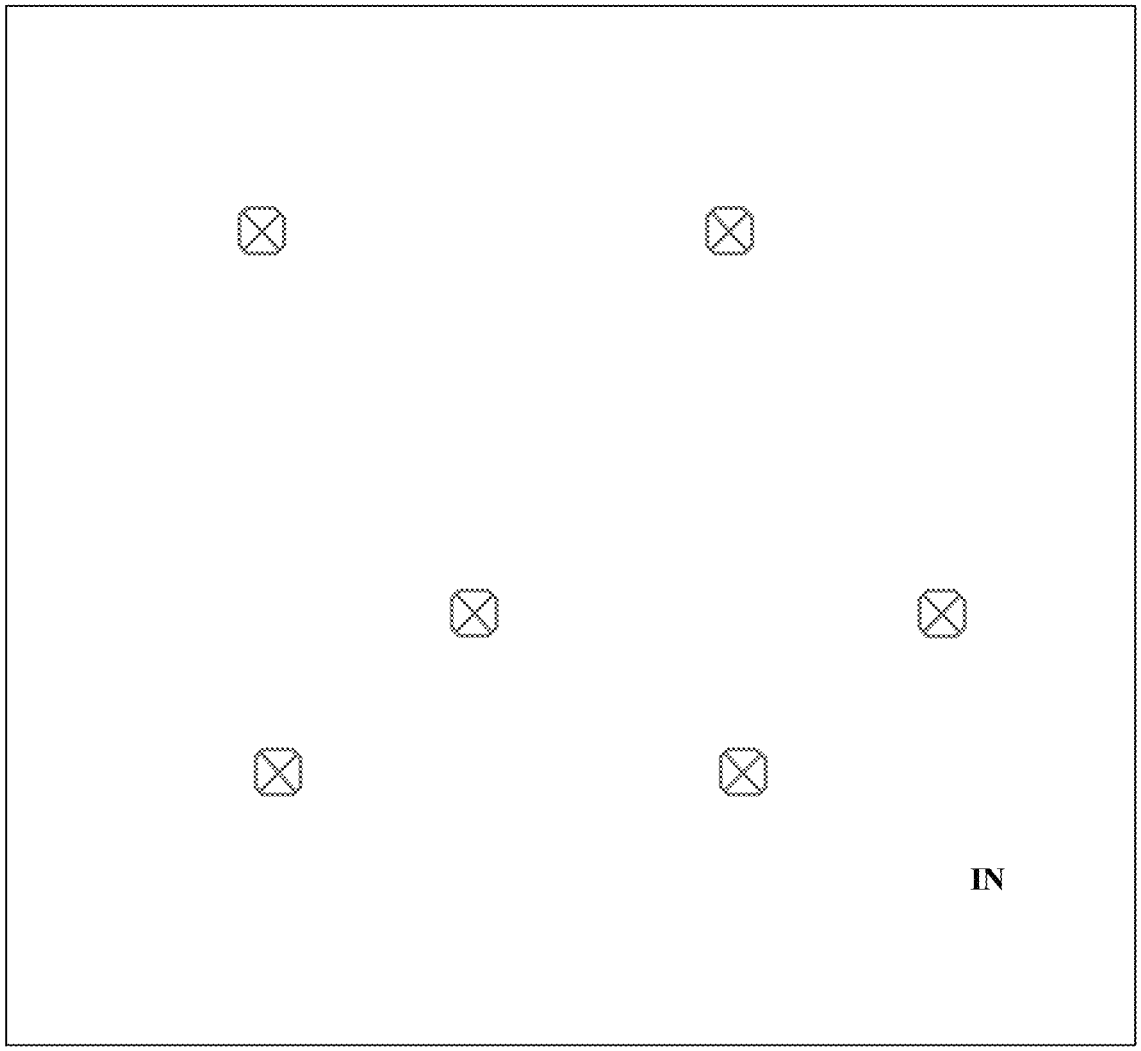
FIG. 3F is a diagram illustrating the structure of an insulating layer in an array substrate depicted in FIG. 3A.
Figure 3G:
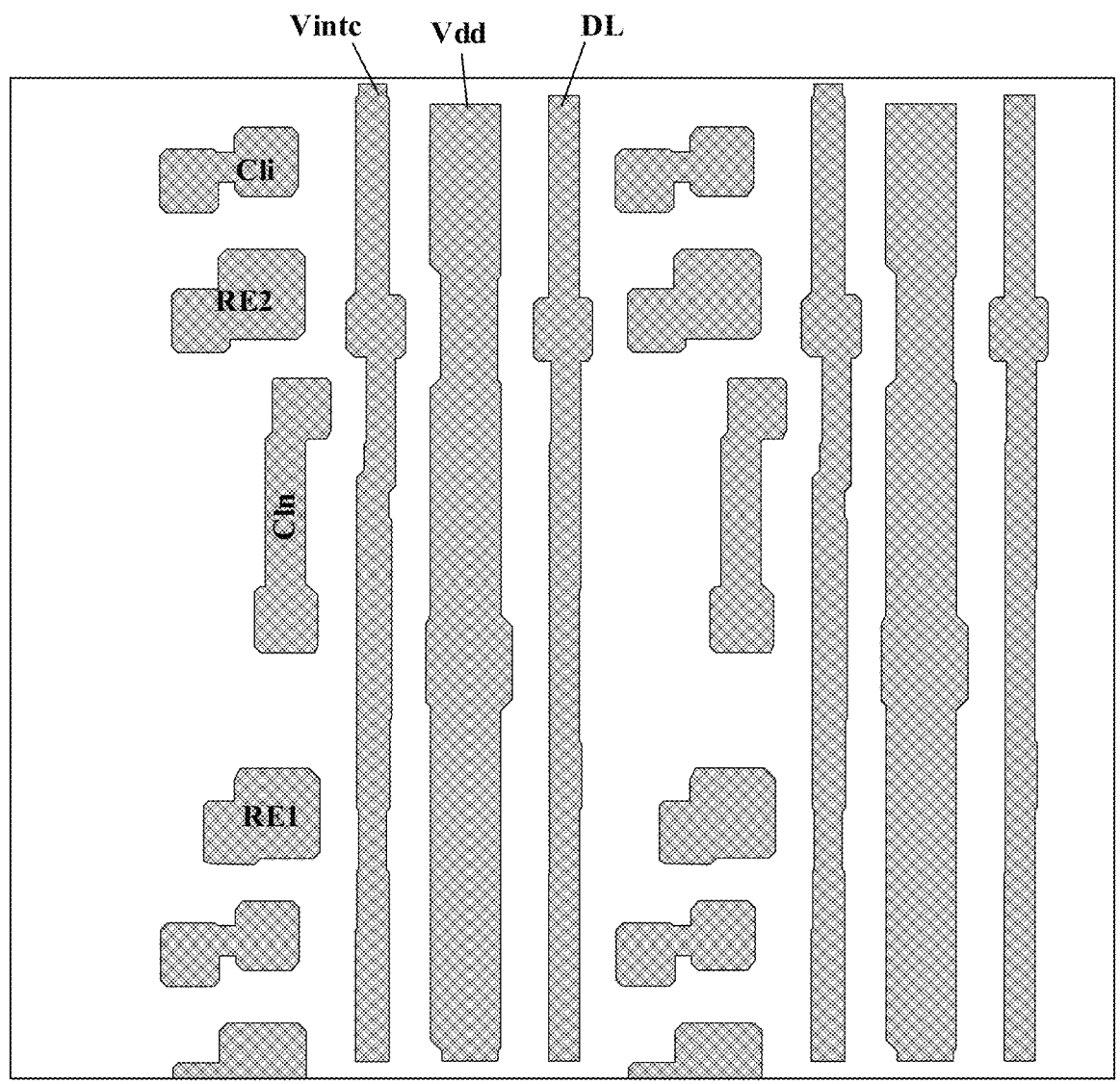
FIG. 3G is a diagram illustrating the structure of a first signal line layer in an array substrate depicted in FIG. 3A.
Figure 3H:
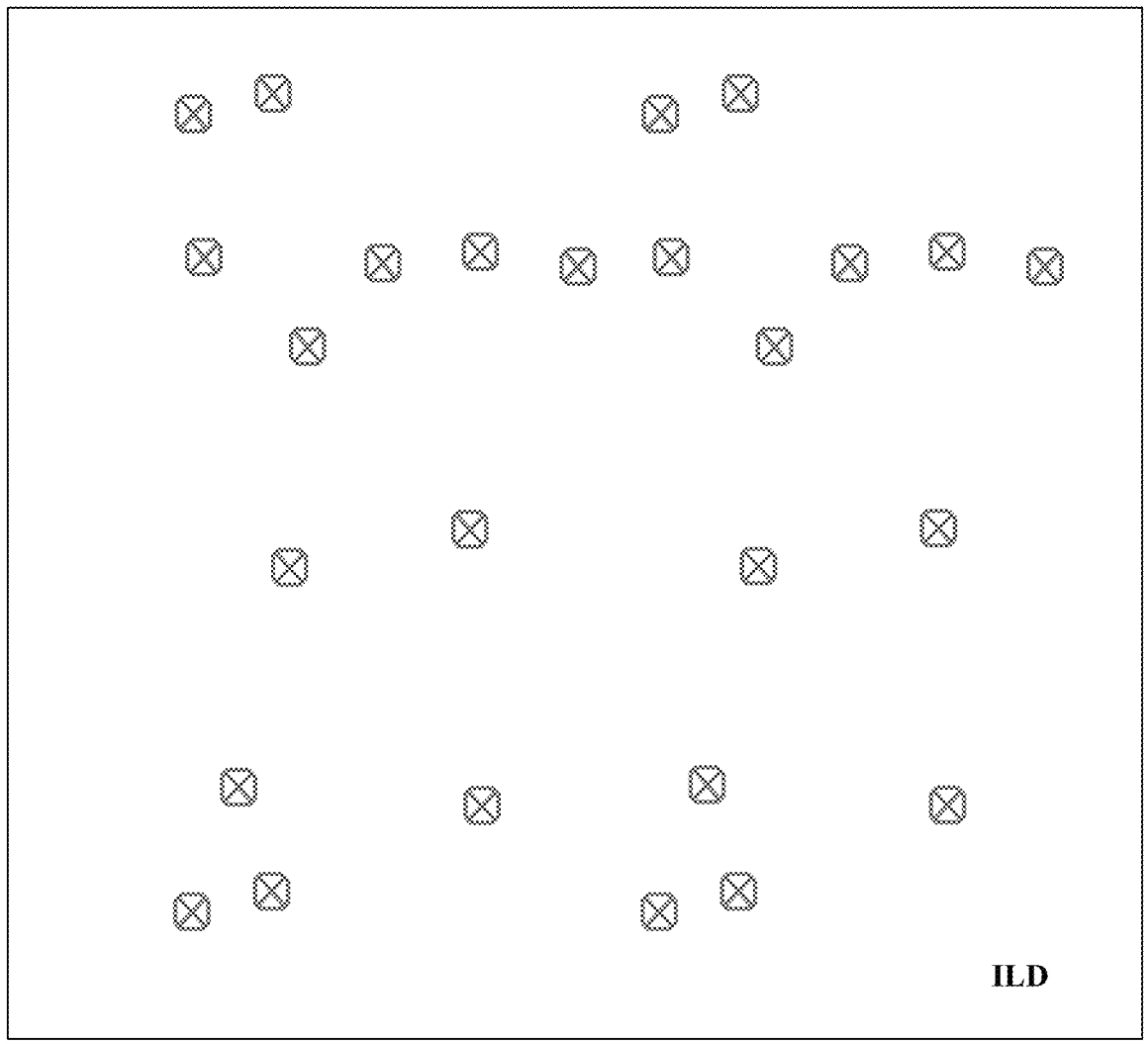
FIG. 3H is a diagram illustrating the structure of an inter-layer dielectric layer in an array substrate depicted in FIG. 3A.
Figure 3I:
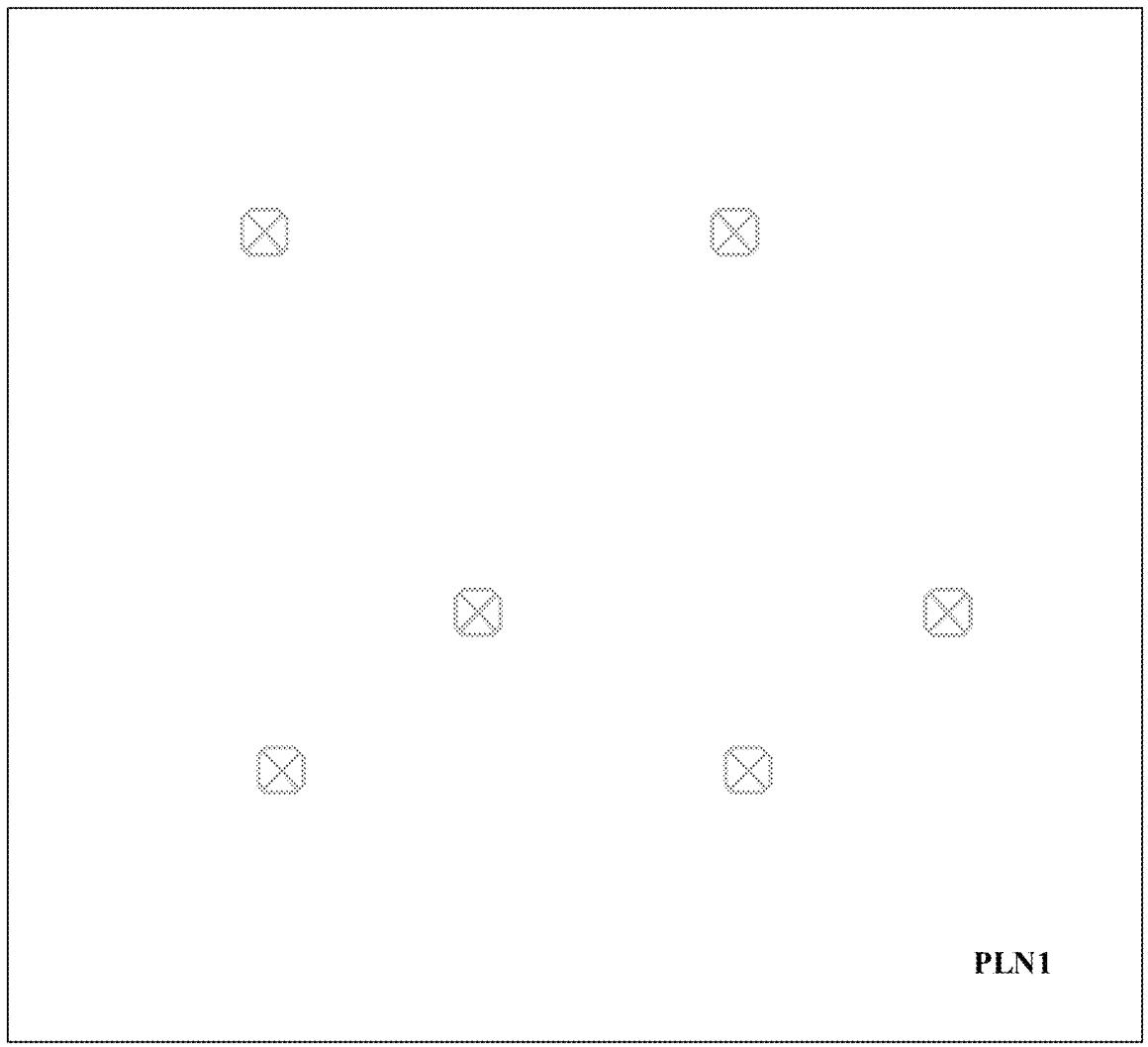
FIG. 3I is a diagram illustrating the structure of a first planarization layer in an array substrate depicted in FIG. 3A.
Figure 3J:
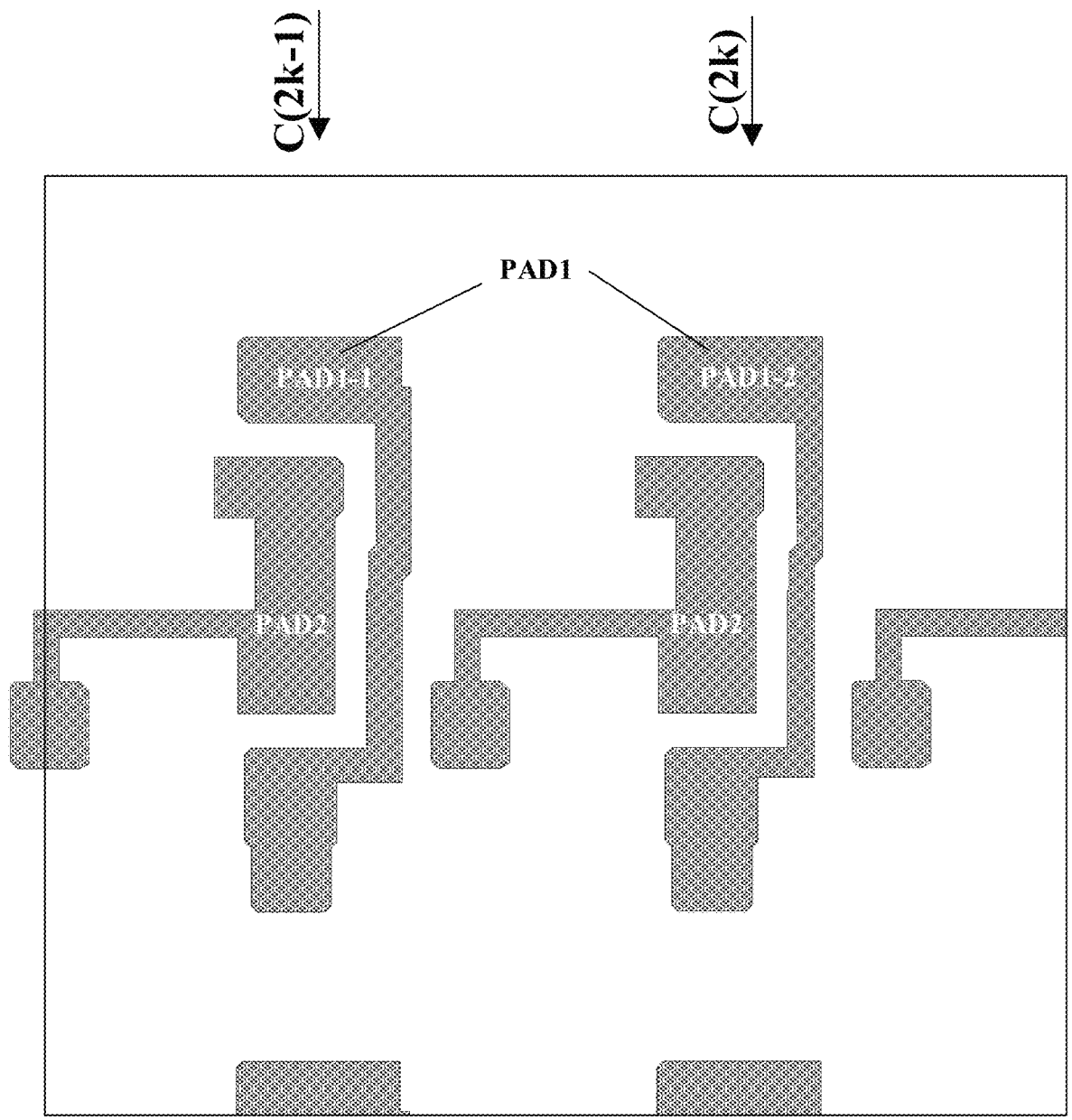
FIG. 3J is a diagram illustrating the structure of a second signal line layer in an array substrate depicted in FIG. 3A.
Figure 3K:
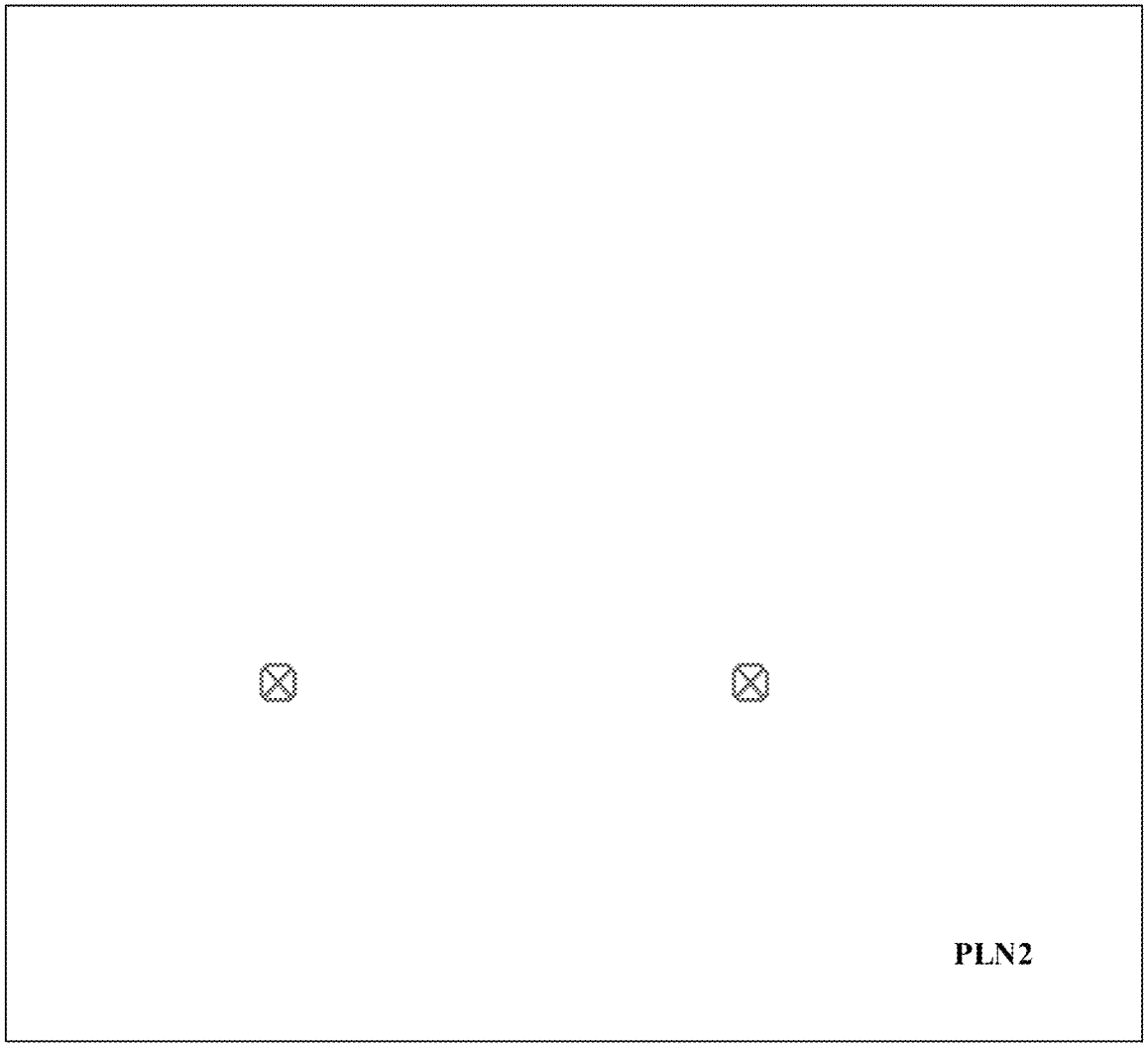
FIG. 3K is a diagram illustrating the structure of a second planarization layer in an array substrate depicted in FIG. 3A.
Figure 3L:
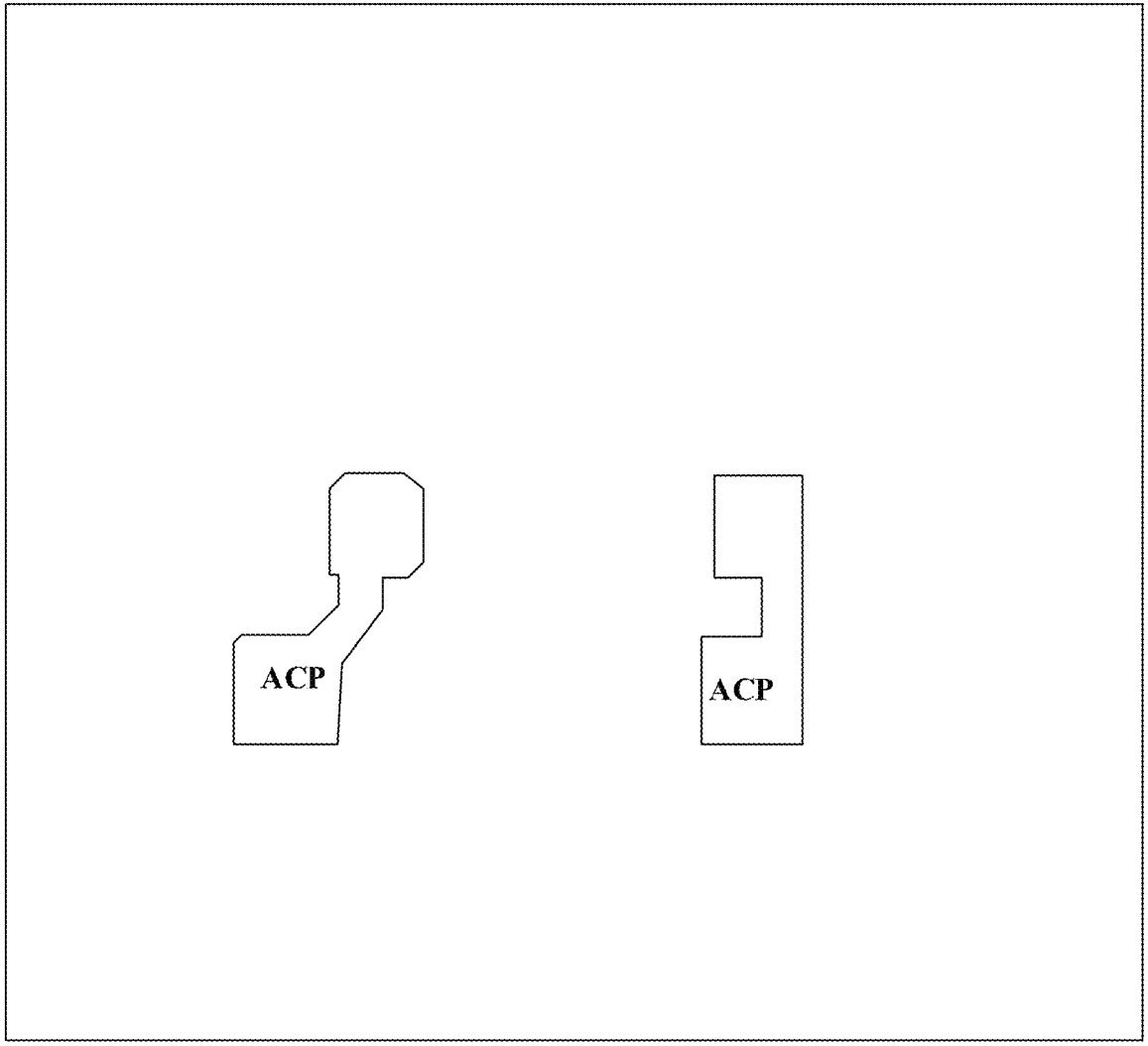
FIG. 3L is a diagram illustrating the structure of an anode connecting pad layer in an array substrate depicted in FIG. 3A.
Figure 3M:
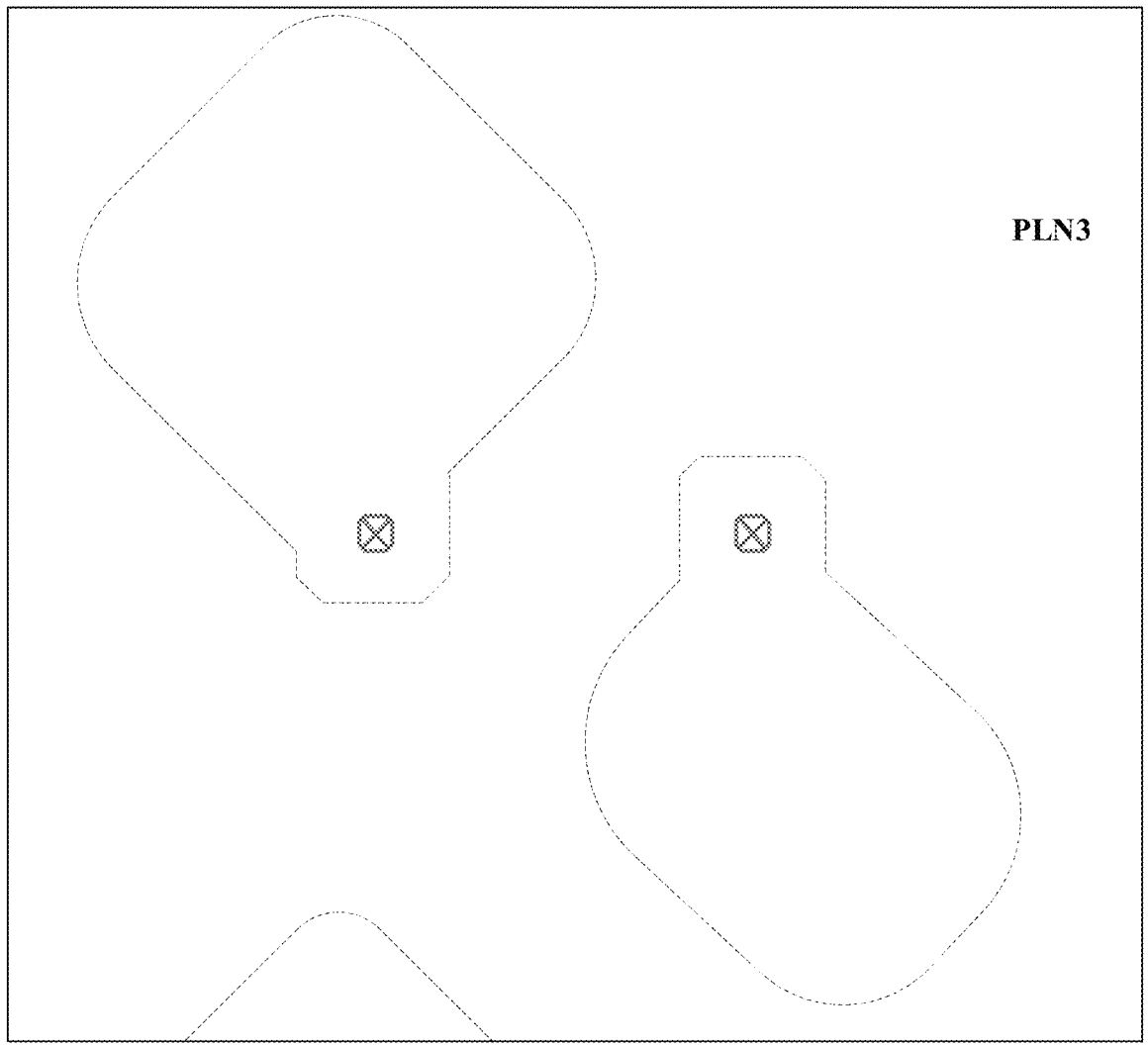
FIG. 3M is a diagram illustrating the structure of a third planarization layer in an array substrate depicted in FIG. 3A.
Figure 3N:
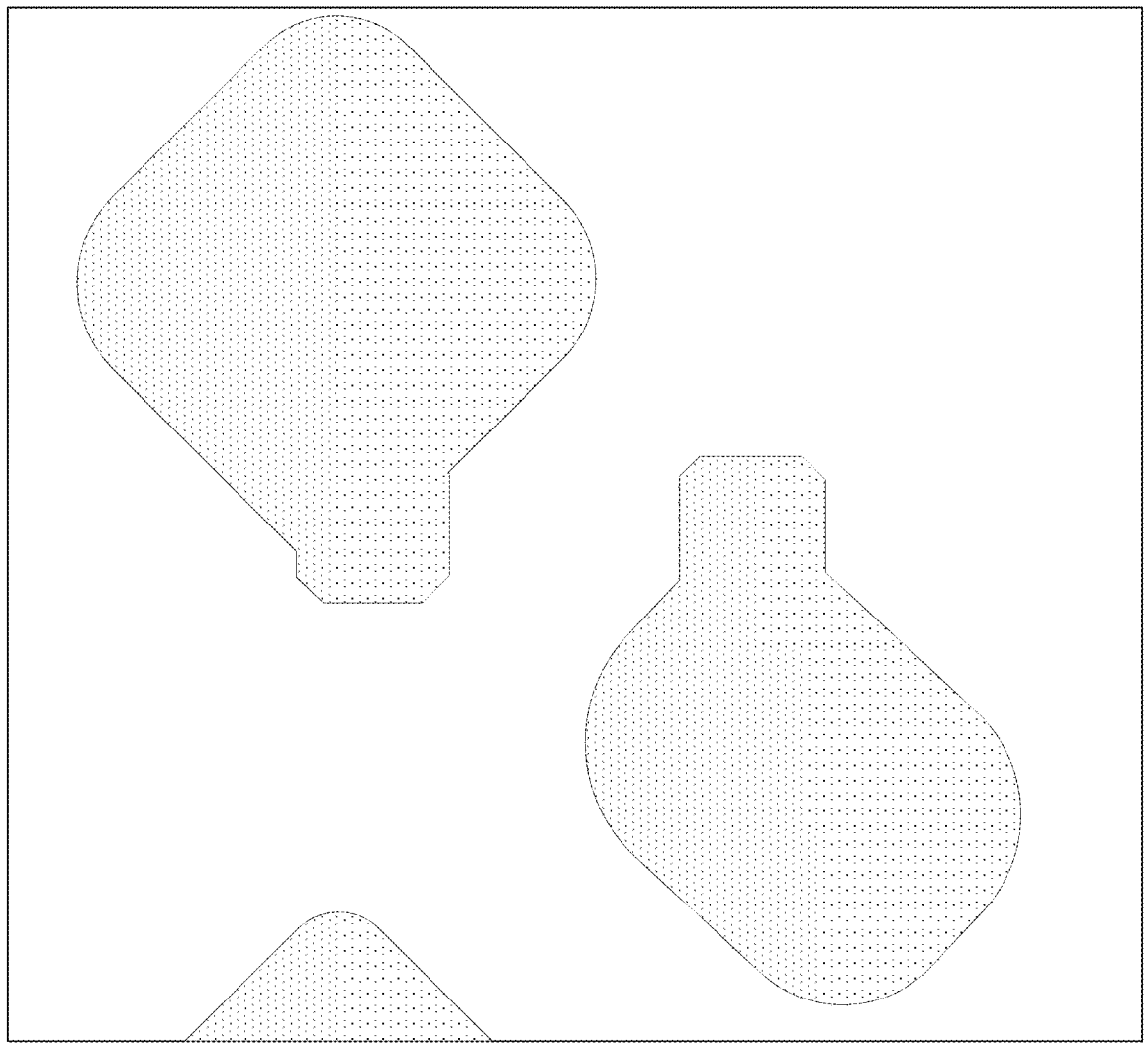
FIG. 3N is a diagram illustrating the structure of an anode layer in an array substrate depicted in FIG. 3A.
Figure 4A:
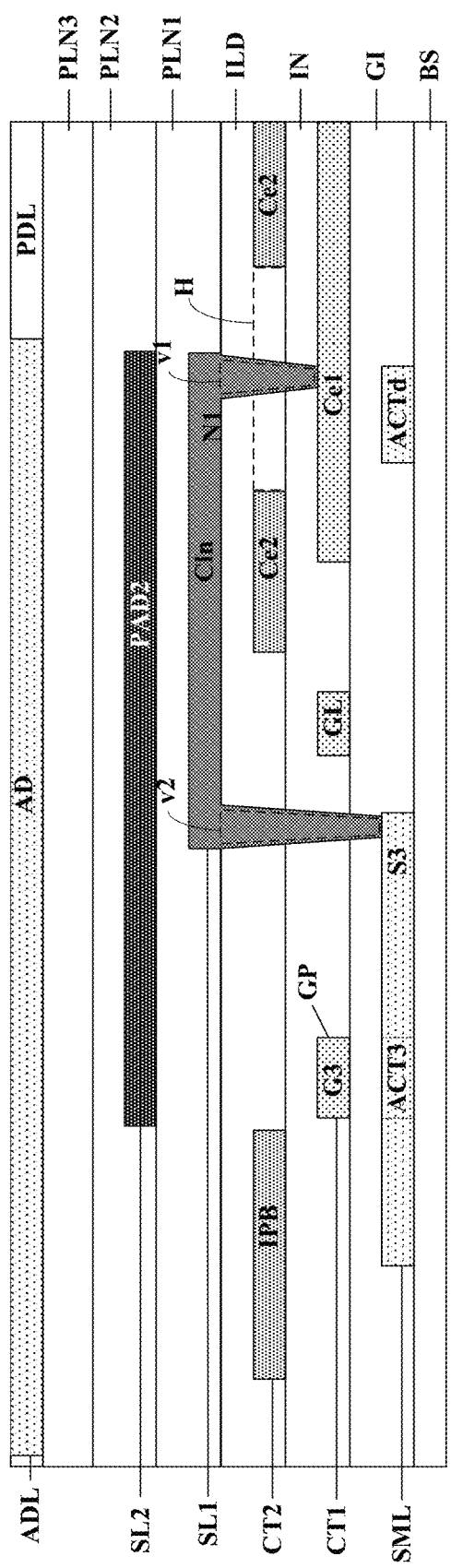
FIG. 4A is a cross-sectional view along an A-A' line in FIG. 3A.
Figure 4B:
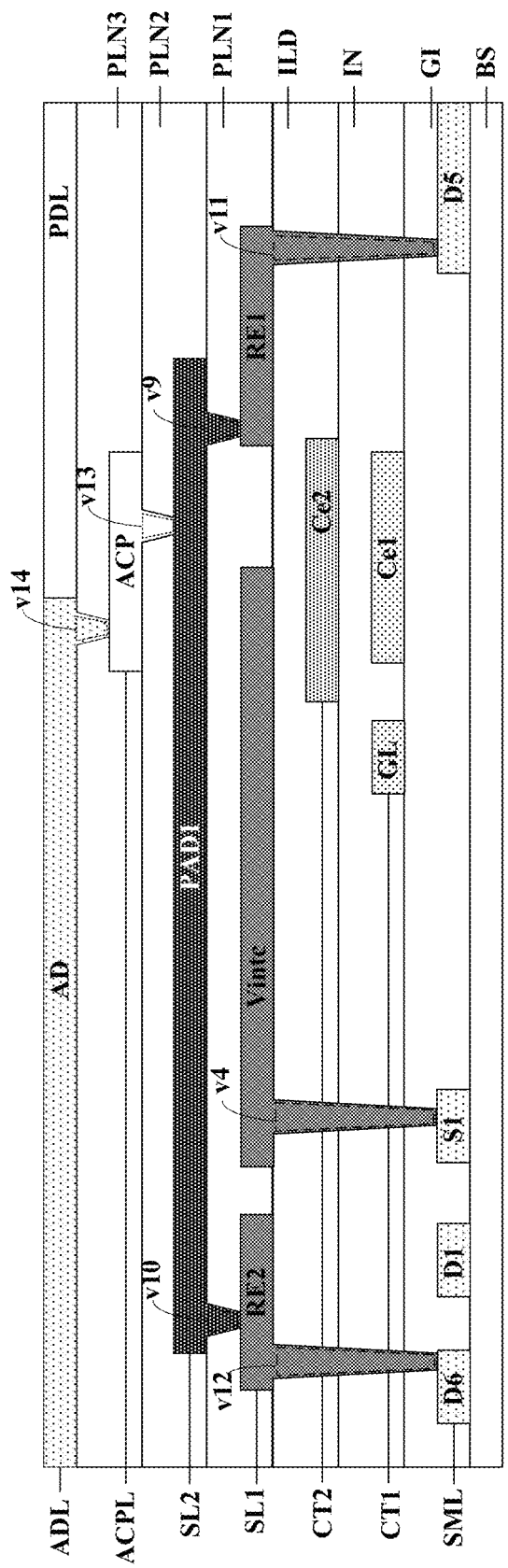
FIG. 4B is a cross-sectional view along a B-B' line in FIG. 3A.
Figure 4C:
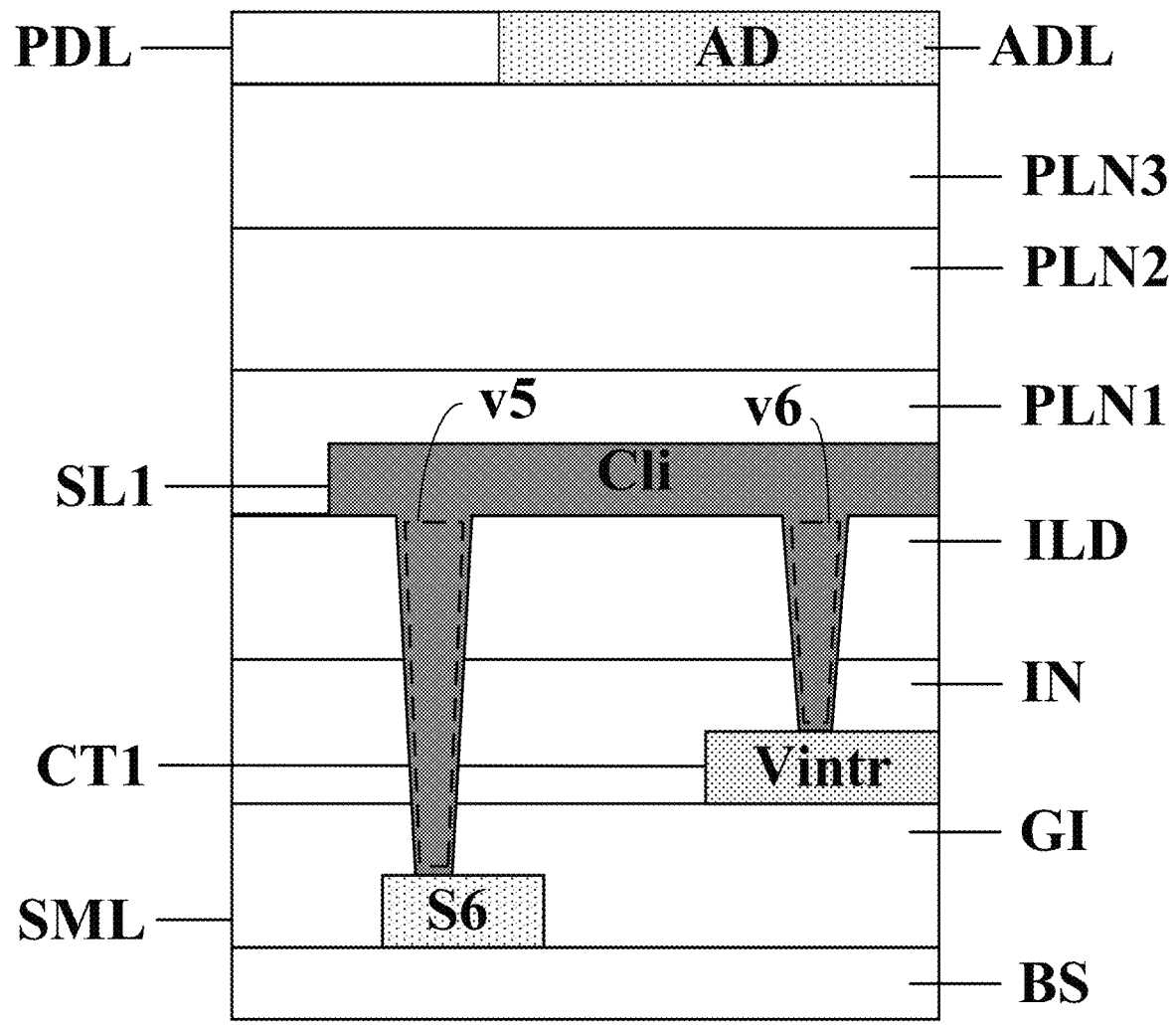
FIG. 4C is a cross-sectional view along a C-C' line in FIG. 3A.
Figure 4D:
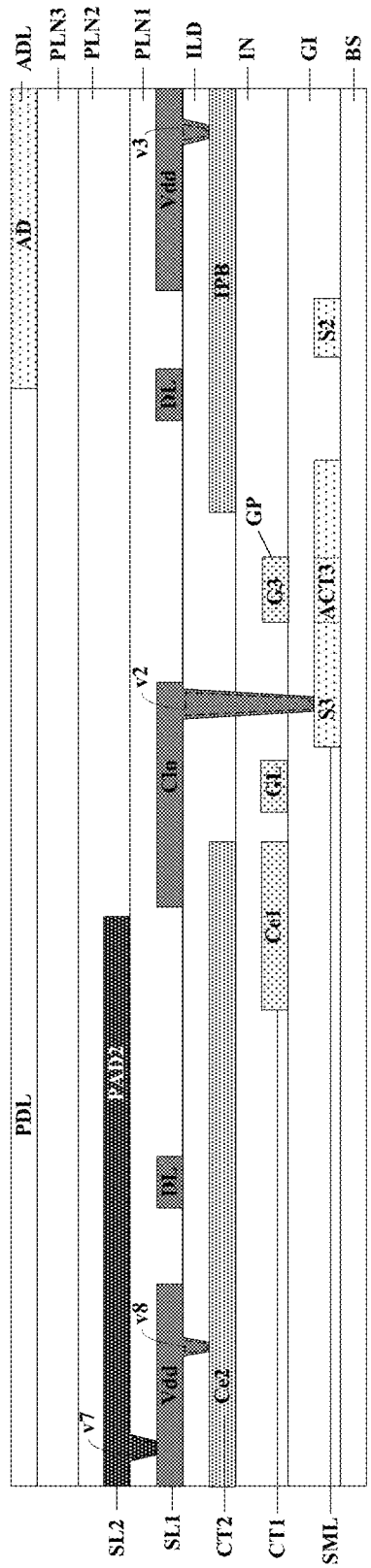
FIG. 4D is a cross-sectional view along a D-D' line in FIG. 3A.

FIG. 3C is a diagram illustrating the structure of a semiconductor material layer in an array substrate depicted in FIG. 3A. FIG. 3D is a diagram illustrating the structure of a first conductive layer in an array substrate depicted in FIG. 3A. FIG. 3E is a diagram illustrating the structure of a second conductive layer in an array substrate depicted in FIG. 3A. FIG. 3F is a diagram illustrating the structure of an insulating layer in an array substrate depicted in FIG. 3A. FIG. 3G is a diagram illustrating the structure of a first signal line layer in an array substrate depicted in FIG. 3A. FIG. 3H is a diagram illustrating the structure of an inter-layer dielectric layer in an array substrate depicted in FIG. 3A. FIG. 3I is a diagram illustrating the structure of a first planarization layer in an array substrate depicted in FIG. 3A. FIG. 3J is a diagram illustrating the structure of a second signal line layer in an array substrate depicted in FIG. 3A. FIG. 3K is a diagram illustrating the structure of a second planarization layer in an array substrate depicted in FIG. 3A. FIG. 3L is a diagram illustrating the structure of an anode connecting pad layer in an array substrate depicted in FIG. 3A. FIG. 3M is a diagram illustrating the structure of a third planarization layer in an array substrate depicted in FIG. 3A. FIG. 3N is a diagram illustrating the structure of an anode layer in an array substrate depicted in FIG. 3A. FIG. 4A is a cross-sectional view along an A-A' line in FIG. 3A. FIG. 4B is a cross-sectional view along a B-B' line in FIG. 3A. FIG. 4C is a cross-sectional view along a C-C' line in FIG. 3A. FIG. 4D is a cross-sectional view along a D-D' line in FIG. 3A. FIG. 4E is a cross-sectional view along a E-E' line in FIG. 3A. FIG. 4F is a cross-sectional view along an F-F' line in FIG. 3A.

Referring to FIG. 3A to FIG. 3N, and FIG. 4A to FIG. 4F, in some embodiments, the array substrate includes a base substrate BS, a semiconductor material layer SML on the base substrate BS, a gate insulating layer GI on a side of the semiconductor material layer SML away from the base substrate BS, a first conductive layer CT1 on a side of the gate insulating layer GI away from the semiconductor material layer SML, an insulating layer IN on a side of the first conductive layer away from the gate insulating layer GI, a second conductive layer CT2 on a side of the insulating layer IN away from the first conductive layer CT1, an inter-layer dielectric layer ILD on a side of the second conductive layer CT2 away from the insulating layer IN, a first signal line layer SL1 on a side of the inter-layer dielectric layer ILD away from the second conductive layer CT2, a first planarization layer PLN1 on a side of the first signal line layer SL1 away from the inter-layer dielectric layer ILD, a second signal line layer SL2 on a side of the first planarization layer PLN1 away from the first signal line layer SL1, a second planarization layer PLN2 on a side of the second signal line layer SL2 away from the first planarization layer PLN1, an anode connecting pad layer ACPL on a side of the second planarization layer PLN2 away from the second signal line layer SL2, a third planarization layer PLN3 on a side of the anode connecting pad layer ACPL away from the second planarization layer PLN2, and an anode layer ADL on a side of the third planarization layer PLN3 away from the anode connecting pad layer ACPL.

Referring to FIG. 2A, FIG. 2B, FIG. 3A, and FIG. 3C, a respective pixel driving circuit is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, and the driving transistor Td. The respective pixel driving circuit is further annotated with labels indicating components of each of the plurality of transistors in the pixel driving circuit. For example, the first transistor T1 includes an active layer ACT1, a first electrode S1, and a second electrode D1. The second transistor T2 includes an active layer ACT2, a first electrode S2, and a second electrode D2. The third transistor T3 includes an active layer ACT3, a first electrode S3, and a second electrode D3. The fourth transistor T4 includes an active layer ACT4, a first electrode S4, and a second electrode D4. The fifth transistor T5 includes an active layer ACT5, a first electrode S5, and a second electrode D5. The sixth transistor T6 includes an active layer ACT6, a first electrode S6, and a second electrode D6. The driving transistor Td includes an active layer ACTd, a first electrode Sd, and a second electrode Dd.

In some embodiments, the active layers (ACT1, ACT2, ACT3, ACT4, ACT5, ACT6, and ACTd) of the transistors (T1, T2, T3, T4, T5, T6, and Td) in the respective pixel driving circuit are in a same layer. Optionally, the active layers (ACT1, ACT2, ACT3, ACT4, ACT5, ACT6, and ACTd), at least portions of the first electrodes (S1, S2, S3, S4, S5, S6, and Sd), and at least portions of the second electrodes (D1, D2, D3, D4, D5, D6, and Dd) of the transistors (T1, T2, T3, T4, T5, T6, and Td) in the respective pixel driving circuit are in a same layer. Optionally, the active layers (ACT1, ACT2, ACT3, ACT4, ACT5, ACT6, and ACTd), the first electrodes (S1, S2, S3, S4, S5, S6, and Sd), and the second electrodes (D1, D2, D3, D4, D5, D6, and Dd) of the transistors (T1, T2, T3, T4, T5, T6, and Td) in the respective pixel driving circuit are in a same layer.

In some embodiments, the active layers ACT1, ACT2, ACT3, ACT4, ACT5, and ACTd of the transistors T1, T2, T3, T4, T5, and Td in the respective pixel driving circuit are parts of a first unitary structure. In another example, the active layers ACT1, ACT2, ACT3, ACT4, ACT5, and ACTd, the first electrodes S1, S2, S3, S4, S5, and Sd, and the second electrodes D1, D2, D3, D4, D5, and Dd, of the transistors T1, T2, T3, T4, T5, and Td in the respective pixel driving circuit are parts of a first unitary structure. As shown in FIG. 3C, in some embodiments, the active layer ACT6 of the transistor T6 in the respective pixel driving circuit is spaced apart from the first unitary structure comprising the active layers ACT1, ACT2, ACT3, ACT4, ACT5, and ACTd of the transistors T1, T2, T3, T4, T5, and Td in the respective pixel driving circuit.

In some embodiments, the active layer ACT6, at least a portion of the first electrode S6, and at least a portion of the second electrode D6, of the transistor T6 in the respective pixel driving circuit, are parts of a second unitary structure. Optionally, the active layer ACT6, the first electrode S6, and the second electrode D6, of the transistor T6 in the respective pixel driving circuit, are parts of a second unitary structure. The second unitary structure in the respective pixel driving circuit is spaced apart from the first unitary structure.

As used herein, the active layer refers to a component of the transistor comprising at least a portion of the semiconductor material layer whose orthographic projection on the base substrate overlaps with an orthographic projection of a gate electrode on the base substrate. As used herein, a first electrode refers to a component of the transistor connected to one side of the active layer, and a second electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a first electrode refers to a component of the transistor connected to a side of the first portion distal to the third portion, and a second electrode refers to a component of the transistor connected to a side of the second portion distal to the third portion.

Referring to FIG. 2A, FIG. 2B, FIG. 3A, and FIG. 3D, the first conductive layer in some embodiments includes a plurality of gate lines GL, a plurality of reset control signal lines rst, a plurality of light emitting control signal lines em, and a first capacitor electrode Ce1 of the storage capacitor Cst. Various appropriate electrode materials and various appropriate fabricating methods may be used to make the first conductive layer. For example, a conductive material may be deposited on the base substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of gate lines GL, the plurality of reset control signal lines rst, the plurality of light emitting control signal lines em, and the first capacitor electrode Ce1 are in a same layer.

As used herein, the term "same layer" refers to the relationship between the layers simultaneously formed in the same step. In one example, the plurality of gate lines GL and the first capacitor electrode Ce1 are in a same layer when they are formed as a result of one or more steps of a same patterning process performed in a same layer of material. In another example, the plurality of gate lines GL and the first capacitor electrode Ce1 can be formed in a same layer by simultaneously performing the step of forming the plurality of gate lines GL, and the step of forming the first capacitor electrode Ce1. The term "same layer" does not always mean that the thickness of the layer or the height of the layer in a cross-sectional view is the same.

In some embodiments, in a respective pixel driving circuit, a respective gate line of the plurality of gate lines GL includes a main portion MP extending along an extension direction of the respective gate line, and a gate protrusion GP protruding away from the main portion MP, e.g., along a direction from the respective gate line of the plurality of gate lines GL in the respective pixel driving circuit toward the respective reset control signal line of the plurality of reset control signal lines rst in the respective pixel driving circuit.

In some embodiments, as discussed above, the third transistor T3 is a double gate transistor. In some embodiments, the gate protrusion GP is one of the double gates G3 in the third transistor T3. In some embodiments, and referring to FIG. 4A, an orthographic projection of the gate protrusion GP on the base substrate BS at least partially overlaps with an orthographic projection of the active layer ACT3 of the third transistor T3 on the base substrate BS.

Referring to FIG. 2A, FIG. 2B, FIG. 3A, and FIG. 3E, the second conductive layer in some embodiments includes a plurality of second reset signal lines Vintr, an interference preventing block IPB and a second capacitor electrode Ce2 of the storage capacitor Cst. The interference preventing block IPB can effectively reduce the cross-talk, particularly vertical cross-talk between the N1 node and the adjacent data lines. Various appropriate conductive materials and various appropriate fabricating methods may be used to make the second conductive layer. For example, a conductive material may be deposited on the base substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of second reset signal lines Vintr, the second capacitor electrode Ce2, and the interference preventing block IPB are in a same layer.

Vias extending through the insulating layer IN are depicted in FIG. 3F.

Referring to FIG. 2A, FIG. 2B, FIG. 3A, and FIG. 3G, the first signal line layer in some embodiments includes a plurality of voltage supply lines Vdd, a node connecting line Cln, an initialization connecting line Cli, a first relay electrode RE1, a second relay electrode RE2, a plurality of first reset signal lines Vintc, and a plurality of data lines DL. The node connecting line Cln connects the first capacitor electrode Ce1 and the first electrode of the third transistor T3 in a respective pixel driving circuit together. Various appropriate conductive materials and various appropriate fabricating methods may be used to make the first signal line layer. For example, a conductive material may be deposited on the base substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of voltage supply lines Vdd, the node connecting line Cln, the initialization connecting line Cli, the first relay electrode RE1, the second relay electrode RE2, the plurality of first reset signal lines Vintc, and the plurality of data lines DL are in a same layer.

Vias extending through the inter-layer dielectric layer ILD are depicted in FIG. 3H.

Vias extending through the first planarization layer PLN1 are depicted in FIG. 3I.

Referring to FIG. 2A, FIG. 2B, FIG. 3A, and FIG. 3J, the second signal line layer in some embodiments includes a first pad PAD1 and a second pad PAD2 in a respective pixel driving circuit. The first pad PAD1 is configured to provide a parasitic capacitance at the fourth node N4. As shown in FIG. 2A and FIG. 2B, the fourth node N4 is connected to the second electrode of the fifth transistor T5, the second electrode of the sixth transistor T6, and the anode of the light emitting element LE. The first pad PAD1 is connected to the second electrode of the fifth transistor T5, the second electrode of the sixth transistor T6, and the anode of the light emitting element LE. Specifically, the second signal line layer in some embodiments includes K number of columns of first pads, a respective first pad in a respective pixel driving circuit. The K number of columns of first pads include a plurality of first-first pads PAD1-1 in (2k-1)-th columns C (2k-1) of the K columns and a plurality of second-first pads PAD1-2 in (2k)-th columns C (2k) of the K columns. The second pad PAD2 is configured to reduce cross-talk between the first node N1 and an adjacent first pad. The second pad PAD2 is connected to a respective voltage supply line of the plurality of voltage supply lines Vdd in an adjacent pixel driving circuit (e.g., a pixel driving circuit on the left) through a via extending through the first planarization layer PLN1. Various appropriate conductive materials and various appropriate fabricating methods may be used to make the second signal line layer. For example, a conductive material may be deposited on the base substrate by a plasma-enhanced chemical vapor deposition (PECVD) process and patterned. Examples of appropriate conductive materials for making the second signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, a first pad PAD1 (e.g., the plurality of first-first pads PAD1-1 in the (2k-1)-th columns C (2k-1) of the K columns and the plurality of second-first pads PAD1-2 in the (2k)-th columns C (2k) of the K columns) and a second pad PAD2 are in a same layer.

Vias extending through the second planarization layer PLN2 are depicted in FIG. 3K.

Referring to FIG. 2A, FIG. 2B, FIG. 3A, and FIG. 3L, the anode connecting pad layer in some embodiments includes an anode connecting pad ACP in a respective pixel driving circuit. The anode connecting pad ACP connects an anode of a light emitting element in the respective pixel driving circuit to a first pad PAD1 in the respective pixel driving circuit. Various appropriate conductive materials and various appropriate fabricating methods may be used to make the anode connecting pad layer. For example, a conductive material may be deposited on the base substrate by a plasma-enhanced chemical vapor deposition (PECVD) process and patterned. Examples of appropriate conductive materials for making the anode connecting pad layer include, but are not limited to, metal oxide materials such as indium tin oxide, and metallic materials such as aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

Vias extending through the third planarization layer PLN3 are depicted in FIG. 3M. In FIG. 3M, corresponding positions of a plurality of anodes are depicted in dotted lines.

Referring to FIG. 2A, FIG. 2B, FIG. 3A, and FIG. 3N, the array substrate further includes an anode layer. A respective anode is connected to an anode connecting pad through a respective via extending through the third planarization layer PLN3.

Referring to FIG. 2A, FIG. 2B, FIG. 3A, FIG. 3D, FIG. 3E, and FIG. 4A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the first signal line layer includes a node connecting line Cln on a side of the inter-layer dielectric layer ILD away from the second capacitor electrode Ce2. The node connecting line Cln is in a same layer as the plurality of voltage supply lines Vdd. Optionally, the array substrate further includes a first via v1 in the hole region H and extending through the inter-layer dielectric layer ILD and the insulating layer IN. Optionally, the node connecting line Cln is connected to the first capacitor electrode Ce1 through the first via v1. In some embodiments, the first capacitor electrode Ce1 is on a side of the gate insulating layer GI away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the node connecting line Cln is connected to the first capacitor electrode Ce1 through the first via v1, and the node connecting line Cln is connected to the semiconductor material layer SML through the second via v2. Optionally, the node connecting line Cln is connected to the first electrode S3 of third transistor, as depicted in FIG. 4A.

Referring to FIG. 2A, FIG. 2B, FIG. 3A, FIG. 3E, and FIG. 4D, in some embodiments, the interference preventing block IPB is in a same layer as the second capacitor electrode Ce2. A respective voltage supply line of the plurality of voltage supply lines Vdd is connected to the interference preventing block IPB through a third via v3. Optionally, the third via v3 extends through the inter-layer dielectric layer ILD. Optionally, an orthographic projection of the interference preventing block IPB on the base substrate BS partially overlaps with an orthographic projection of the respective voltage supply line of the plurality of voltage supply lines Vdd on the base substrate BS.

Figure 5A:
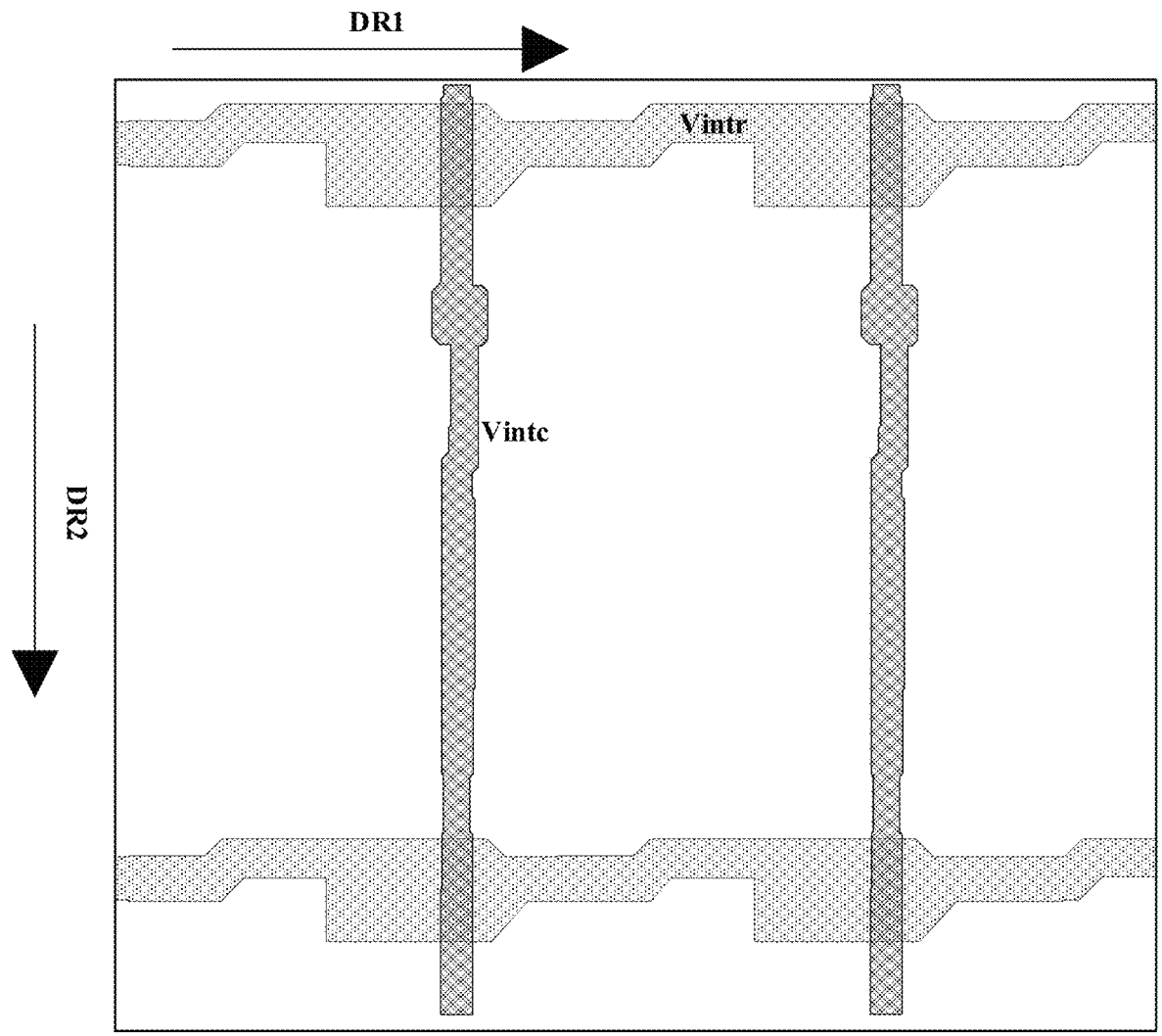
FIG. 5A illustrates a network of reset signal lines in an array substrate depicted in FIG. 3A

FIG. 5A illustrates a network of reset signal lines in an array substrate depicted in FIG. 3A. Referring to FIG. 5A and FIG. 3A, the network of reset signal lines in the array substrate includes a plurality of second reset signal lines Vintr extending along a first direction DR1, respectively; and a plurality of first reset signal lines Vintc extending along a second direction DR2. A respective first reset signal line crosses over multiple second reset signal lines. A respective second reset signal line crosses over multiple first reset signal lines. The respective first reset signal line is not connected to the multiple second reset signal lines where the respective first reset signal line crosses over the multiple second reset signal lines. The respective second reset signal line is not connected to the multiple first reset signal lines where the respective second reset signal line crosses over the multiple first reset signal lines.

Referring to FIG. 2A, FIG. 2B, FIG. 3A, and FIG. 4B, a respective first reset signal line of the plurality of first reset signal lines Vintc is connected to the first electrode S1 of the first transistor T1 through a fourth via v4 extending through the inter-layer dielectric layer ILD, the insulating layer IN, and the gate insulating layer GI, thereby providing an initialization signal to the first electrode S1 of the first transistor T1.

Referring to FIG. 2A, FIG. 2B, FIG. 3A, FIG. 3G, and FIG. 4C, the initialization connecting line Cli is connected to the first electrode S6 of the sixth transistor T6 through a fifth via v5 extending through the inter-layer dielectric layer ILD, the insulating layer IN, and the gate insulating layer GI; and is connected to a respective second reset signal line of the plurality of second reset signal lines Vintr through a sixth via v6 extending through the inter-layer dielectric layer ILD and the insulating layer IN; thereby providing an initialization signal to the first electrode S6 of the sixth transistor T6.

Figure 5B:
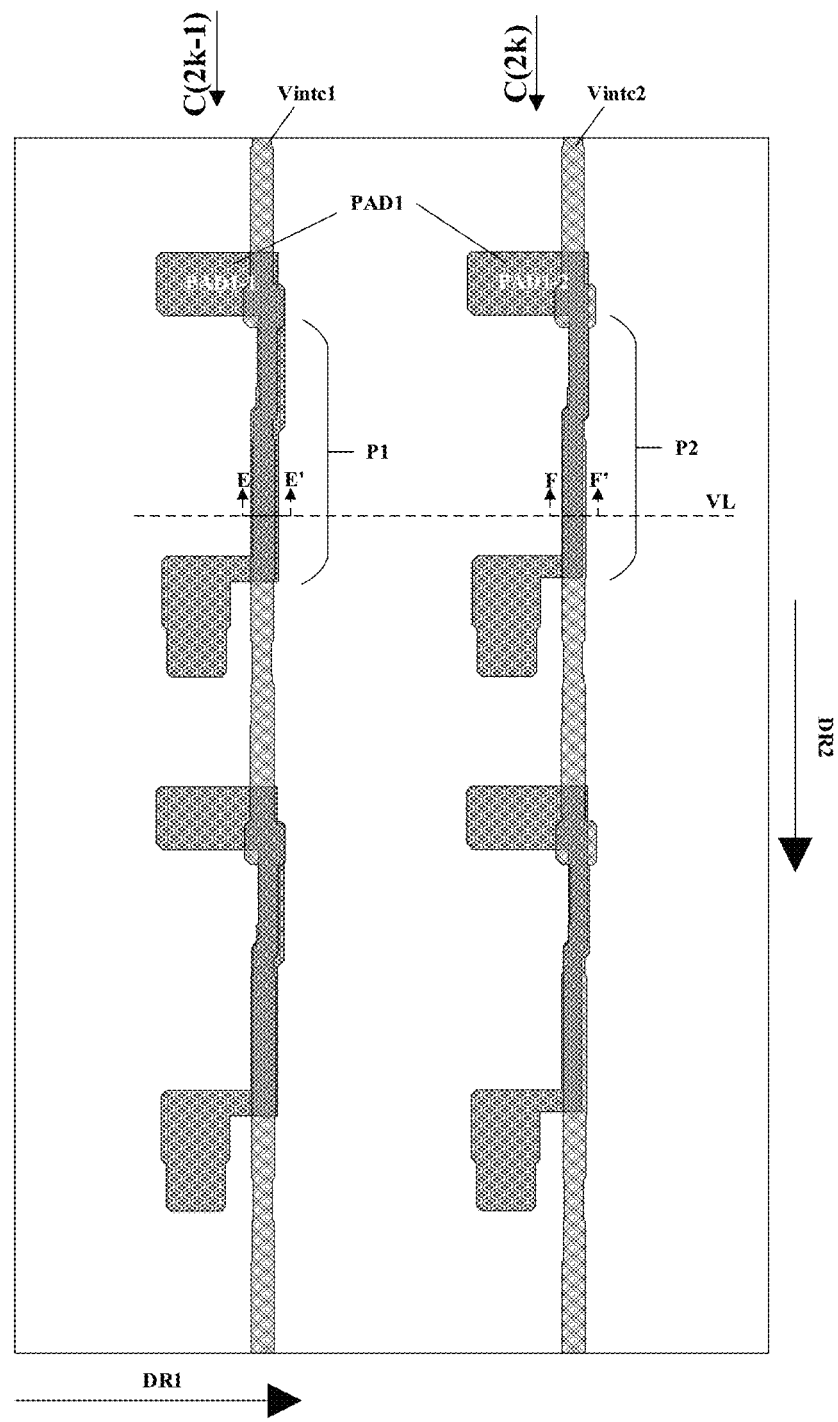
FIG. 5B illustrates the structure of first pads and first reset signal lines in an array substrate depicted in FIG. 3A.
Figure 5C:
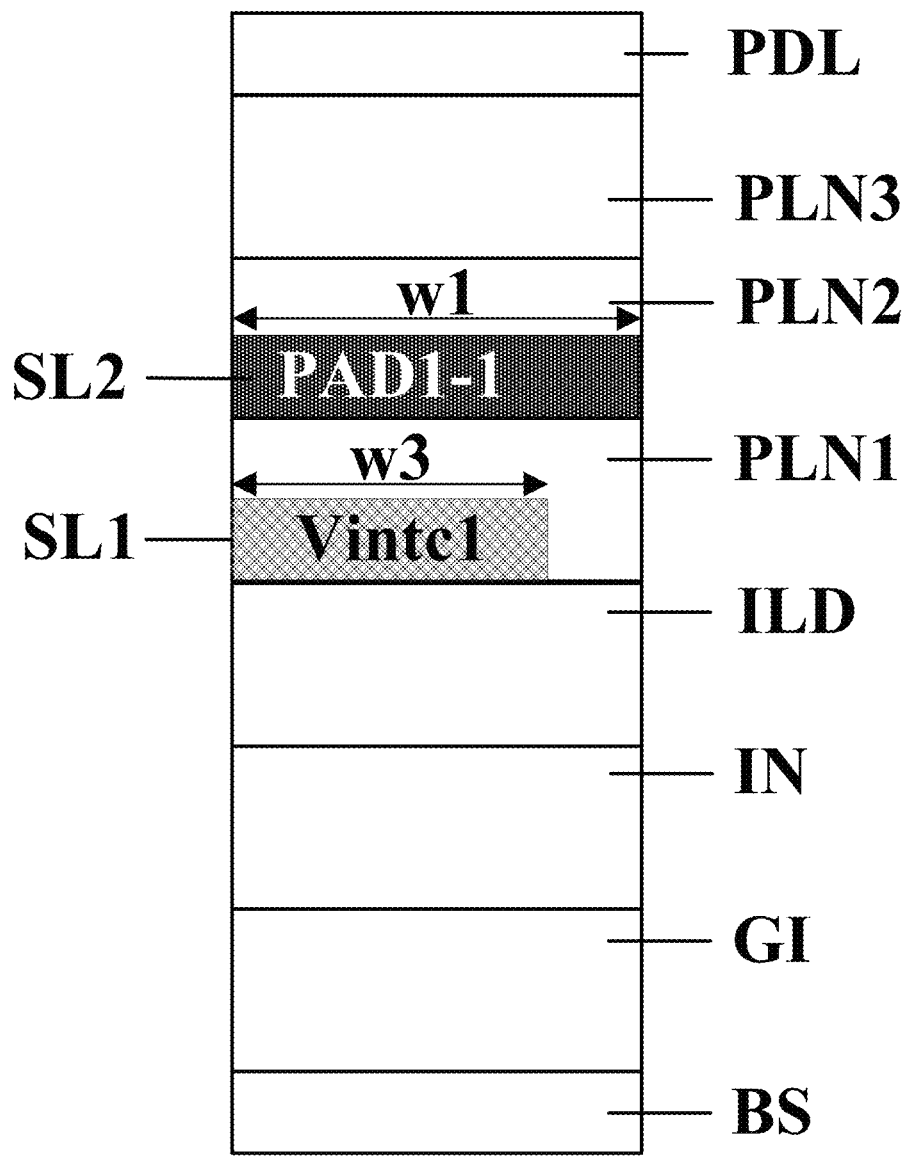
FIG. 5C is a cross-sectional view along a E-E' line in FIG. 5B.
Figure 5D:
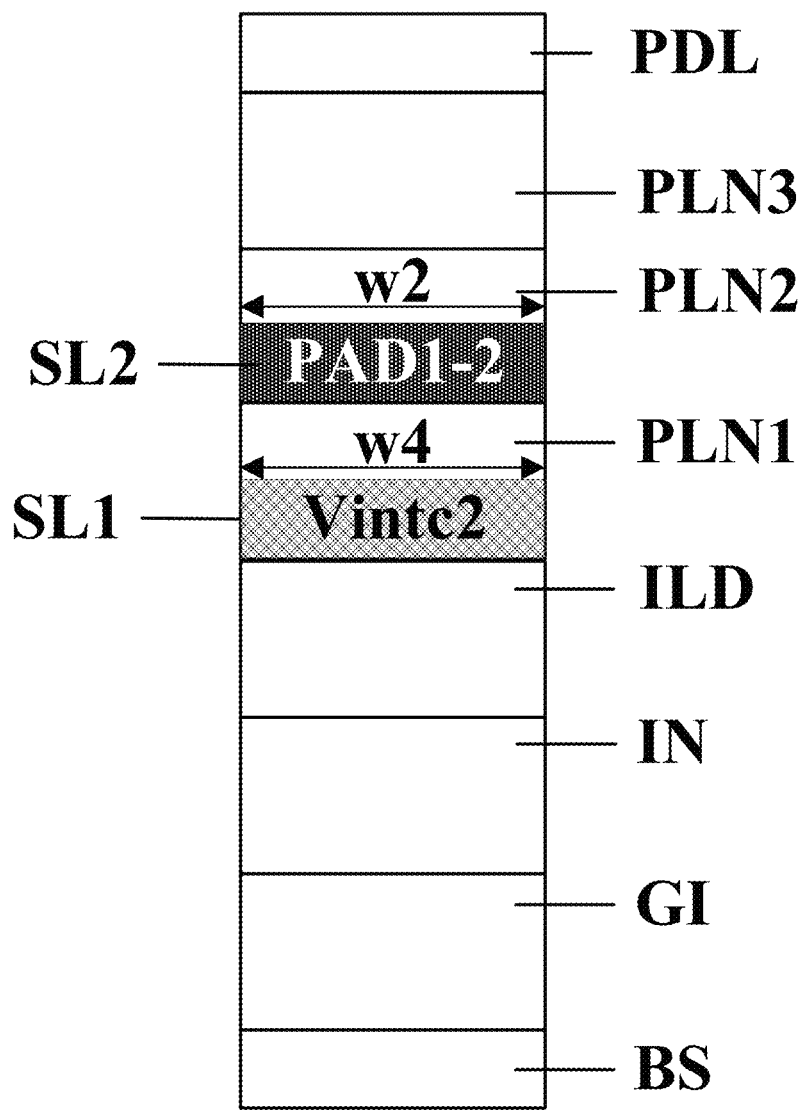
FIG. 5D is a cross-sectional view along an F-F' line in FIG. 5B.

FIG. 5B illustrates the structure of first pads and first reset signal lines in an array substrate depicted in FIG. 3A. FIG. 5C is a cross-sectional view along a E-E' line in FIG. 5B. FIG. 5D is a cross-sectional view along an F-F' line in FIG. 5B. FIG. 5E is a superimposition of a respective first-first pad and a respective second-first pad. Referring to FIG. 2A, FIG. 2B, FIG. 3A, FIG. 3J, FIG. 4B, and FIG. 5A to FIG. 5E, the first pad PAD1 is configured to provide a parasitic capacitance at the fourth node N4. In one example, the parasitic capacitance at the fourth node N4 is formed between the first pad PAD1 and the respective first reset signal line of the plurality of first reset signal lines Vintc. An orthographic projection of the first pad PAD1 on a base substrate BS at least partially overlaps with an orthographic projection of the respective first reset signal line on the base substrate BS. The first pad PAD1 is connected to the second electrode of the fifth transistor T5, the second electrode of the sixth transistor T6, and the anode of the light emitting element LE.

In some embodiments, the first pad PAD1 crosses over a respective gate line of the plurality of gate lines GL. Optionally, an orthographic projection of the first pad PAD1 on the base substrate BS at least partially overlaps with an orthographic projection of a respective reset control signal line of the plurality of reset control signal lines rst on the base substrate BS. Optionally, the orthographic projection of the first pad PAD1 on the base substrate BS at least partially overlaps with an orthographic projection of a respective light emitting control signal line of the plurality of light emitting control signal lines em on the base substrate BS. In one example, the orthographic projection of the first pad PAD1 on the base substrate BS at least partially overlaps with the orthographic projection of the respective reset control signal line of the plurality of reset control signal lines rst on the base substrate BS, and at least partially overlaps with the orthographic projection of a respective light emitting control signal line of the plurality of light emitting control signal lines em on the base substrate BS.

In some embodiments, the array substrate includes K number of columns of first pads, a respective first pad in a respective pixel driving circuit. The K number of columns of first pads include a plurality of first-first pads PAD1-1 in (2k-1)-th columns C (2k-1) of the K columns and a plurality of second-first pads PAD1-2 in (2k)-th columns C (2k) of the K columns. The plurality of first reset signal lines Vintc include multiple first-first reset signal lines Vintc1 and multiple second-first reset signal lines Vintc2 alternately arranged. The multiple first-first reset signal lines Vintc1 are in the (2k-1)-th columns C (2k-1) of the K columns and the multiple second-first reset signal lines Vintc2 are in the (2k)-th columns C (2k) of the K columns. Optionally, the multiple first-first reset signal lines Vintc1 and the multiple second-first reset signal lines Vintc2 are parallel to each other.

In some embodiments, a first parasitic capacitance between a respective first-first pad and a respective first-first reset signal line Vintc1 in the (2k-1)-th columns C (2k-1) of the K columns is different from a second parasitic capacitance between a respective second-first pad and a respective second-first reset signal line Vintc2 in the (2k)-th columns C (2k) of the K columns. Optionally, the first parasitic capacitance is greater than the second parasitic capacitance.

Optionally, the first parasitic capacitance is greater than the second parasitic capacitance by at least 1%, e.g., by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%. Optionally, the first parasitic capacitance is greater than the second parasitic capacitance by 20%.

In some embodiments, orthographic projections of the respective first-first pad and the respective first-first reset signal line Vintc1 in the (2k-1)-th columns C (2k-1) of the K columns overlap with each other in a first overlapping region having a first area, orthographic projections of the respective second-first pad and the respective second-first reset signal line Vintc2 in the (2k)-th columns C (2k) of the K columns overlap with each other in a second overlapping region having a second area, wherein the first area and the second area are different from each other. Optionally, the first area is greater than the second area.

Optionally, the first area is greater than the second area by at least 1%, e.g., by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%. Optionally, the first area is greater than the second area by 20%.

In some embodiments, referring to FIG. 5B to FIG. 5E, a first portion P1 of the respective first-first pad in the first overlapping region has a first width w1 along a first direction DR1, a second portion P2 of the respective second-first pad in the second overlapping region has a second width w2 along the first direction DR1, the first width w1 and the second width w2 being different from each other, wherein a virtual line (e.g., a virtual line VL crossing over the E-E' line and the F-F' line in FIG. 5B) along the first direction DR1 crosses over the first portion P1 and the second portion P2. The first direction DR1 is perpendicular to extension direction of the respective first-first reset signal line Vintc1 and the respective second-first reset signal line Vintc2. Optionally, the first portion P1 is an elongated portion of the respective first-first pad in the first overlapping region, a longitudinal direction of which is parallel to the second direction DR2. Optionally, the second portion P2 is an elongated portion of the respective second-first pad in the second overlapping region, a longitudinal direction of which is parallel to the second direction DR2.

In some embodiments, the first width w1 is greater than the second width w2. Optionally, the first width w1 is greater than the second width w2 by at least 1%, e.g., by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%. Optionally, the first width w1 is greater than the second width w2 by 20%.

Optionally, the first width w1 is greater than the second width w2 by at least 0.05 μm, e.g., by at least 0.1 μm, by at least 0.15 μm, by at least 0.2 μm, by at least 0.25 μm, by at least 0.3 μm, by at least 0.35 μm, by at least 0.4 μm, by at least 0.45 μm, by at least 0.5 μm, by at least 0.55 μm, by at least 0.6 μm, by at least 0.65 μm, by at least 0.7 μm, by at least 0.75 μm, by at least 0.8 μm, by at least 0.85 μm, by at least 0.9 μm, by at least 0.95 μm, or by at least 1 μm. Optionally, the first width w1 is greater than the second width w2 by 0.4 μm. In one example, the first width w1 is 2.4 μm, the second width w2 is 2.0 μm.

In some embodiments, referring to FIG. 5B to FIG. 5E, along the virtual line VL, the respective first-first reset signal line Vintc1 has a third width w3 along the first direction DR1, and the respective second-first reset signal line Vintc2 has a fourth width w4 along the first direction DR1, the third width w3 being substantially the same as the fourth width w4. As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, or not exceeding 0.01%, of the base value.

Optionally, the second width w2 is substantially the same as the third width w3. Optionally, the second width w2 is substantially the same as the fourth width w4.

In some embodiments, the first width w1 is greater than the third width w3. Optionally, the first width w1 is greater than the third width w3 by at least 1%, e.g., by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%. Optionally, the first width w1 is greater than the third width w3 by 20%.

In some embodiments, the first width w1 is greater than the fourth width w4. Optionally, the first width w1 is greater than the fourth width w4 by at least 1%, e.g., by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%. Optionally, the first width w1 is greater than the fourth width w4 by 20%.

In some embodiments, the first portion P1 of the respective first-first pad in the first overlapping region has a first average width aw1 along the first direction DR1, the second portion P2 of the respective second-first pad in the second overlapping region has a second average width aw2 along the first direction DR1, the first average width aw1 and the second average width aw2 being different from each other.

In some embodiments, the first average width aw1 is greater than the second average width aw2. Optionally, the first average width aw1 is greater than the second average width aw2 by at least 1%, e.g., by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%. Optionally, the first average width aw1 is greater than the second average width aw2 by 20%.

Optionally, the first average width aw1 is greater than the second average width aw2 by at least 0.05 μm, e.g., by at least 0.1 μm, by at least 0.15 μm, by at least 0.2 μm, by at least 0.25 μm, by at least 0.3 μm, by at least 0.35 μm, by at least 0.4 μm, by at least 0.45 μm, by at least 0.5 μm, by at least 0.55 μm, by at least 0.6 μm, by at least 0.65 μm, by at least 0.7 μm, by at least 0.75 μm, by at least 0.8 μm, by at least 0.85 μm, by at least 0.9 μm, by at least 0.95 μm, or by at least 1 μm. Optionally, the first average width aw1 is greater than the second average width aw2 by 0.4 μm. In one example, the first average width aw1 is 2.4 μm, the second average width aw2 is 2.0 μm.

In some embodiments, the respective first-first reset signal line Vintc1 has a third average width aw3 along the first direction DR1, and the respective second-first reset signal line Vintc2 has a fourth average width aw4 along the first direction DR1, the third average width aw3 being substantially the same as the fourth average width aw4.

Optionally, the second average width aw2 is substantially the same as the third average width aw3. Optionally, the second average width aw2 is substantially the same as the fourth average width aw4.

In some embodiments, the first average width aw1 is greater than the third average width aw3. Optionally, the first average width aw1 is greater than the third average width aw3 by at least 1%, e.g., by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%. Optionally, the first average width aw1 is greater than the third average width aw3 by 20%.

In some embodiments, the first average width aw1 is greater than the fourth average width aw4. Optionally, the first average width aw1 is greater than the fourth average width aw4 by at least 1%, e.g., by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%. Optionally, the first average width aw1 is greater than the fourth average width aw4 by 20%.

In some embodiments, a ratio of a total number of the multiple first-first reset signal lines Vintc1 to a total number of the plurality of first-first pads PAD1-1 is the same as a ratio of a total number of the multiple second-first reset signal lines Vintc2 to a total number of the plurality of second-first pads PAD1-2.

FIG. 5F illustrates the structure of first pad in some embodiments according to the present disclosure. Referring to FIG. 5B and FIG. 5F, the first pad in some embodiments includes a first pad part PP1, a second pad part PP2, and a third pad part PP3, the first pad part PP1 connecting the second pad part PP2 to the third pad part PP3. The second pad part PP2 and the third pad part PP3 extend from the first pad part PP1 to a same side (e.g., to the left side). An orthographic projection of the first pad part PP1 on the base substrate at least partially overlaps with an orthographic projection of the respective first reset signal line on the base substrate. An orthographic projection of the second pad part PP2 on the base substrate is at least partially non-overlapping with the orthographic projection of the respective first reset signal line on the base substrate, e.g., the orthographic projection of the second pad part PP2 on the base substrate is completely non-overlapping with the orthographic projection of the respective first reset signal line on the base substrate. An orthographic projection of the third pad part PP3 on the base substrate is at least partially non-overlapping with the orthographic projection of the respective first reset signal line on the base substrate, e.g., the orthographic projection of the third pad part PP3 on the base substrate is completely non-overlapping with the orthographic projection of the respective first reset signal line on the base substrate.

In some embodiments, the pixel driving circuits in the (2k-1)-th columns C (2k-1) of the K columns are pixel driving circuits for driving light emission of subpixels of a first color and subpixels of a second color; the pixel driving circuits in the (2k)-th columns C (2k) of the K columns are pixel driving circuits for driving light emission of subpixels of a third color. In one example, the first color is red, the second color is blue, and the third color is green.

In related array substrates, typically it takes a longer time for green subpixels to light up as compared to red subpixels and blue subpixels, particularly when displaying images of lower grayscales, resulting in red trailing defects in the related array substrates. In the present array substrate, the parasitic capacitance at the fourth node N4 for the pixel driving circuits in the (2k-1)-th columns C (2k-1) of the K columns is greater than the parasitic capacitance at the fourth node N4 for the pixel driving circuits in the (2k)-th columns C (2k) of the K columns. Accordingly, the higher parasitic capacitance at the fourth node N4 decreases the light-up speed in the red subpixels and blue subpixels, as compared to the green subpixels. The inventors of the present disclosure, surprisingly and unexpectedly, discover that the intricate structure of the present array substrate achieves a similar light-up speed in green subpixels, red subpixels, and blue subpixels, obviating the issue of red trailing defects in the related array substrates.

Figure 6A:
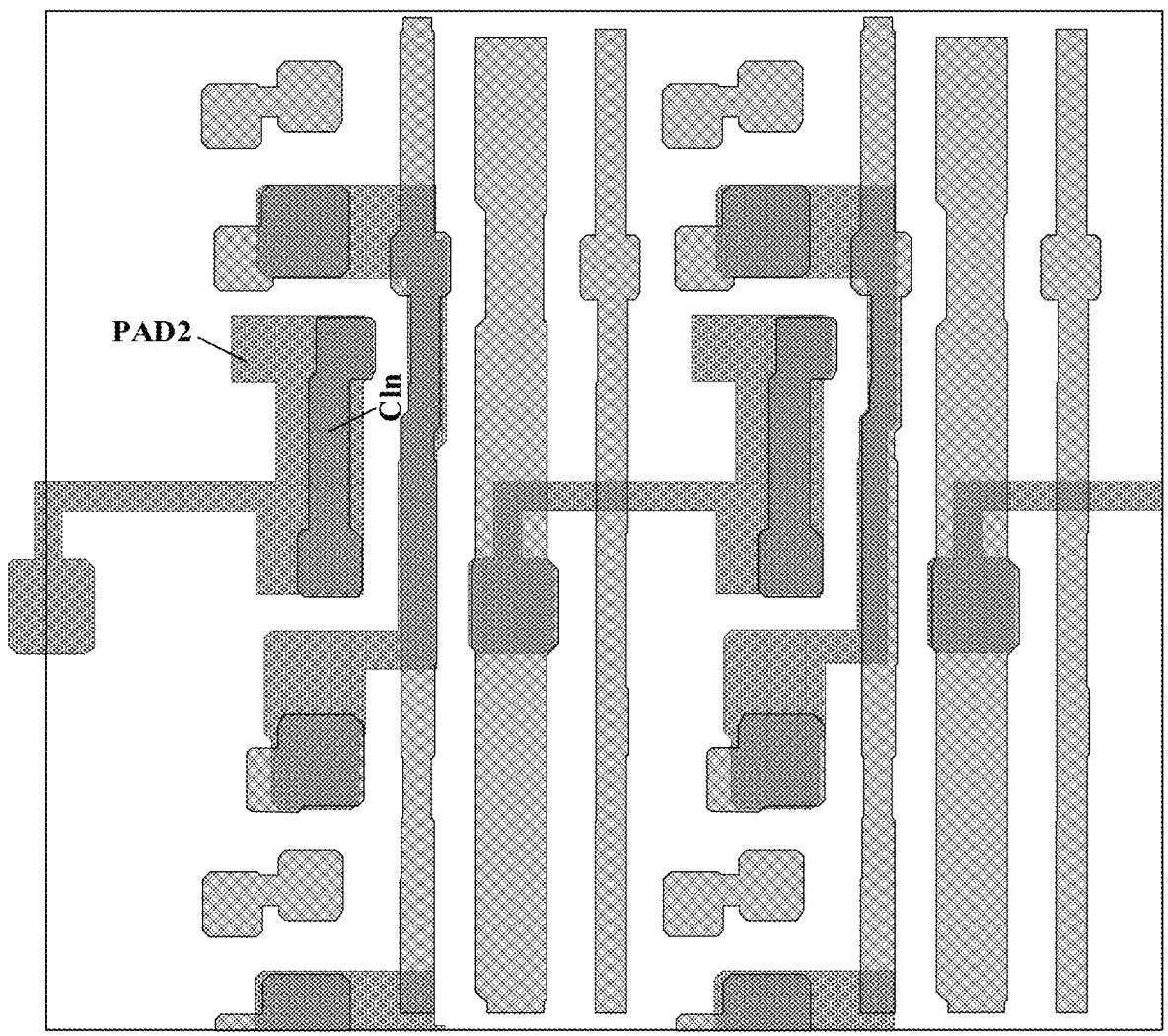
FIG. 6A illustrates the structure of a first signal line layer and a second signal line layer in some embodiments according to the present disclosure.

As discussed previously, the second pad PAD2 is configured to reduce cross-talk between the first node N1 and an adjacent first pad. Referring to FIG. 4D, the second pad PAD2 is connected to a respective voltage supply line of the plurality of voltage supply lines Vdd in an adjacent pixel driving circuit through a seventh via v7 extending through the first planarization layer PLN1. The respective voltage supply line of the plurality of voltage supply lines Vdd is connected to the second capacitor electrode Ce2 through an eighth via v8 extending through the inter-layer dielectric layer ILD. FIG. 6A illustrates the structure of a first signal line layer and a second signal line layer in some embodiments according to the present disclosure. As shown in FIG. 6A and FIG. 4A, in some embodiments, an orthographic projection of the second pad PAD2 in a respective pixel driving circuit on the base substrate BS covers at least 50% (e.g., at least 55%, at least 60%, at least 65%, at least 70%, at least 75%, at least 80%, at least 85%, at least 90%, at least 95%, at least 99%, or 100%) of an orthographic projection of the node connecting line Cln in the respective pixel driving circuit on the base substrate BS. In some embodiments, the orthographic projection of the second pad PAD2 in the respective pixel driving circuit on the base substrate BS at least partially overlaps with an orthographic projection of the active layer ACT3 of the third transistor T3 on the base substrate BS. In some embodiments, the orthographic projection of the second pad PAD2 in the respective pixel driving circuit on the base substrate BS covers at least 50% (e.g., at least 55%, at least 60%, at least 65%, at least 70%, at least 75%, at least 80%, at least 85%, at least 90%, at least 95%, at least 99%, or 100%) of an orthographic projection of the gate protrusion GP of a respective gate line of the plurality of gate lines GL on the base substrate BS.

Figure 6B:
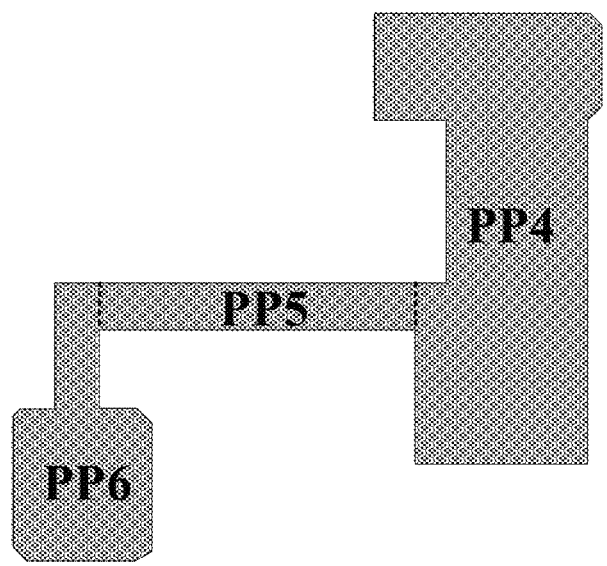
FIG. 6B illustrates the structure of a second pad in some embodiments according to the present disclosure.

FIG. 6B illustrates the structure of a second pad in some embodiments according to the present disclosure. Referring to FIG. 6B, the second pad in some embodiments includes a fourth pad part PP4, a fifth pad part PP5, and a sixth pad part PP6. The fifth pad part PP5 connects the fourth pad part PP4 to the sixth pad part PP6. Referring to FIG. 3A, FIG. 4D, FIG. 6A, and FIG. 6B, an orthographic projection of the fourth pad part PP4 on the base substrate BS at least partially overlaps with the orthographic projection of the node connecting line Cln in the respective pixel driving circuit on the base substrate BS, and at least partially overlaps with the orthographic projection of the gate protrusion GP of the respective gate line of the plurality of gate lines GL on the base substrate BS. An orthographic projection of the sixth pad part PP6 on the base substrate BS at least partially overlaps with an orthographic projection of a respective voltage supply line of the plurality of voltage supply lines Vdd in an adjacent pixel driving circuit on the base substrate BS. The fifth pad part PP5 crosses over a respective data line of the plurality of data lines DL in the adjacent pixel driving circuit. The adjacent pixel driving circuit and the respective pixel driving circuit are in a same row along the first direction DR1.

Referring to FIG. 3A and FIG. 4B, the first pad PAD1 is connected to a first relay electrode RE1 in the first signal line layer SL1 through a ninth via v9 extending through the first planarization layer PLN1, and is connected to a second relay electrode RE2 in the first signal line layer SL1 through a tenth via v10 extending through the first planarization layer PLN1. The first relay electrode RE1 is connected to the second electrode D5 of the fifth transistor T5 through an eleventh via v11 extending through the inter-layer dielectric layer ILD, the insulating layer IN, and the gate insulating layer GI. The second relay electrode RE2 is connected to the second electrode D6 of the sixth transistor T6 through a twelfth via v12 extending through the inter-layer dielectric layer ILD, the insulating layer IN, and the gate insulating layer GI. The anode connecting pad ACP is connected to the first pad PAD1 through a thirteenth via v13 extending through the second planarization layer PLN2. The anode AD is connected to the anode connecting pad ACP through a fourteenth via v14 extending through a third planarization layer PLN3.

Figure 7:
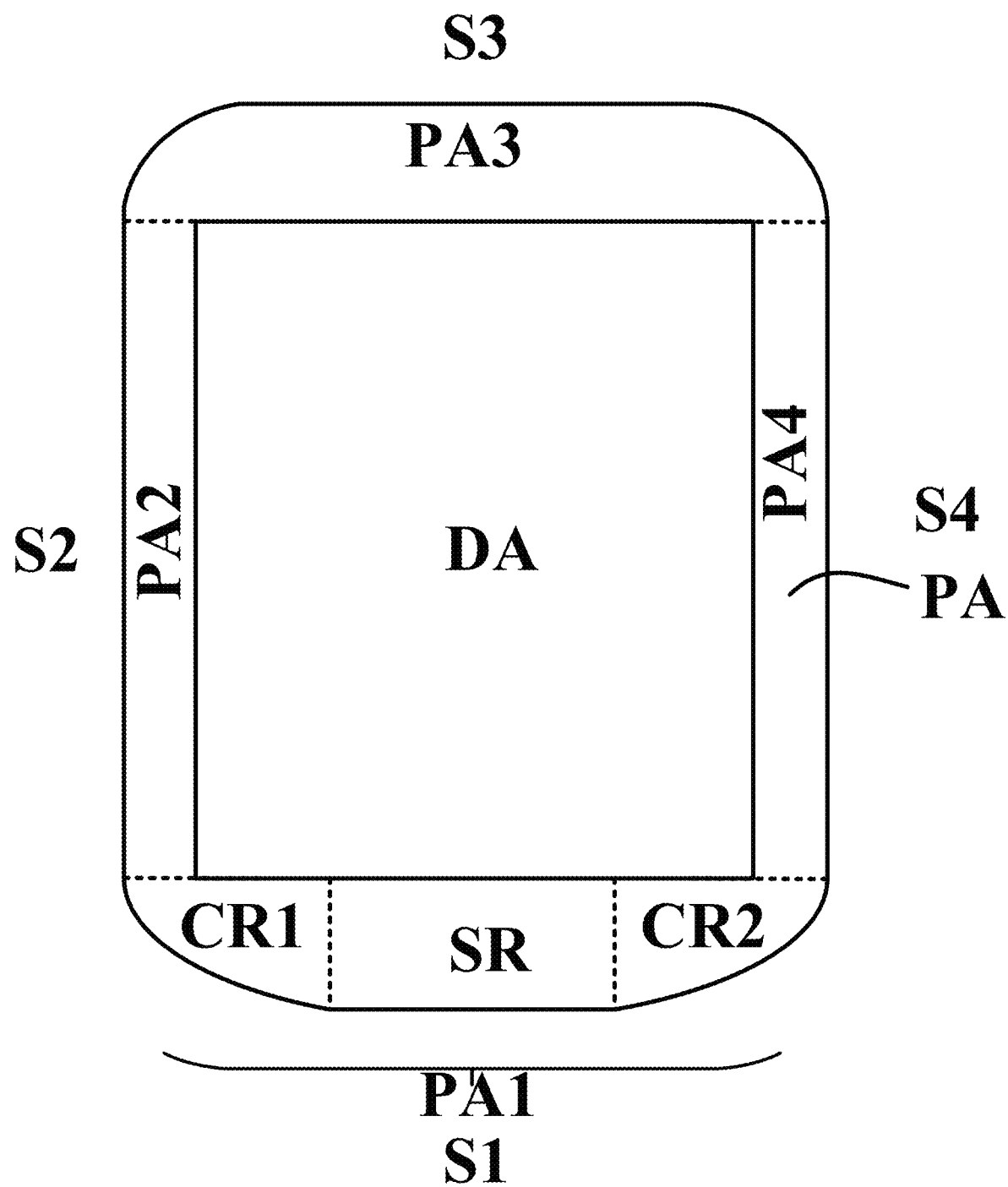
FIG. 7 is a schematic diagram illustrating a display area and a peripheral area in an array substrate in some embodiments according to the present disclosure.

FIG. 7 is a schematic diagram illustrating a display area and a peripheral area in an array substrate in some embodiments according to the present disclosure. Referring to FIG. 7, in some embodiments, the array substrate includes a display area DA and a peripheral area PA. In some embodiments, the peripheral area PA includes a first sub-area PA1 on a first side S1 of the display area DA, a second sub-area PA2 on a second side S2 of the display area DA, a third sub-area PA3 on a third side S3 of the display area DA, and a fourth sub-area PA4 on a fourth side S4 of the display area DA. Optionally, the first side S1 and the third side S3 are opposite to each other. Optionally, the second side S2 and the fourth side S4 are opposite to each other. Optionally, the first sub-area PA1 is a sub-area where signal lines of the array substrate are connected to an integrated circuit.

As used herein, the term "display area" refers to an area of an array substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding to a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area of an array substrate in a display panel where various circuits and wires are provided to transmit signals to the display substrate. To increase the transparency of a display apparatus having the array substrate, non-transparent or opaque components of the display apparatus (e.g., battery, printed circuit board, metal frame), can be disposed in the peripheral area rather than in the display areas.

In some embodiments, the first sub-area PA1 includes a side region SR and one or more corner regions (e.g., a first corner region CR1 and a second corner region CR2). The one or more corner regions are respectively at a corner of the display panel. The one or more corner regions respectively connect the side region SR to one or more adjacent sub-areas of the peripheral area PA. For example, the first corner region CR1 connects the side region SR to the second sub-area PA2, and the second corner region CR2 connects the side region SR to the fourth sub-area PA4.

Figure 8:
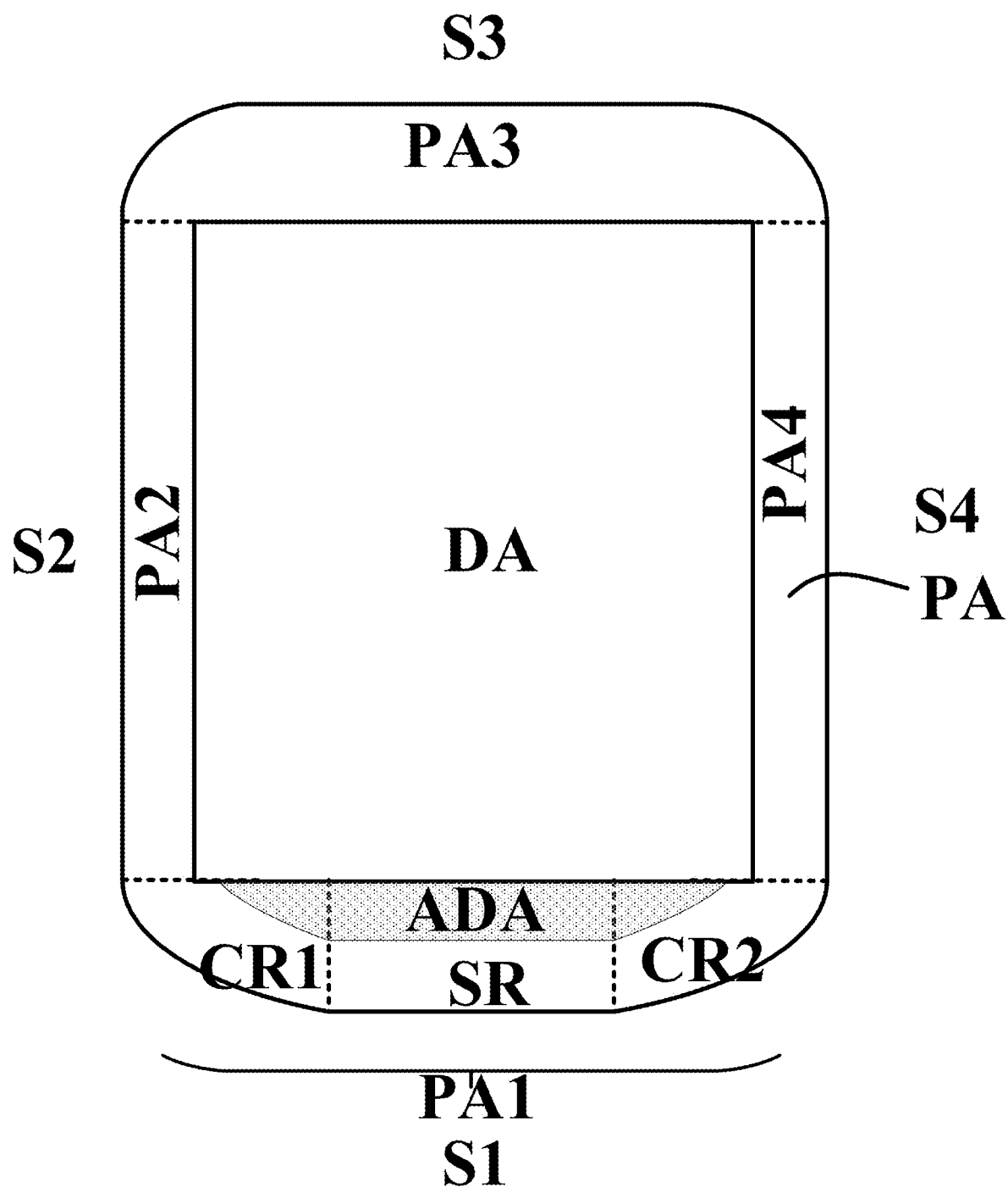
FIG. 8 is a schematic diagram illustrating a display area and a peripheral area in an array substrate in some embodiments according to the present disclosure.

FIG. 8 is a schematic diagram illustrating a display area and a peripheral area in an array substrate in some embodiments according to the present disclosure. Referring to FIG. 8, in some embodiments, the array substrate has an additional display area ADA in addition to the display area DA. Comparing FIG. 8 with FIG. 7, in some embodiments, the additional display area ADA extends away from the display area DA into the side region SR in FIG. 7, resulting in a reduced side region.

Figure 9:
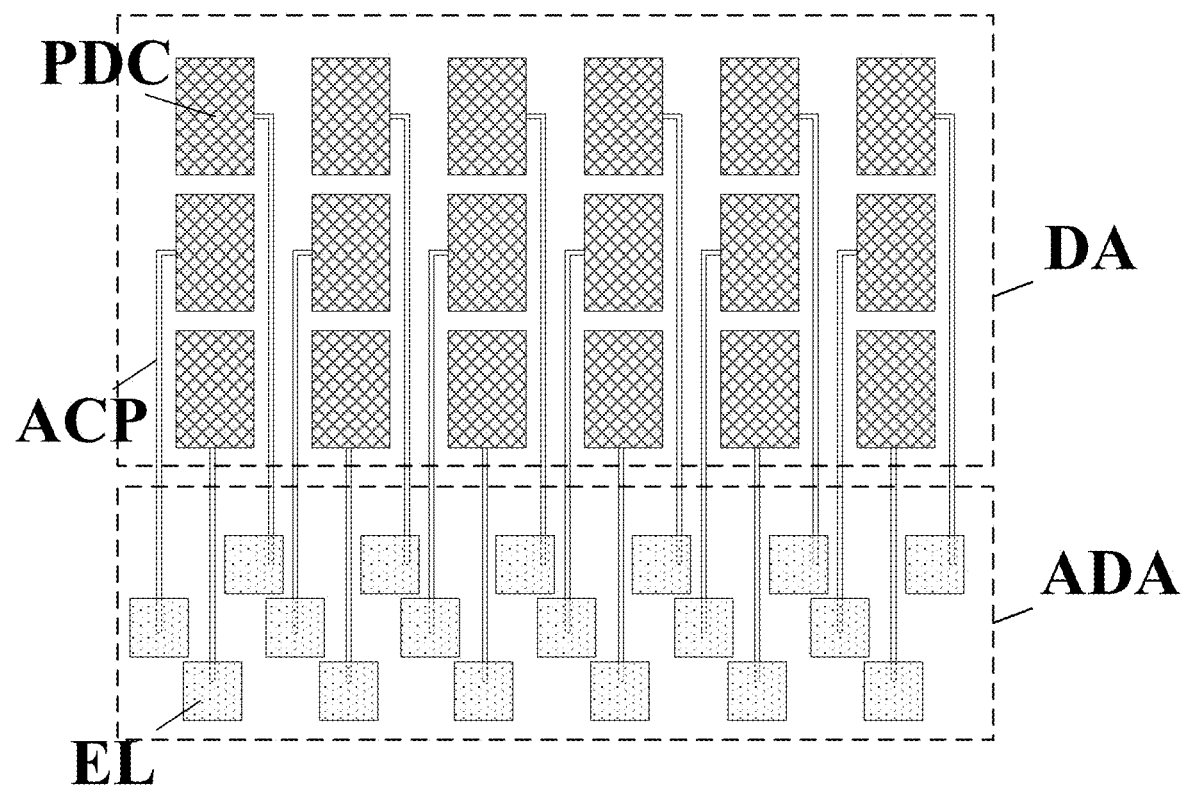
FIG. 9 illustrates an arrangement of pixel driving circuits and light emitting layers in a region around a border between a display area and an additional display area in some embodiments according to the present disclosure.

In some embodiments, pixel driving circuits are disposed in the display area DA. Light emitting layers corresponding to a number of pixel driving circuits along the border between the display area DA and the additional display area ADA, however, are disposed in the additional display area ADA. Because these driving circuits are disposed in the display area DA while the corresponding light emitting layers are disposed in the additional display area ADA, the plurality of anode connecting pads (e.g., ACP depicted in FIG. 3L) connecting these driving circuits and the corresponding light emitting layers extend from the display area DA into the additional display area ADA. FIG. 9 illustrates an arrangement of pixel driving circuits and light emitting layers in a region around a border between a display area and an additional display area in some embodiments according to the present disclosure. Referring to FIG. 9, the plurality of anode connecting pads ACP connecting a respective pixel driving circuit PDC and a respective light emitting layer EL extends from the display area DA into the additional display area ADA. The additional display area ADA is absent of pixel driving circuits, and includes other components such as power supply lines.

Figure 10:
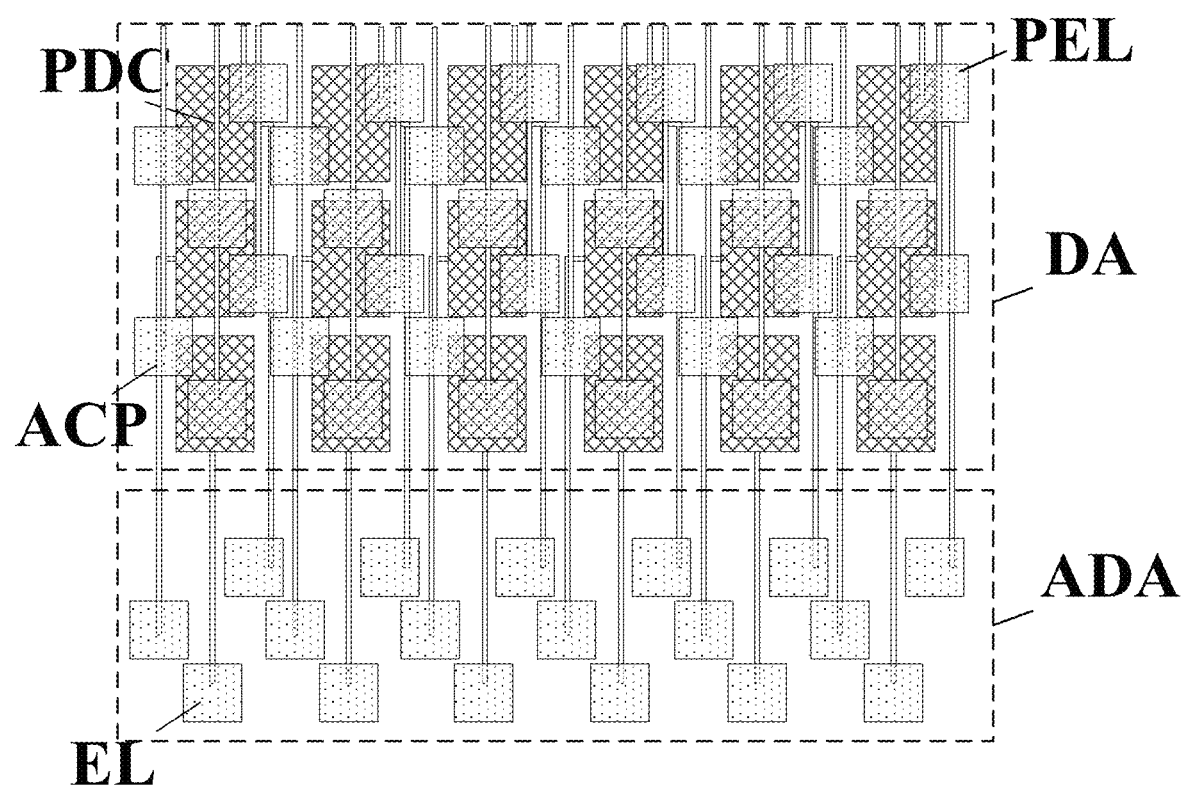
FIG. 10 shows an image of several layers in a region around a border between a display area and an additional display area in some embodiments according to the present disclosure.

FIG. 10 illustrates an arrangement of pixel driving circuits and light emitting layers in a region around a border between a display area and an additional display area in some embodiments according to the present disclosure. Referring to FIG. 10, because the light emitting layers corresponding to the pixel driving circuits in the display area DA are disposed in the additional display area ADA, the region may provide space for receiving light emitting layers (denoted as PEL in FIG. 10) from previous rows of pixel driving circuit.

Figure 11A:
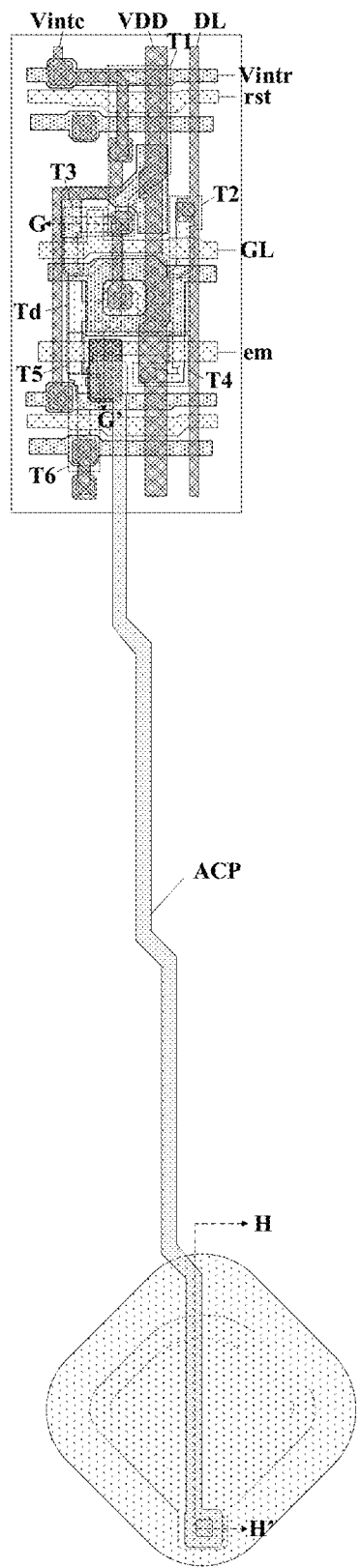
FIG. 11A illustrates the structure of a respective pixel driving circuit and a respective light emitting element in some embodiments according to the present disclosure.
Figure 11B:
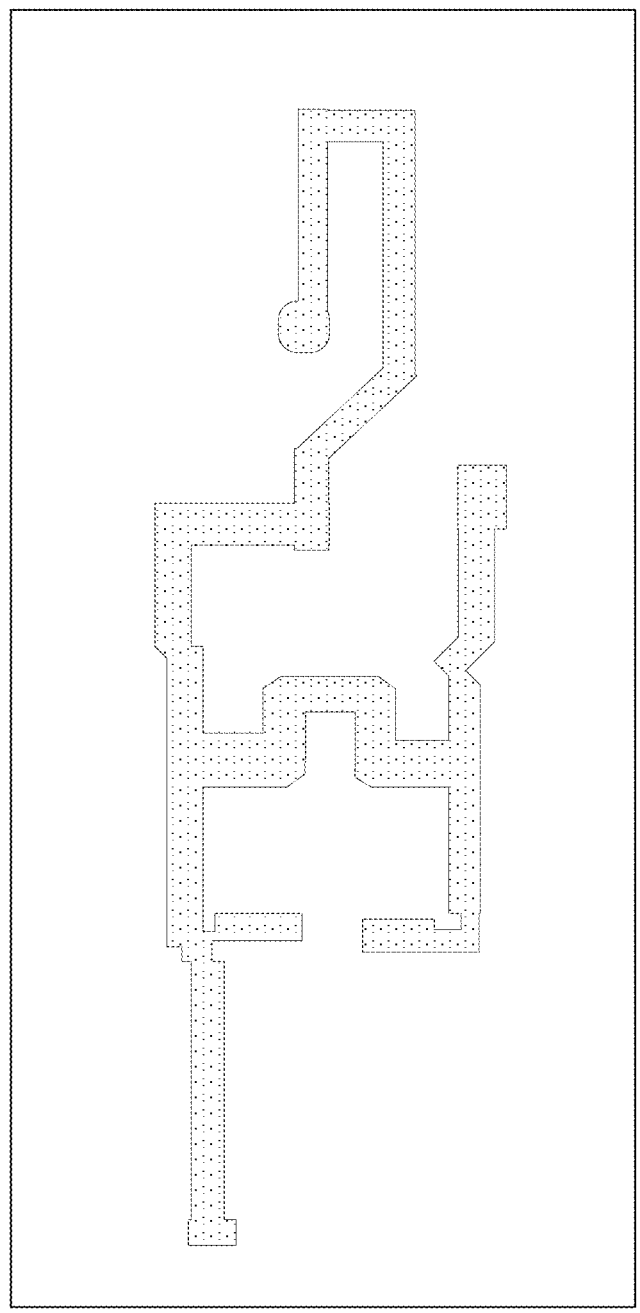
FIG. 11B illustrates the structure of a semiconductor material layer in an array substrate depicted in FIG. 11A.
Figure 11C:
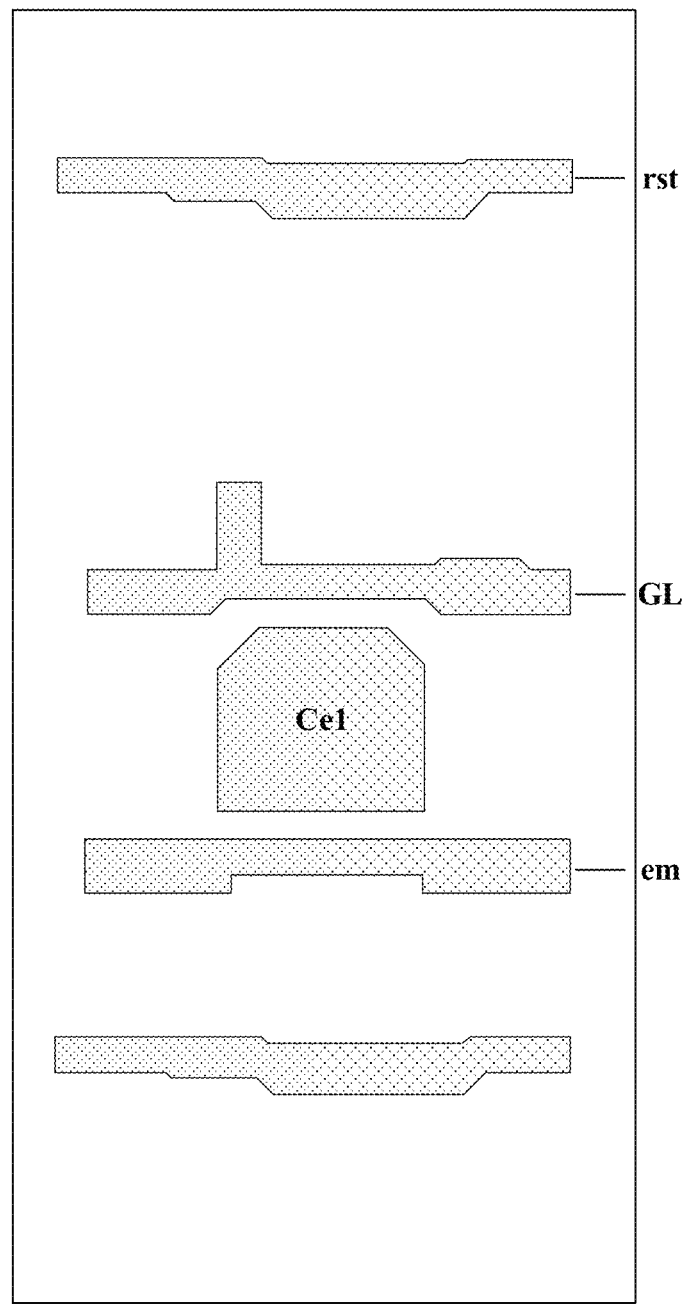
FIG. 11C illustrates the structure of a first conductive layer in an array substrate depicted in FIG. 11A.
Figure 11D:
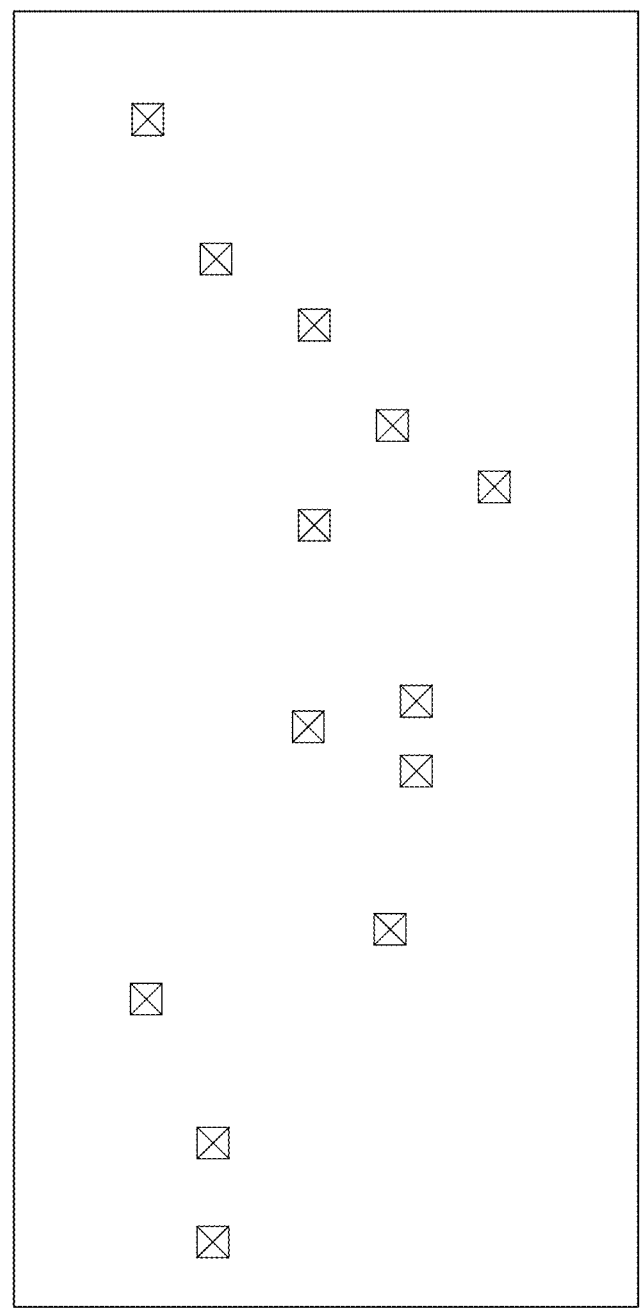
FIG. 11D illustrates the structure of an insulating layer in an array substrate depicted in FIG. 11A.
Figure 11E:
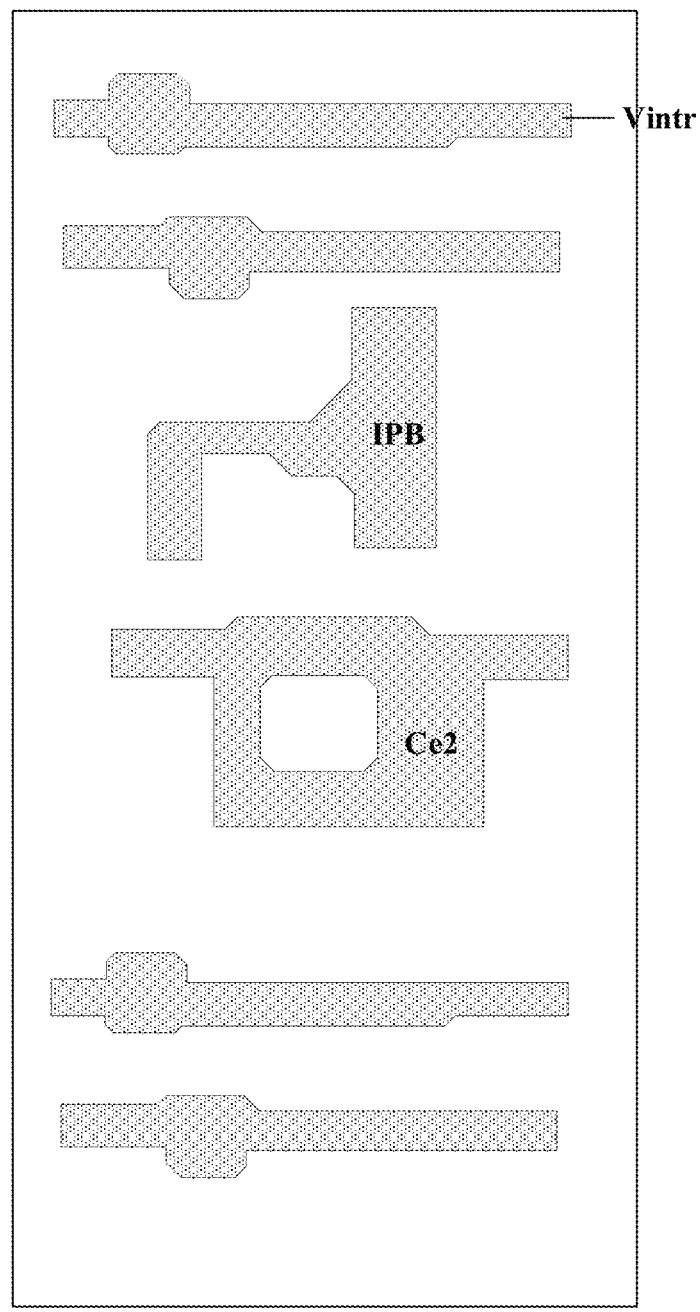
FIG. 11E illustrates the structure of a second conductive layer in an array substrate depicted in FIG. 11A.
Figure 11F:
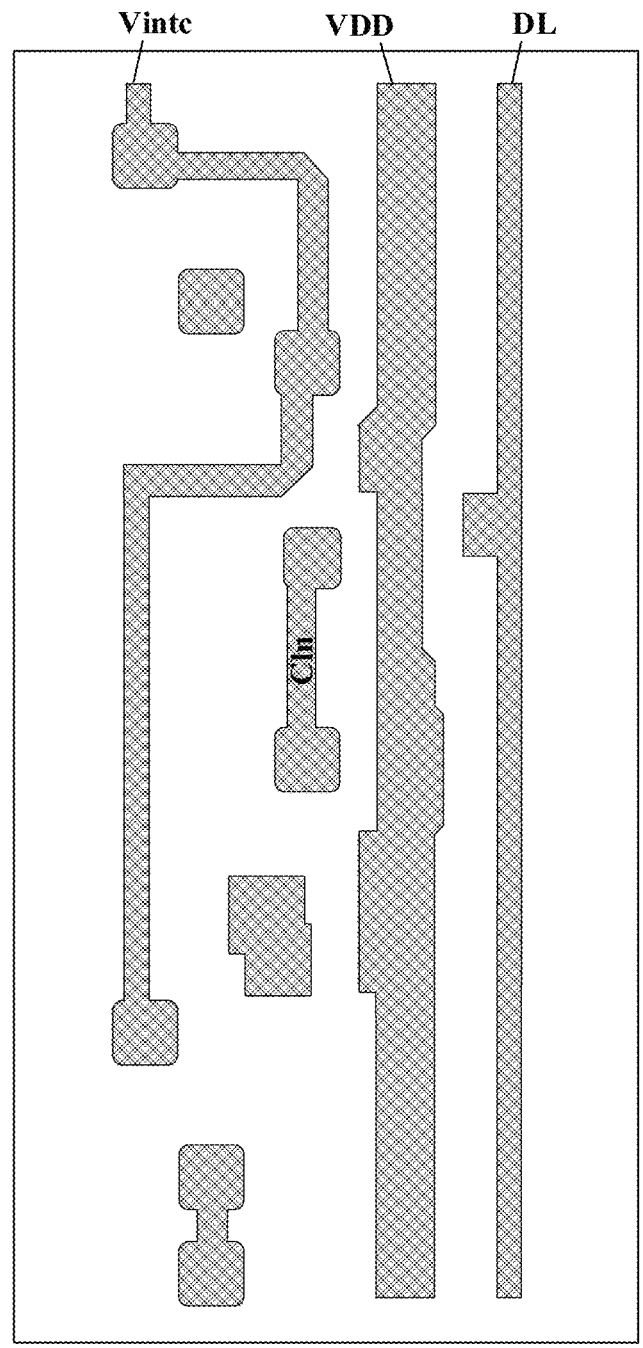
FIG. 11F illustrates the structure of a first signal line layer in an array substrate depicted in FIG. 11A.
Figure 11G:
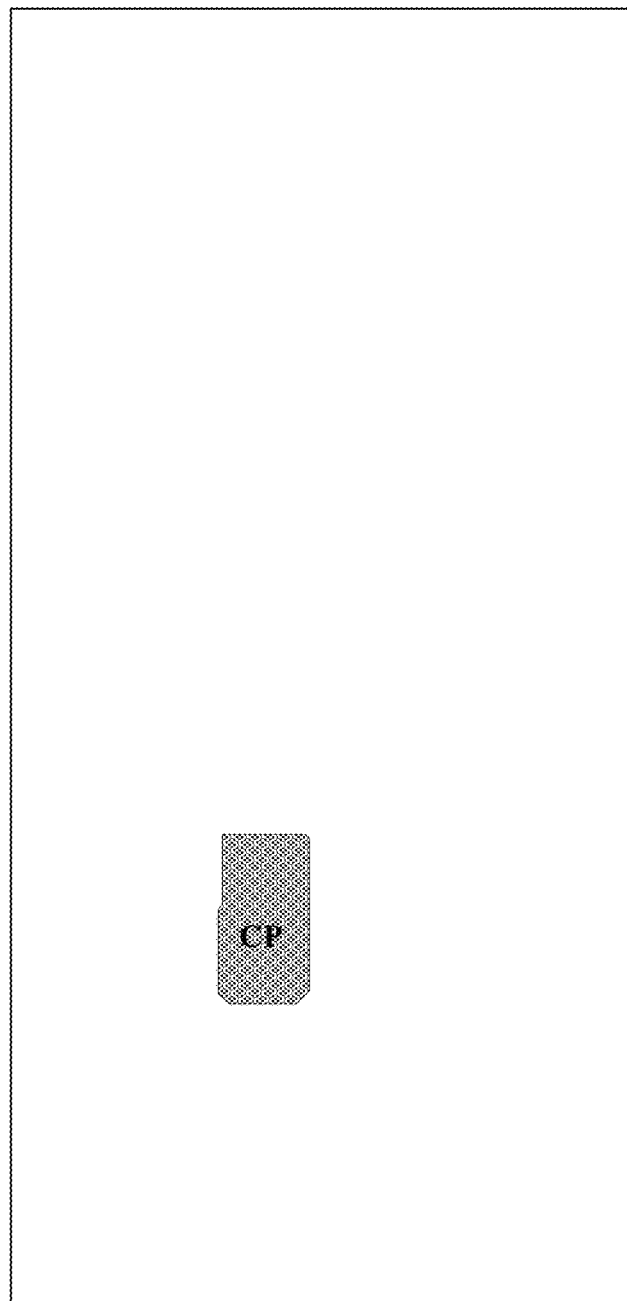
FIG. 11G illustrates the structure of a second signal line layer in an array substrate depicted in FIG. 11A.
Figure 11H:
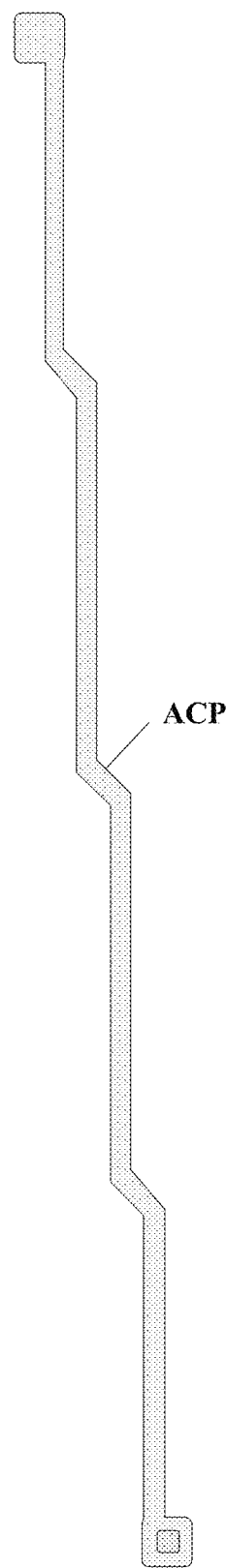
FIG. 11H illustrates the structure of a third signal line layer in an array substrate depicted in FIG. 11A.
Figure 11I:
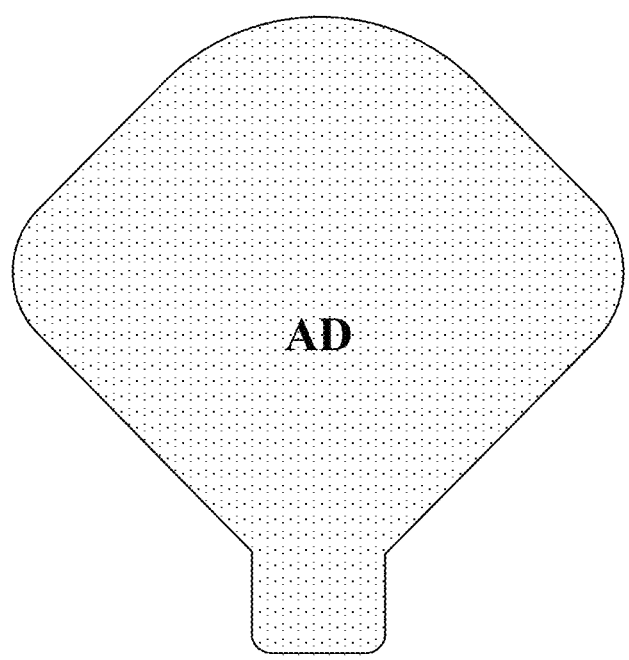
FIG. 11I illustrates the structure of an anode layer in an array substrate depicted in FIG. 11A.
Figure 11J:
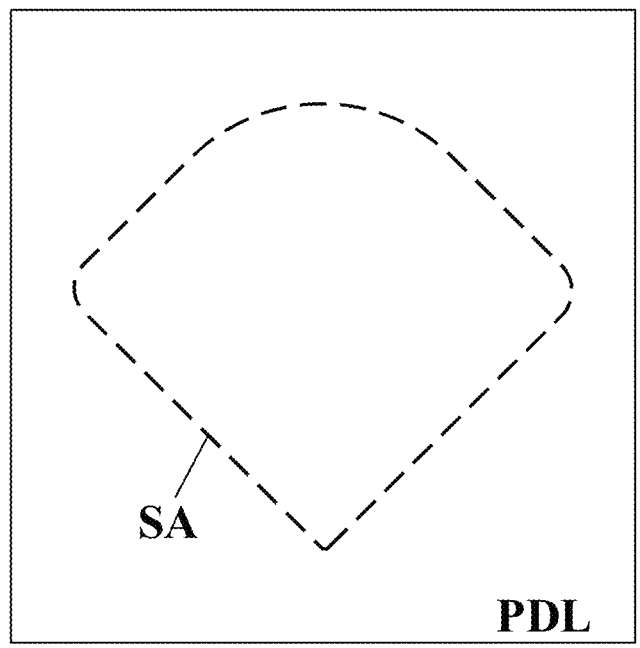
FIG. 11J illustrates the structure of a pixel definition layer in an array substrate depicted in FIG. 11A.
Figure 11K:
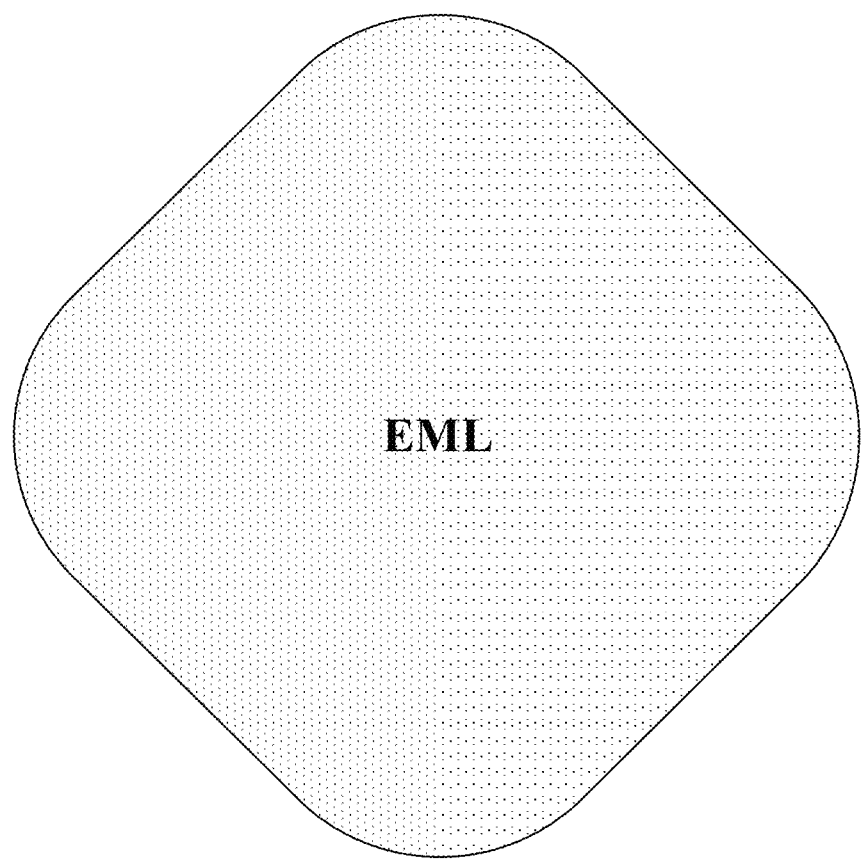
FIG. 11K illustrates the structure of a light emitting layer in an array substrate depicted in FIG. 11A.
Figure 12A:
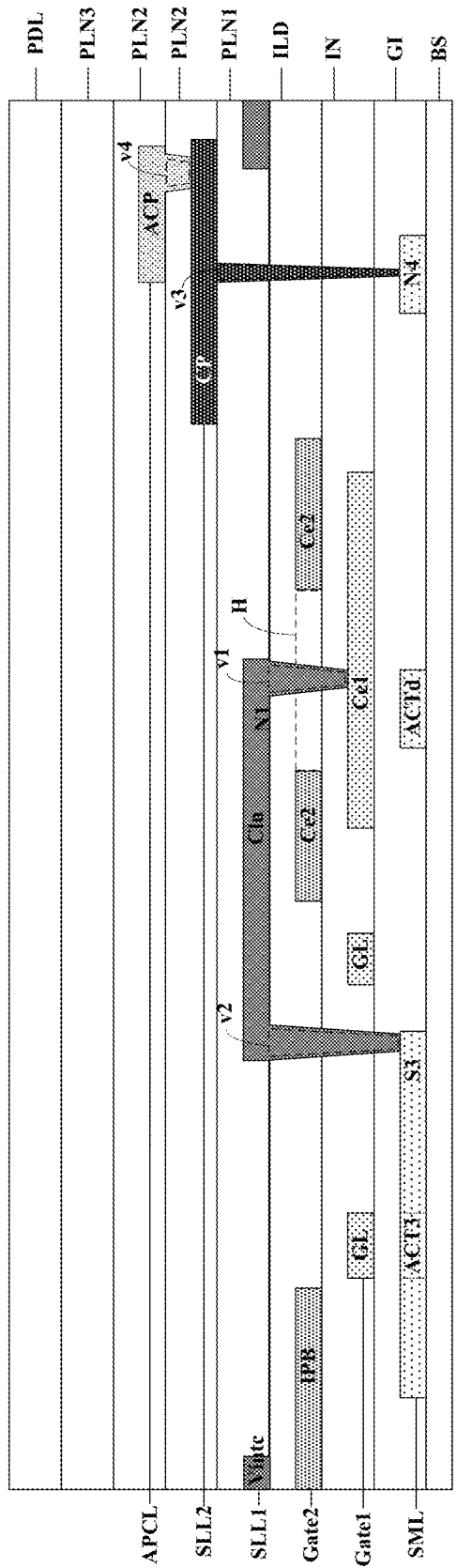
FIG. 12A is a cross-sectional view along a G-G' line in FIG. 11A.
Figure 12B:
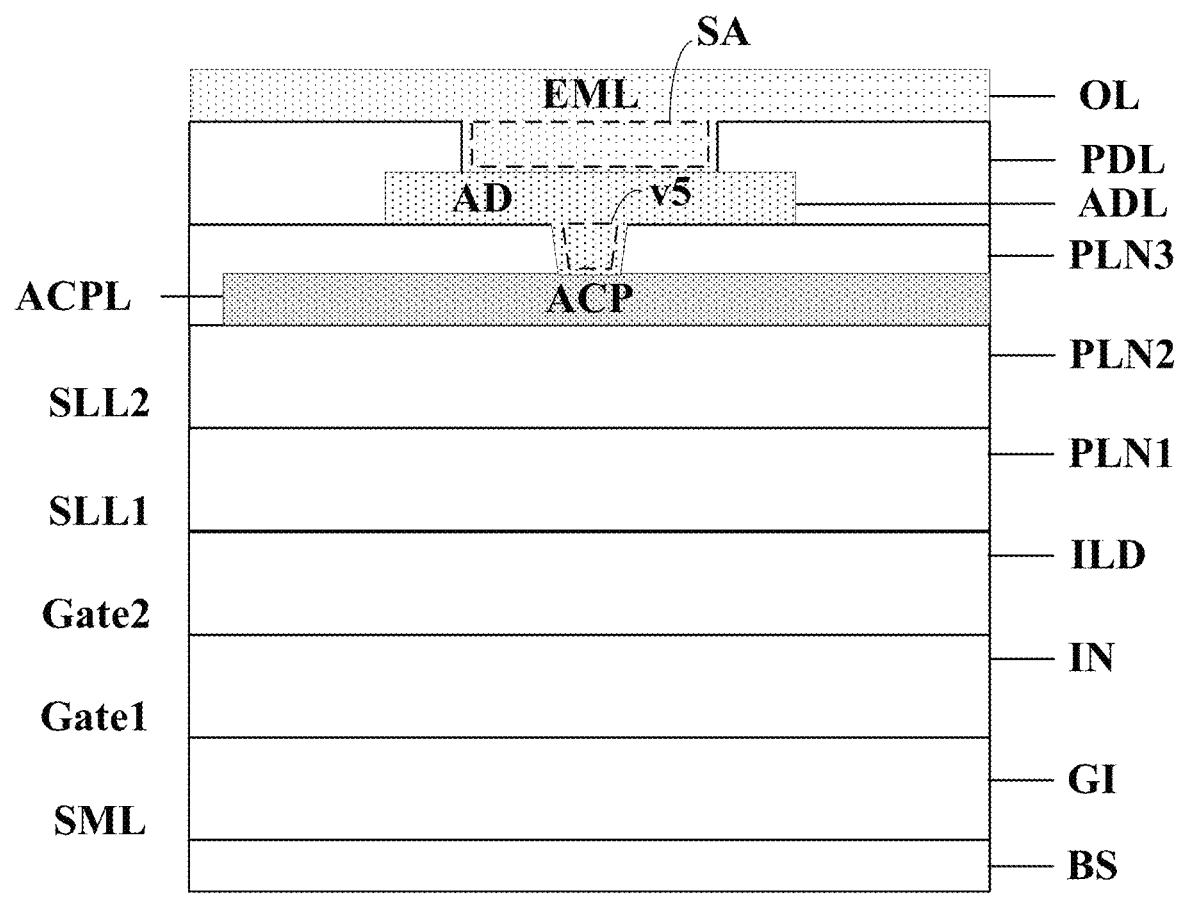
FIG. 12B is a cross-sectional view along an H-H' line in FIG. 11A.

FIG. 11A illustrates the structure of a respective pixel driving circuit and a respective light emitting element in some embodiments according to the present disclosure. FIG. 11B illustrates the structure of a semiconductor material layer in an array substrate depicted in FIG. 11A. FIG. 11C illustrates the structure of a first conductive layer in an array substrate depicted in FIG. 11A. FIG. 11D illustrates the structure of an insulating layer in an array substrate depicted in FIG. 11A. FIG. 11E illustrates the structure of a second conductive layer in an array substrate depicted in FIG. 11A. FIG. 11F illustrates the structure of a first signal line layer in an array substrate depicted in FIG. 11A. FIG. 11G illustrates the structure of a second signal line layer in an array substrate depicted in FIG. 11A. FIG. 11H illustrates the structure of a third signal line layer in an array substrate depicted in FIG. 11A. FIG. 11I illustrates the structure of an anode layer in an array substrate depicted in FIG. 11A. FIG. 11J illustrates the structure of a pixel definition layer in an array substrate depicted in FIG. 11A. FIG. 11K illustrates the structure of a light emitting layer in an array substrate depicted in FIG. 11A. FIG. 12A is a cross-sectional view along a G-G' line in FIG. 11A. FIG. 12B is a cross-sectional view along an H-H' line in FIG. 11A.

Referring to FIG. 11A to FIG. 11K, FIG. 12A, and FIG. 12B, in some embodiments, the array substrate includes a base substrate BS, a semiconductor material layer SML on the base substrate BS, a gate insulating layer GI on a side of the semiconductor material layer SML away from the base substrate BS, a first conductive layer Gate1 on a side of the gate insulating layer GI away from the semiconductor material layer SML, an insulating layer IN on a side of the first conductive layer away from the gate insulating layer GI, a second conductive layer Gate2 on a side of the insulating layer IN away from the first conductive layer Gate1, an inter-layer dielectric layer ILD on a side of the second conductive layer Gate2 away from the insulating layer IN, a first signal line layer SLL1 on a side of the inter-layer dielectric layer ILD away from the second conductive layer Gate2, a first planarization layer PLN1 on a side of the first signal line layer SLL1 away from the inter-layer dielectric layer ILD, a second signal line layer SLL2 on a side of the first planarization layer PLN1 away from the first signal line layer SLL1, a second planarization layer PLN2 on a side of the second signal line layer SLL2 away from the first planarization layer PLN1, an anode connecting pad layer ACPL on a side of the second planarization layer PLN2 away from the second signal line layer SLL2, a third planarization layer PLN3 on a side of the anode connecting pad layer ACPL away from the second planarization layer PLN2, an anode layer ADL on a side of the third planarization layer PLN3 away from the anode connecting pad layer ACPL, a pixel definition layer PDL on a side of the anode layer ADL away from the third planarization layer PLN3, and a light emitting layer EML on a side of the pixel definition layer PDL away from the anode layer ADL.

Referring to FIG. 11A to FIG. 11K, the semiconductor material layer SML in some embodiments includes active layers of the transistors, including active layers of the first transistor T1, the second transistor T2, the third transistor T3, the fourth transistor T4, the fifth transistor T5, the sixth transistor T6, and the driving transistor Td. Various appropriate semiconductor materials may be used for making the semiconductor material layer SML. Examples of appropriate semiconductor materials for making the semiconductor material layer SML include polycrystalline silicon, amorphous silicon, and metal oxides.

The first conductive layer Gate1 in some embodiments includes a plurality of gate lines GL, a plurality of reset control signal lines rst, a plurality of light emitting control signal lines em, and a first capacitor electrode Ce1 of the storage capacitor Cst.

Vias extending through an insulating layer IN are depicted in FIG. 11D.

The second conductive layer Gate2 in some embodiments includes an interference preventing block IPB, a second capacitor electrode Ce2 of the storage capacitor Cst, and a plurality of first reset signal lines Vintr. The interference preventing block IPB can effectively reduce crosstalk, particularly vertical crosstalk between the N1 node and the adjacent data lines.

The first signal line layer SLL1 in some embodiments includes a plurality of voltage supply lines Vdd, a node connecting line Cln, a plurality of second reset signal lines Vintc, and a plurality of data lines DL. The node connecting line Cln connects the first capacitor electrode Ce1 and the drain electrode of the third transistor T3 in a respective pixel driving circuit together. The array substrate further includes a first via v1 in the hole region H and extending through the inter-layer dielectric layer ILD and the insulating layer IN. Optionally, the node connecting line Cln is connected to the first capacitor electrode Ce1 through the first via v1. In some embodiments, the first capacitor electrode Ce1 is on a side of the gate insulating layer GI away from the base substrate BS. Optionally, the array substrate further includes a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the node connecting line Cln is connected to the first capacitor electrode Ce1 through the first via v1, and is connected to the semiconductor material layer SML through the second via v2. Optionally, the node connecting line Cln is connected to the drain electrode D3 of third transistor, as depicted in FIG. 12A.

The second signal line layer SLL2 in some embodiments includes a connecting pad CP, through which the N4 node is electrically connected to an anode of the respective light emitting element. Optionally, the array substrate further includes a third via v3 extending through the first planarization layer PLN1, the inter-layer dielectric layer ILD, the insulating layer IN, and the gate insulating layer GI. The connecting pad CP is connected to the N4 node through the third via v3.

The anode connecting pad layer ACPL in some embodiments includes a plurality of anode connecting pads ACP. A respective anode connecting pad of the plurality of anode connecting pads ACP electrically connects the connecting pad CP to an anode of the respective light emitting element. Optionally, the array substrate further includes a fourth via v4 extending through the second planarization layer PLN2. A respective anode connecting pad of the plurality of anode connecting pads ACP is connected to the connecting pad CP through the fourth via v4. Various appropriate conductive materials may be used for making the plurality of anode connecting pads ACP. Examples of appropriate conductive materials for making the plurality of anode connecting pads ACP include conductive metal oxides such as indium tin oxide.

The anode layer includes a plurality of anodes AD of a plurality of light emitting elements. A respective anode of the plurality of anodes AD is connected to a respective connecting line. Optionally, the array substrate further includes a fifth via v5 extending through the third planarization layer PLN3. The respective anode is connected to the respective connecting line through the fifth via v5.

The pixel definition layer PDL defines a plurality of subpixel apertures SA.

The organic layer OL in some embodiments includes a plurality of light emitting layer EML of a plurality of light emitting elements. A respective light emitting layer of the plurality of light emitting layer EML is electrically connected to a respective anode of the plurality of anodes AD.

The plurality of anode connecting pads ACP may be disposed in various appropriate layers. In some embodiments, the plurality of anode connecting pads ACP are all in a same layer. In some embodiments, the plurality of anode connecting pads ACP may be disposed in multiple layers. In one example, two adjacent anode connecting pads extending substantially along the column direction may be disposed in two different layers, respectively.

In one example, the plurality of anode connecting pads ACP are in an anode connecting pad layer ACPL; the second planarization layer PLN2 is on a side of the anode connecting pad layer ACPL closer to a base substrate BS; the third planarization layer PLN3 is on a side of the anode connecting pad layer ACPL away from the base substrate BS; the anode layer ADL is on a side of the third planarization layer PLN3 away from the anode connecting pad layer ACPL; and the plurality of pixel driving circuits PDC are on a side of the second planarization layer PLN2 away from the anode connecting pad layer ACPL.

Figure 13A:
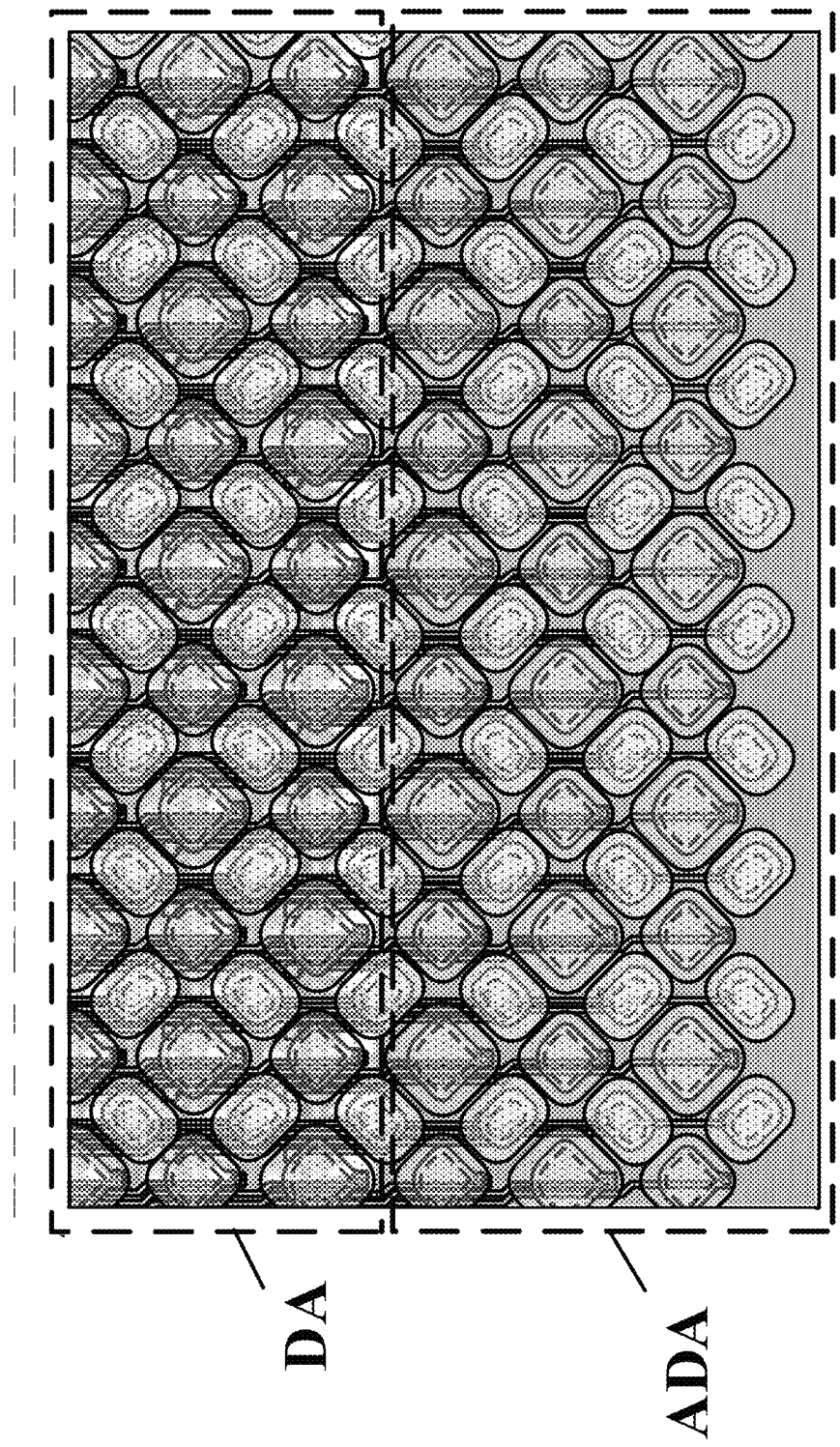
FIG. 13A illustrates the structure of an array substrate in a second region in some embodiments according to the present disclosure.
Figure 13B:
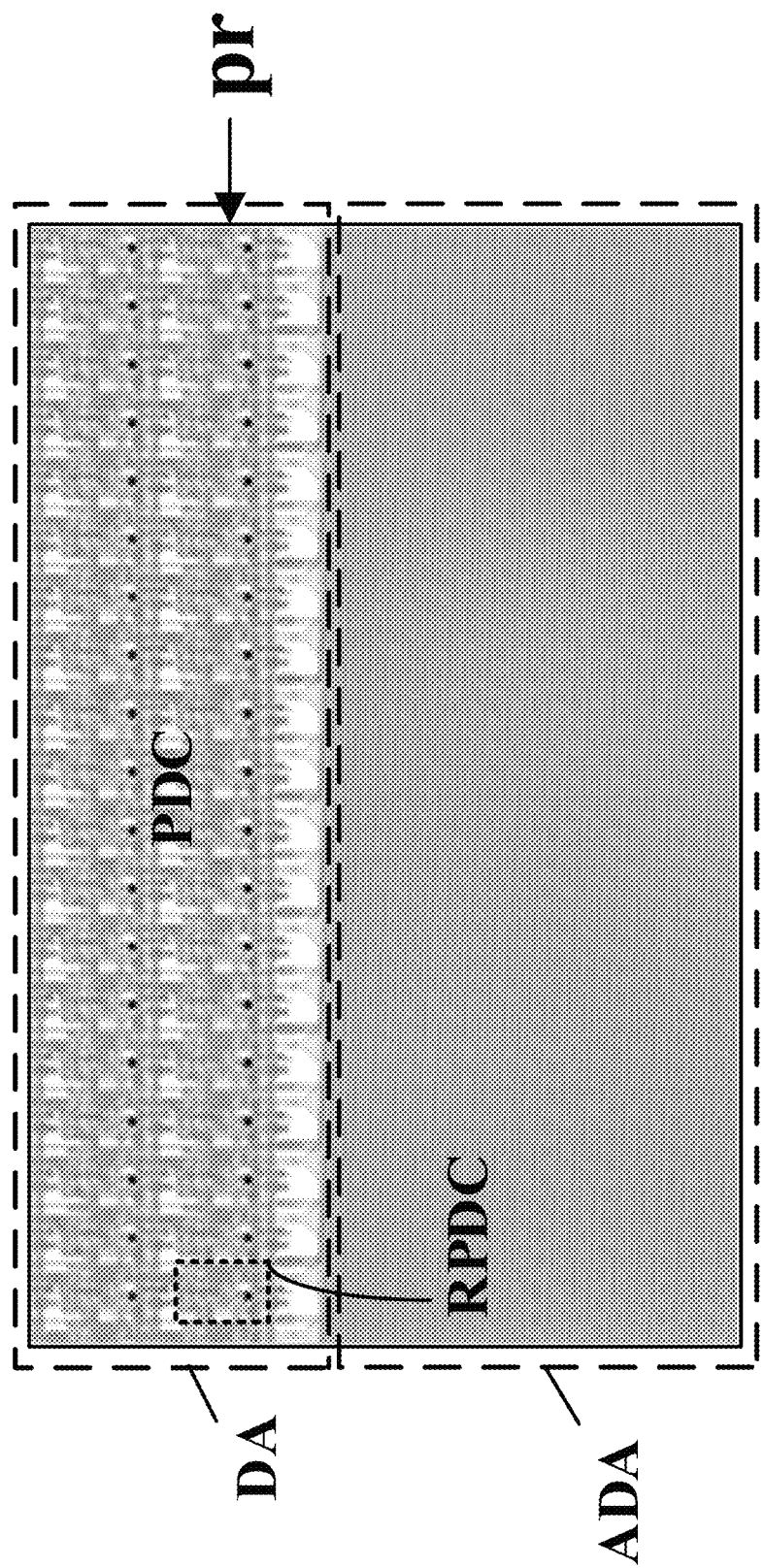
FIG. 13B illustrates the structure of pixel driving circuits in FIG. 13A.
Figure 13C:
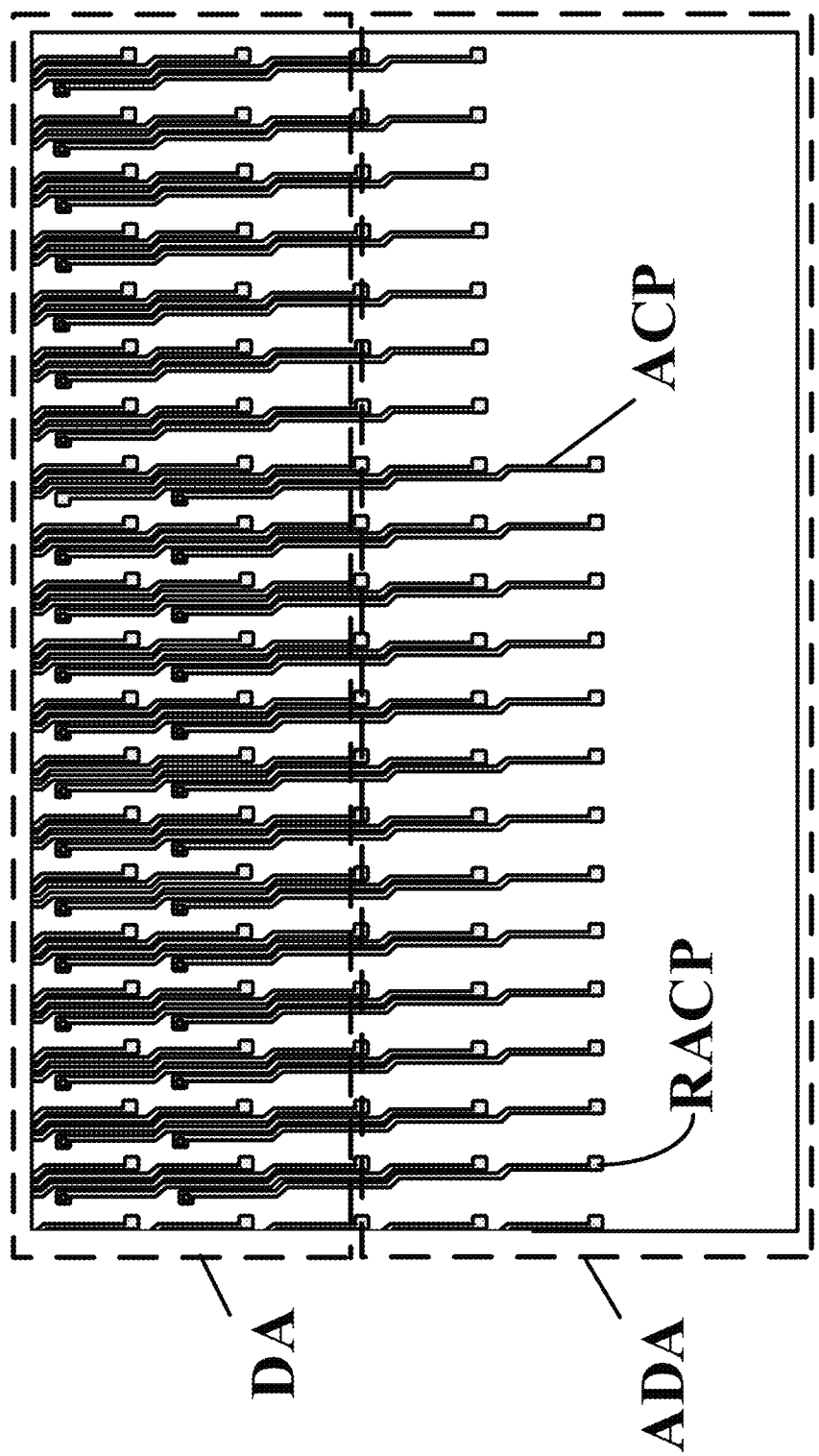
FIG. 13C illustrates the structure of connecting lines in FIG. 13A.
Figure 13D:
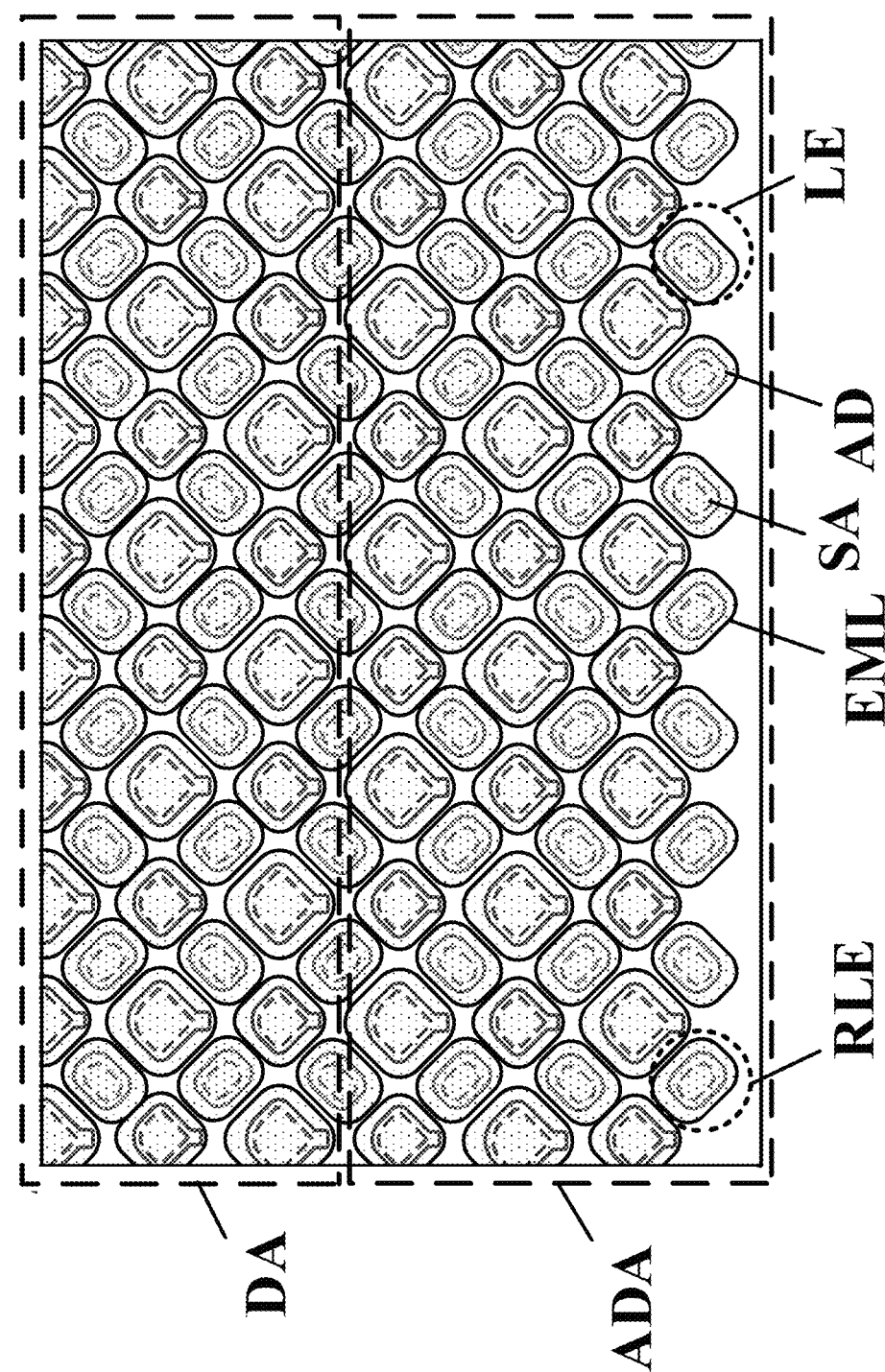
FIG. 13D illustrates the structure of light emitting elements in FIG. 13A.

FIG. 13A illustrates the structure of an array substrate in a second region in some embodiments according to the present disclosure. FIG. 13B illustrates the structure of pixel driving circuits in FIG. 13A. FIG. 13C illustrates the structure of connecting lines in FIG. 13A. FIG. 13D illustrates the structure of light emitting elements in FIG. 13A. Referring to FIG. 13A to FIG. 13D, in the additional display area ADA, multiple light emitting elements of a plurality of light emitting elements LE are present, and transistors and capacitors of the plurality of pixel driving circuits PDC are absent.

Optionally, in the additional display area ADA, at least one row of light emitting elements are present, and transistors and capacitors of the plurality of pixel driving circuits PDC are absent. Optionally, in the display area DA, multiple rows of light emitting elements and transistors and capacitors of multiple rows of pixel driving circuits are present.

In some embodiments, the plurality of anode connecting pads ACP connect the plurality of pixel driving circuits PDC with a plurality of corresponding light emitting elements, respectively. A respective anode connecting pad RACP connects a respective pixel driving circuit RPDC with a respective light emitting element RLE.

Figure 14:
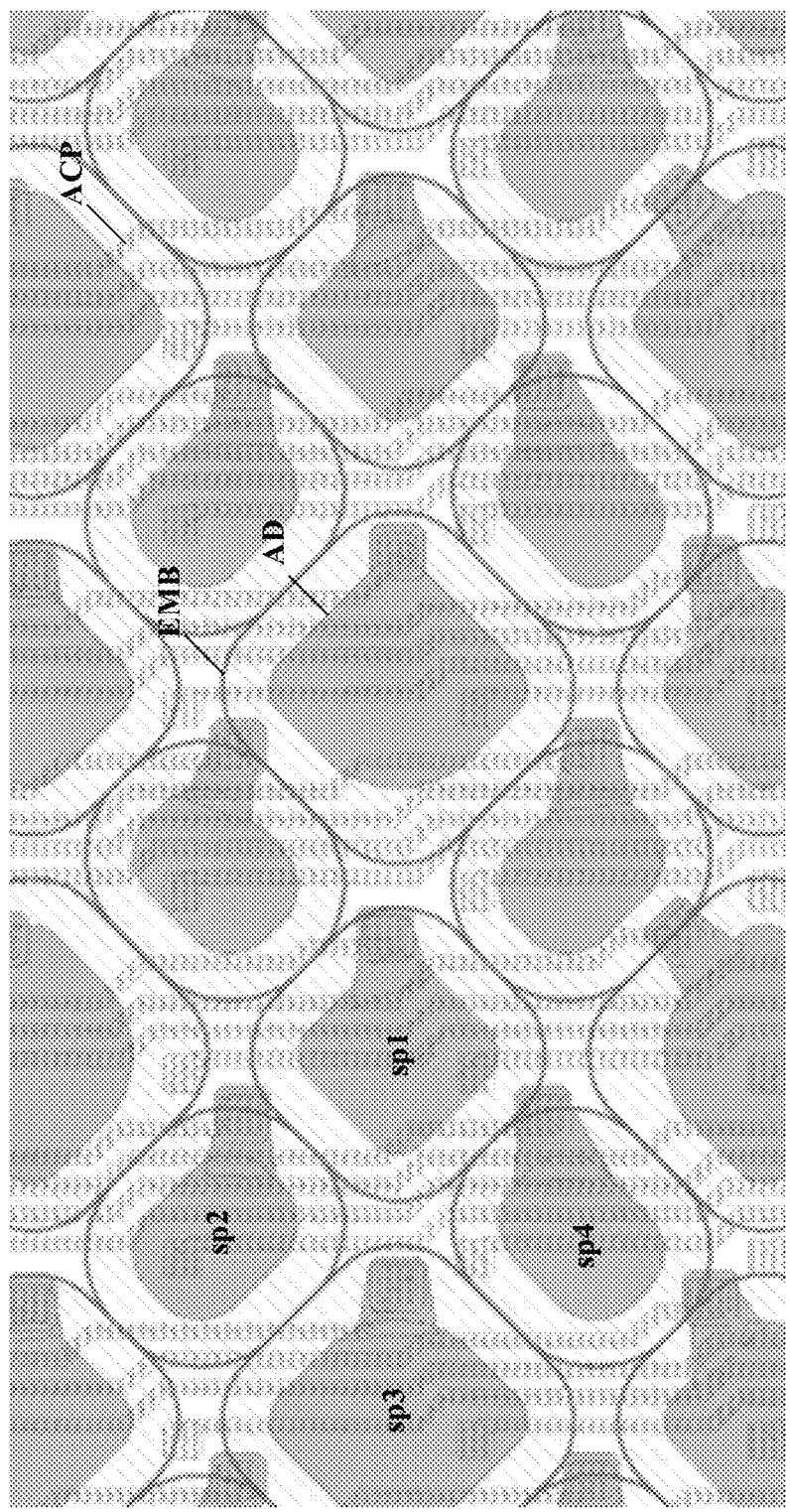
FIG. 14 illustrates the structure of an anode connecting pad layer, an anode layer, and a light emitting layer in some embodiments according to the present disclosure.

FIG. 14 illustrates the structure of an anode connecting pad layer, an anode layer, and a light emitting layer in some embodiments according to the present disclosure. Referring to FIG. 14, in some embodiments, the anode connecting pad layer includes a plurality of anode connecting pads ACP, the anode layer includes a plurality of anodes AD, and the light emitting layer includes a plurality of light emitting blocks EMB. FIG. 14 depicts the layout of a plurality of anode connecting pads ACP, a plurality of anodes AD, and a plurality of light emitting blocks EMB in an additional display area. In some embodiments, the plurality of subpixels includes a respective first subpixel sp1, a respective second subpixel sp2, a respective third subpixel sp3, and a respective fourth subpixel sp4. Optionally, a respective pixel of the array substrate includes the respective first subpixel sp1, the respective second subpixel sp2, the respective third subpixel sp3, and the respective fourth subpixel sp4. In one example, the respective first subpixel sp1 is a red subpixel, the respective second subpixel sp2 is a green subpixel, the respective third subpixel sp3 is a blue subpixel, and the respective fourth subpixel sp4 is a green subpixel.

In some embodiments, an orthographic projection of the plurality of anode connecting pads ACP on a base substrate partially overlaps with an orthographic projection of the respective first subpixel sp1 on the base substrate, resulting in a first overlapping area; an orthographic projection of the plurality of anode connecting pads ACP on a base substrate partially overlaps with an orthographic projection of the respective second subpixel sp2 on the base substrate, resulting in a second overlapping area; an orthographic projection of the plurality of anode connecting pads ACP on a base substrate partially overlaps with an orthographic projection of the respective third subpixel sp3 on the base substrate, resulting in a third overlapping area; or an orthographic projection of the plurality of anode connecting pads ACP on a base substrate partially overlaps with an orthographic projection of the respective fourth subpixel sp4 on the base substrate, resulting in a fourth overlapping area. Optionally, the first overlapping area is greater than the second overlapping area, e.g., by at least 1%, by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%.

Optionally, the first overlapping area is greater than the fourth overlapping area, e.g., by at least 1%, by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%.

Optionally, the third overlapping area is greater than the second overlapping area, e.g., by at least 1%, by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%.

Optionally, the third overlapping area is greater than the fourth overlapping area, e.g., by at least 1%, by at least 2.5%, by at least 5%, by at least 7.5%, by at least 10%, by at least 12.5%, by at least 15%, by at least 17.5%, by at least 20%, by at least 22.5%, by at least 25%, by at least 27.5%, by at least 30%, by at least 32.5%, by at least 35%, by at least 37.5%, or by at least 40%.

In one example, the respective first subpixel sp1 is a red subpixel, the respective second subpixel sp2 is a green subpixel, the respective third subpixel sp3 is a blue subpixel, and the respective fourth subpixel sp4 is a green subpixel. In related array substrates, typically it takes a longer time for green subpixels to light up as compared to red subpixels and blue subpixels, particularly when displaying images of lower grayscales, resulting in red trailing defects in the related array substrates. In at least the additional display area of the present array substrate, the parasitic capacitance for the pixel driving circuits in the red subpixel and the blue subpixel is greater than the parasitic capacitance for the pixel driving circuits in the green subpixel. Accordingly, the higher parasitic capacitance decreases the light-up speed in the red subpixels and blue subpixels, as compared to the green subpixels. The inventors of the present disclosure, surprisingly and unexpectedly, discover that the intricate structure of the present array substrate achieves a similar light-up speed in green subpixels, red subpixels, and blue subpixels, obviating the issue of red trailing defects in the related array substrates.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In another aspect, the present invention provides a method of fabricating an array substrate. In some embodiments, the method includes forming K number of columns of first pads. Optionally, a respective first pad is formed to be connected to an anode of a light emitting element, a second electrode of a fifth transistor, and a second electrode of a sixth transistor. Optionally, forming the K number of columns of first pads includes forming a plurality of first-first pads in (2k-1)-th columns of the K columns and a plurality of second-first pads in (2k)-th columns of the K columns. Optionally, a respective first-first pad and a respective second-first pad are formed to have different average line widths.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising K number of columns of first pads;
   wherein a respective first pad is connected to an anode of a light emitting element, a second electrode of a fifth transistor, and a second electrode of a sixth transistor;
   the K number of columns of first pads comprise a plurality of first-first pads in (2k-1)-th columns of the K columns and a plurality of second-first pads in (2k)-th columns of the K columns; and
   a respective first-first pad and a respective second-first pad have different average line widths;
   wherein the array substrate further comprises multiple first-first reset signal lines in the (2k-1)-th columns and multiple second-first reset signal lines in the (2k)-th columns of the K columns;
   a first parasitic capacitance between a respective first-first pad and a respective first-first reset signal line in the (2k-1)-th columns of the K columns is different from a second parasitic capacitance between a respective second-first pad and a respective second-first reset signal line in the (2k)-th columns of the K columns.

2. The array substrate of claim 1, wherein orthographic projections of the respective first-first pad and the respective first-first reset signal line in the (2k-)-th columns of the K columns overlap with each other in a first overlapping region having a first area; orthographic projections of the respective second-first pad and the respective second-first reset signal line in the (2k)-th columns of the K columns overlap with each other in a second overlapping region having a second area; and the first area and the second area are different from each other.

3. The array substrate of claim 2, wherein a first portion of the respective first-first pad in the first overlapping region has a first width along a first direction;
   a second portion of the respective second-first pad in the second overlapping region has a second width along the first direction; and
   the first width is greater than the second width.

4. The array substrate of claim 3, wherein along the virtual line, the respective first-first reset signal line has a third width, and the respective second-first reset signal line has a fourth width;
   the third width is substantially the same as the fourth width; and
   the first width is greater than the third width and greater than the fourth width.

5. The array substrate of claim 1, wherein a ratio of a total number of the multiple first-first reset signal lines to a total number of the plurality of first-first pads is the same as a ratio of a total number of the multiple second-first reset signal lines to a total number of the plurality of second-first pads.

6. The array substrate of claim 1, further comprising a plurality of gate lines;
   wherein the respective first pad crosses over a respective gate line of the plurality of gate lines.

7. The array substrate of claim 6, further comprising a plurality of reset control signal lines and a plurality of light emitting control signal lines;
   wherein an orthographic projection of respective first pad on a base substrate at least partially overlaps with an orthographic projection of a respective reset control signal line of the plurality of reset control signal lines on the base substrate; or
   the orthographic projection of the first pad on the base substrate at least partially overlaps with an orthographic projection of a respective light emitting control signal line of the plurality of light emitting control signal lines on the base substrate.

8. The array substrate of claim 1, further comprising a plurality of voltage supply lines;
   wherein a respective pixel driving circuit comprises:
   a second pad;
   a node connecting line; and
   a storage capacitor comprising a first capacitor electrode;
   wherein the second pad is connected to a respective voltage supply line of the plurality of voltage supply lines;
   the node connecting line connects the first capacitor electrode to a first electrode of a third transistor in the respective pixel driving circuit; and
   an orthographic projection of the second pad on a base substrate covers at least 50% of an orthographic projection of the node connecting line on the base substrate.

9. The array substrate of claim 8, wherein the orthographic projection of the second pad on the base substrate at least partially overlaps with an orthographic projection of an active layer of the third transistor on the base substrate.

10. The array substrate of claim 8, further comprising a plurality of gate lines;
    wherein a respective gate line of the plurality of gate lines comprises a main portion extending along an extension direction of the respective gate line, and a gate protrusion protruding away from the main portion; and
    the orthographic projection of the second pad on the base substrate covers at least 50% of an orthographic projection of the gate protrusion on the base substrate.

11. The array substrate of claim 8, further comprising a plurality of data lines;
    wherein the second pad comprises a fourth pad part, a fifth pad part, and a sixth pad part, the fifth pad part connecting the fourth pad part to the sixth pad part; and
    the fifth pad part crosses over a respective data line of the plurality of data lines in an adjacent pixel driving circuit, the adjacent pixel driving circuit and the respective pixel driving circuit being in a same row along a first direction.

12. The array substrate of claim 11, wherein an orthographic projection of the fourth pad part on the base substrate at least partially overlaps with the orthographic projection of the node connecting line in the respective pixel driving circuit on the base substrate; and an orthographic projection of the sixth pad part on the base substrate at least partially overlaps with an orthographic projection of a respective adjacent voltage supply line of the plurality of voltage supply lines in the adjacent pixel driving circuit on the base substrate.

13. The array substrate of claim 1, further comprising an anode connecting pad and an anode;

wherein the respective first pad is connected to a first relay electrode through a ninth via extending through a first planarization layer, and is connected to a second relay electrode through a tenth via extending through the first planarization layer;

the first relay electrode is connected to the second electrode of the fifth transistor through an eleventh via extending through at least an inter-layer dielectric layer;

the second relay electrode is connected to the second electrode of the sixth transistor through a twelfth via extending through at least the inter-layer dielectric layer;

the anode connecting pad is connected to the respective first pad through a thirteenth via extending through a second planarization layer; and the anode is connected to the anode connecting pad through a fourteenth via extending through a third planarization layer.

14. The array substrate of claim 1, further comprising a plurality of second reset signal lines in a layer different from the multiple first-first reset signal lines and the multiple second-first reset signal lines;

the plurality of second reset signal lines extend along a first direction;

the multiple first-first reset signal lines and the multiple second-first reset signal lines extend along a second direction;

a respective second reset signal line is configured to provide an initialization signal to a first electrode of a sixth transistor in a respective pixel driving circuit;

a respective first-first reset signal line is configured to provide an initialization signal to a first electrode of a first transistor in a first-first respective pixel driving circuit in the (2k-1)-th columns; and a respective second-first reset signal line is configured to provide an initialization signal to a first electrode of a first transistor in a second-first respective pixel driving circuit in the (2k)-th columns.

15. The array substrate of claim 1, wherein pixel driving circuits in the (2k-1)-th columns of the K columns are pixel driving circuits for driving light emission of subpixels of a first color and subpixels of a second color;

pixel driving circuits in the (2k)-th columns of the K columns are pixel driving circuits for driving light emission of subpixels of a third color; and the first color, the second color, and the third color are different from each other.

16. The array substrate of claim 1, comprising a display area, an additional display area, and a peripheral area;

wherein the additional display area extends away from the display area into a side region of the peripheral area;

the array substrate comprises a plurality of light emitting elements and a plurality of pixel driving circuits;

the plurality of pixel driving circuits are in the display area;

multiple light emitting elements of the plurality of light emitting elements are present in the additional display area; and transistors and capacitors of the plurality of pixel driving circuits are absent in the additional display area.

17. The array substrate of claim 16, wherein light emitting layers corresponding to a number of pixel driving circuits along a border between the display area and the additional display area are in the additional display area;

the array substrate further comprises a plurality of anode connecting pads connecting the pixel driving circuits along the border between the display area and the additional display area and the light emitting layers in the additional display area; and a respective anode connecting pad of the plurality of anode connecting pads electrically connects the second electrode of the sixth transistor to an anode of a respective light emitting element in the additional display area.

18. The array substrate of claim 17, wherein, in the additional display area, an orthographic projection of the plurality of anode connecting pads on a base substrate partially overlaps with an orthographic projection of a respective first subpixel on the base substrate, resulting in a first overlapping area;

an orthographic projection of the plurality of anode connecting pads on the base substrate partially overlaps with an orthographic projection of a respective second subpixel on the base substrate, resulting in a second overlapping area;

an orthographic projection of the plurality of anode connecting pads on the base substrate partially overlaps with an orthographic projection of a respective third subpixel on the base substrate, resulting in a third overlapping area;

the first overlapping area is greater than the second overlapping area;

the third overlapping area is greater than the second overlapping area; and the respective first subpixel, the respective second subpixel, and the respective third subpixel are subpixels of different colors.

19. A display apparatus, comprising the array substrate of claim 1, and an integrated circuit connected to the array substrate.

* * * * *